(12) United States Patent
Yamashita et al.

(10) Patent No.: US 11,127,770 B2
(45) Date of Patent: *Sep. 21, 2021

(54) IMAGING APPARATUS WITH PHASE CONTRAST DETECTION TYPE OF FOCAL POINT DETECTION

(71) Applicant: CANON KABUSHIKI KAISHA, Tokyo (JP)

(72) Inventors: Yuichiro Yamashita, Miyagi (JP); Masahiro Kobayashi, Tokyo (JP); Itsutaku Sano, Tokyo (JP); Takeshi Kojima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 302 days.

This patent is subject to a terminal disclaimer.

(21) Appl. No.: 15/984,866

(22) Filed: May 21, 2018

(65) Prior Publication Data

US 2018/0269241 A1 Sep. 20, 2018

Related U.S. Application Data

(63) Continuation of application No. 14/956,241, filed on Dec. 1, 2015, now Pat. No. 10,002,894, which is a (Continued)

(30) Foreign Application Priority Data

Feb. 17, 2012 (JP) .................................. 2012-033367

(51) Int. Cl.
*H01L 27/146* (2006.01)
*H04N 5/3745* (2011.01)
(Continued)

(52) U.S. Cl.
CPC .. *H01L 27/14609* (2013.01); *H01L 27/14605* (2013.01); *H01L 27/14623* (2013.01);
(Continued)

(58) Field of Classification Search
CPC ......... H01L 27/14605; H01L 27/14609; H01L 27/14623; H01L 27/14627;
(Continued)

(56) References Cited

U.S. PATENT DOCUMENTS 6,750,437 B2 * 6/2004 Yamashita ......... H04N 5/23212
250/208.1

FOREIGN PATENT DOCUMENTS

JP 2002101341 A 4/2002
JP 2007324985 A 12/2007
(Continued)

*Primary Examiner* — Que Tan Le
(74) *Attorney, Agent, or Firm* — Canon U.S.A., Inc. IP Division

(57) ABSTRACT

An imaging apparatus includes a plurality of pixels, a signal holding unit, first and second control electrodes. Each of the plurality of pixels includes a photoelectric conversion unit, and an amplification element to amplify signals based on signal charges generated by the photoelectric conversion unit, in which the plurality of pixels output signals for performing a phase contrast detection type of focal point detection. The signal holding unit is in an electrical pathway between an output node of the photoelectric conversion unit and an input node of the amplification element, in which signals for performing the phase contrast detection type of focal point detection are held. The first control electrode is configured to transfer a signal of the photoelectric conversion unit to the signal holding unit. The second control electrode is configured to transfer a signal for performing the phase difference detection type of focal point detection.

17 Claims, 43 Drawing Sheets

Related U.S. Application Data continuation of application No. 13/764,657, filed on Feb. 11, 2013, now Pat. No. 9,224,771.

(51) Int. Cl.
    *H04N 5/369*     (2011.01)
    *H04N 5/361*     (2011.01)

(52) U.S. Cl.
    CPC ....... *H01L 27/14643* (2013.01); *H04N 5/361* (2013.01); *H04N 5/36961* (2018.08); *H04N 5/37452* (2013.01); *H04N 5/37457* (2013.01); *H01L 27/14627* (2013.01)

(58) Field of Classification Search
    CPC ............ H01L 27/14643; H04N 5/3696; H04N 5/37452; H04N 5/37457; H04N 5/36961
    USPC .......................................... 250/208.1, 214 R
    See application file for complete search history.

(56) References Cited

FOREIGN PATENT DOCUMENTS

| | | | |
|---|---|---|---|
| JP | 2008072470 | A | 3/2008 |
| JP | 2009272538 | A | 11/2009 |
| JP | 2010093644 | A | 4/2010 |

\* cited by examiner

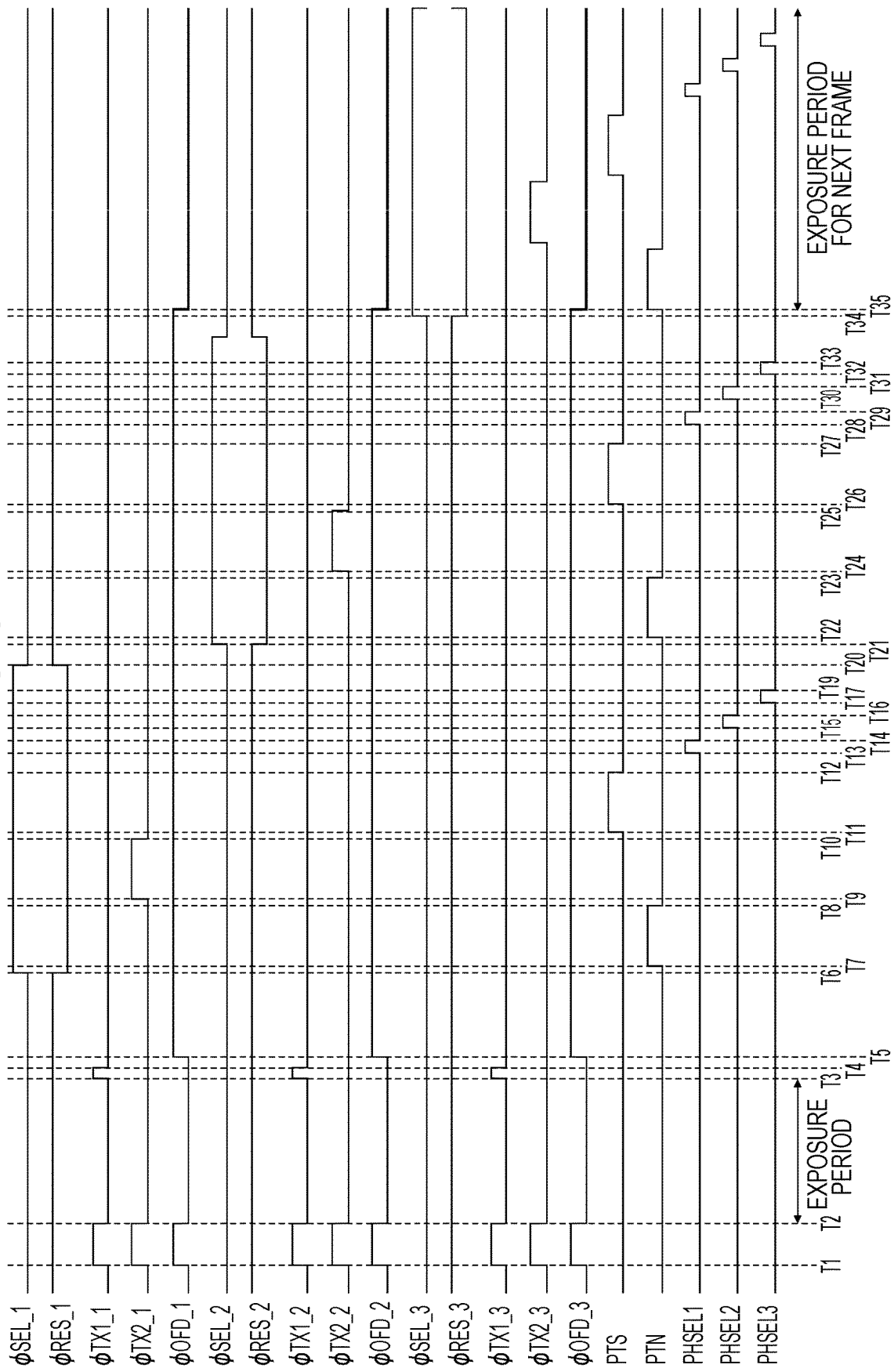

FIG. 9

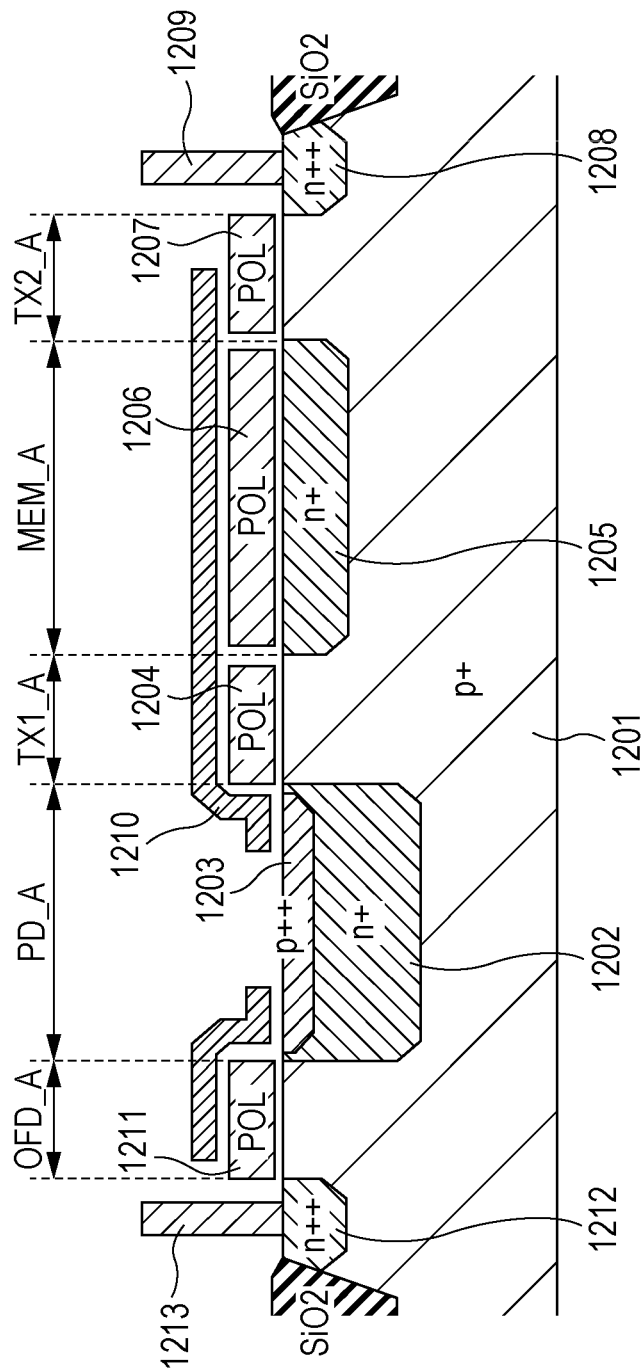
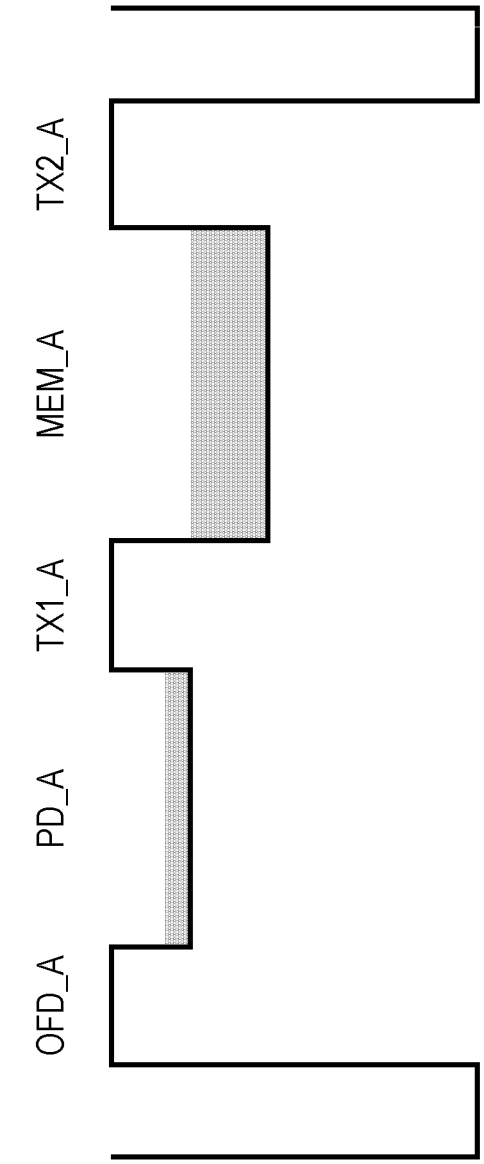
FIG. 12A
FIG. 12B

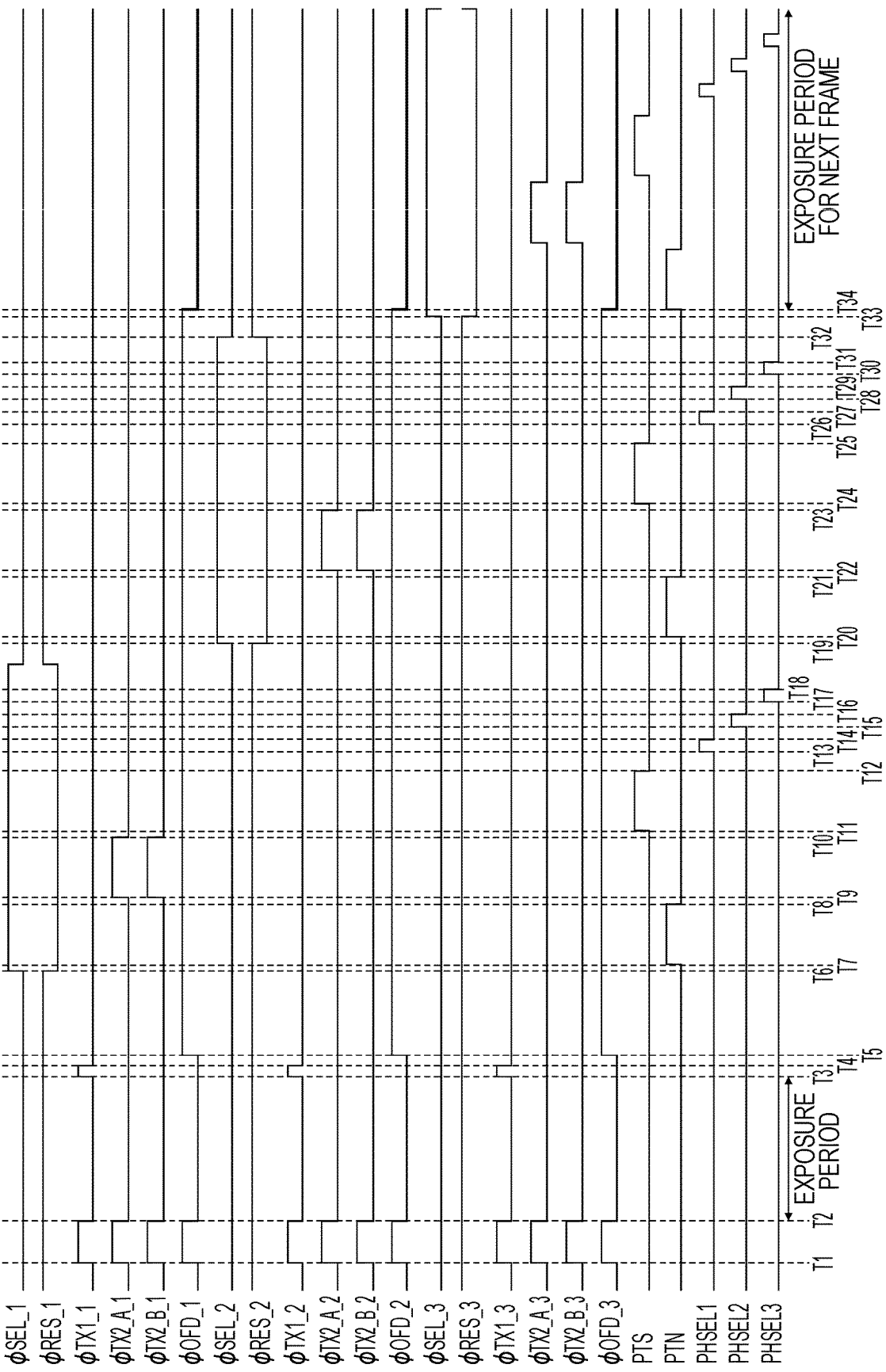

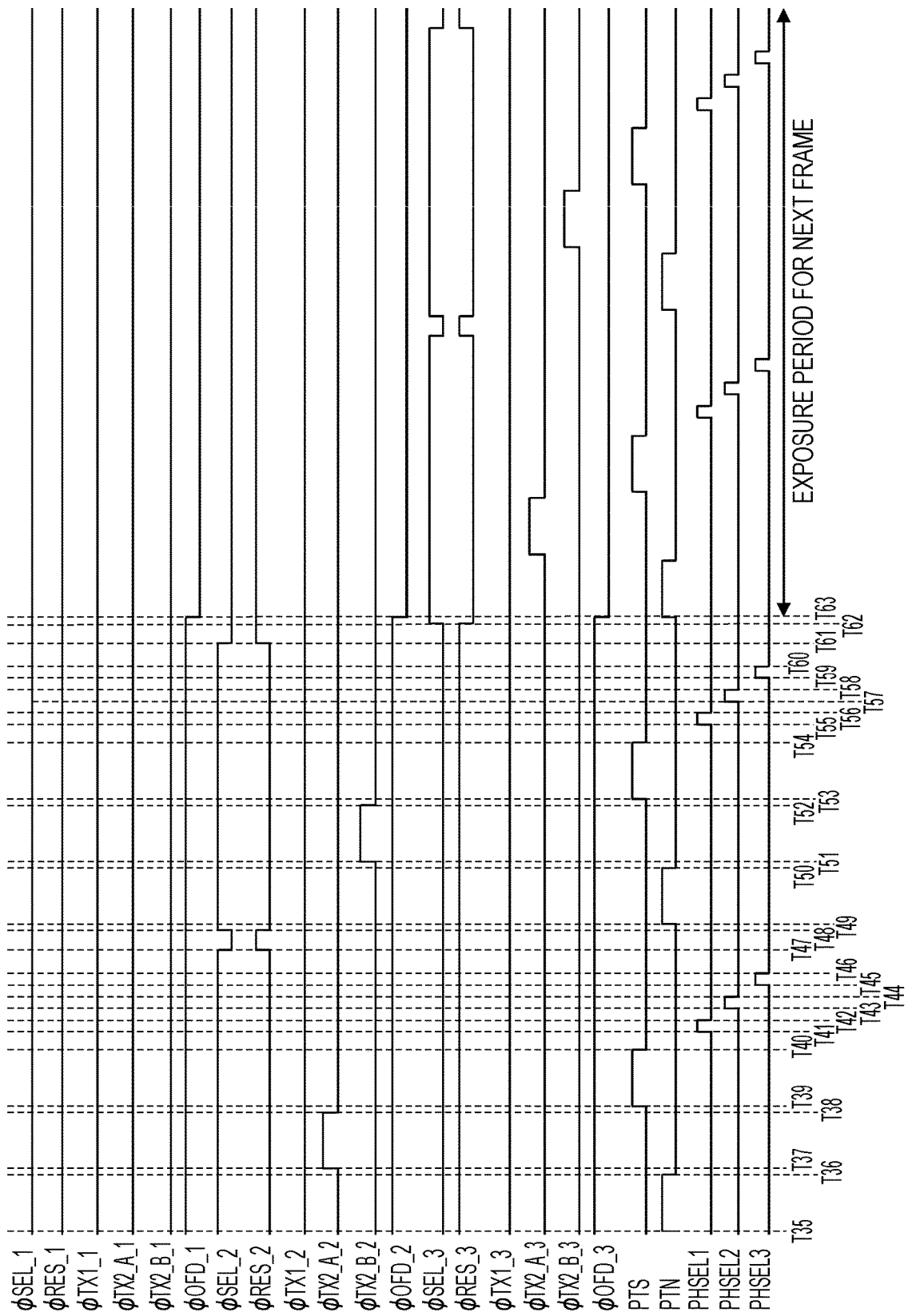

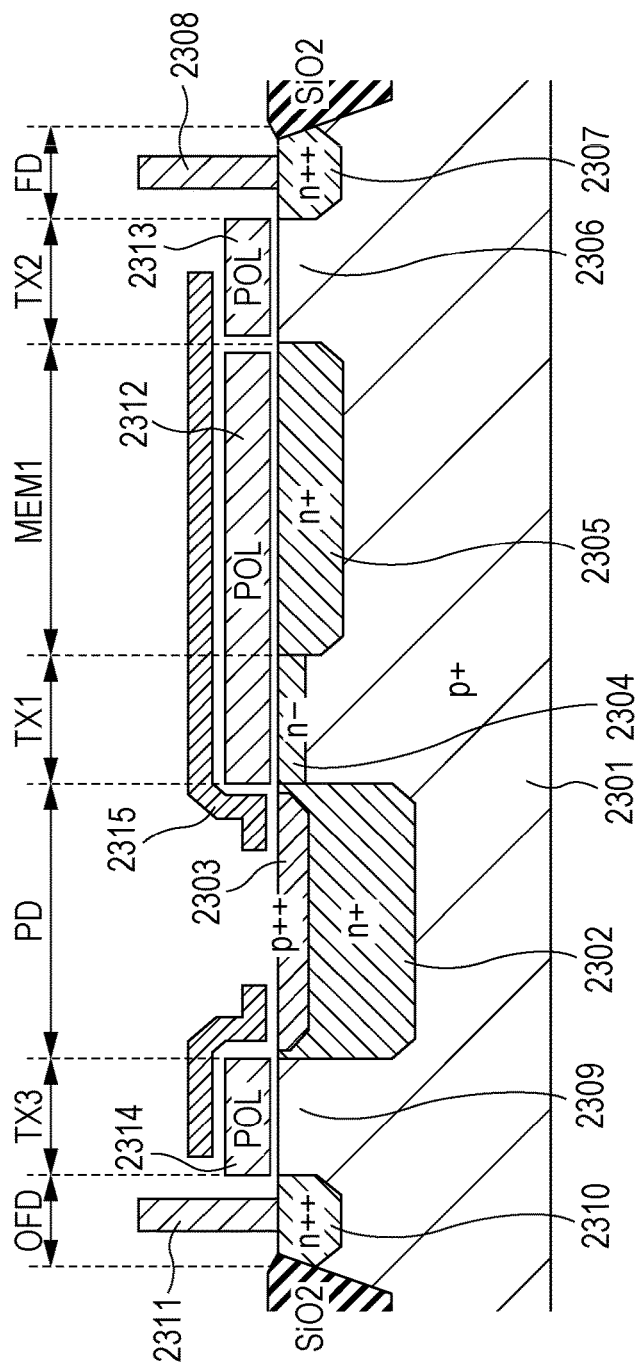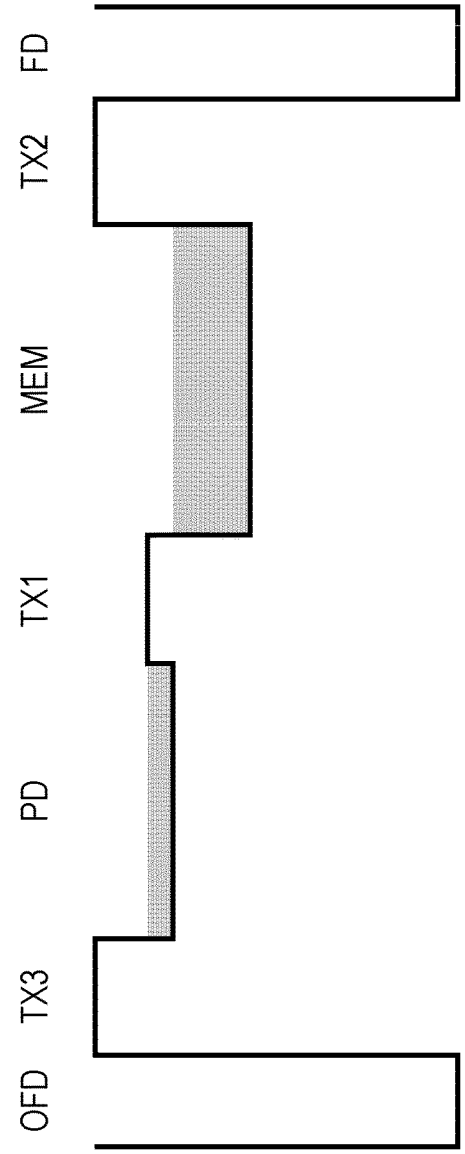
FIG. 23A
FIG. 23B

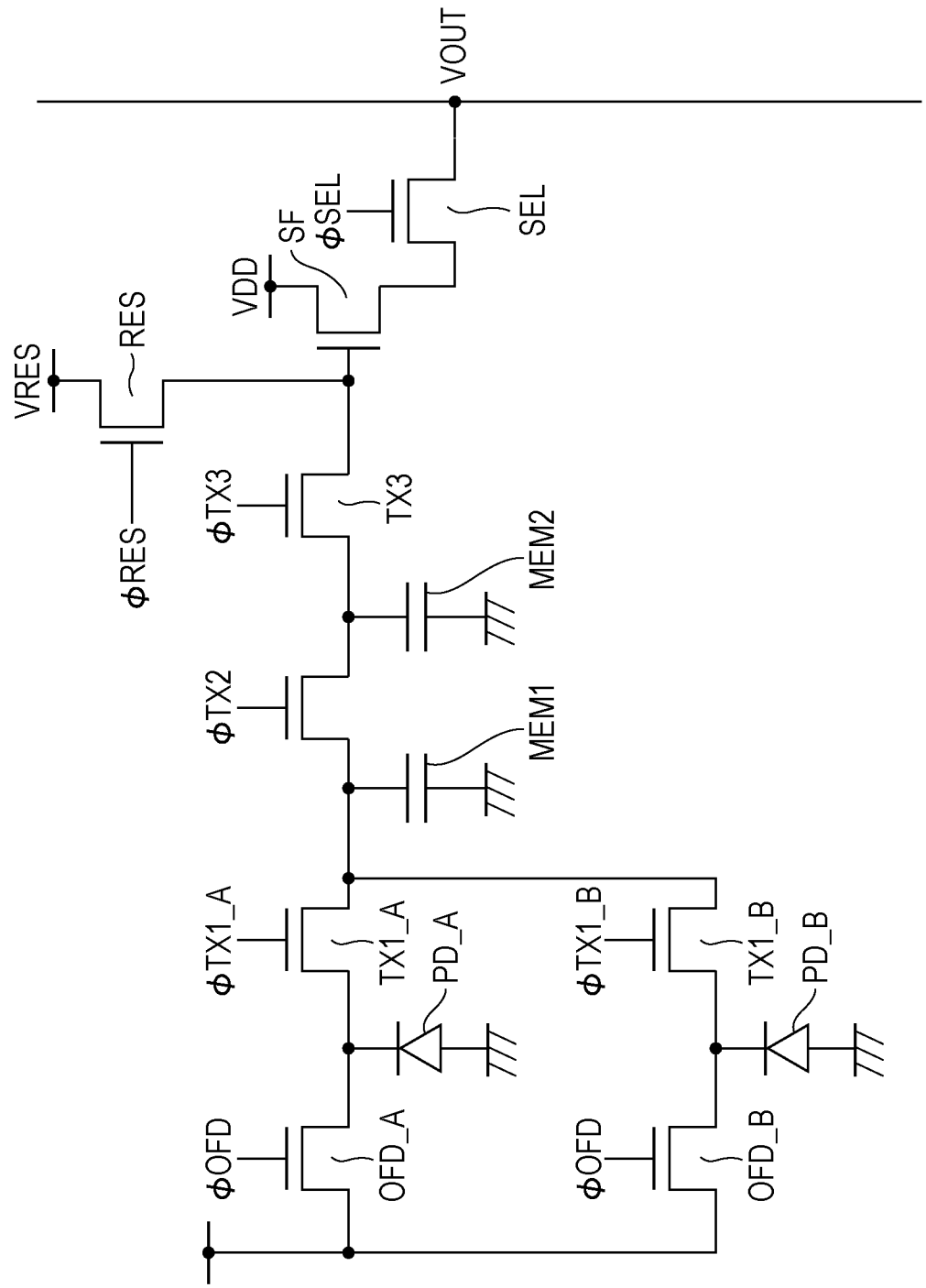

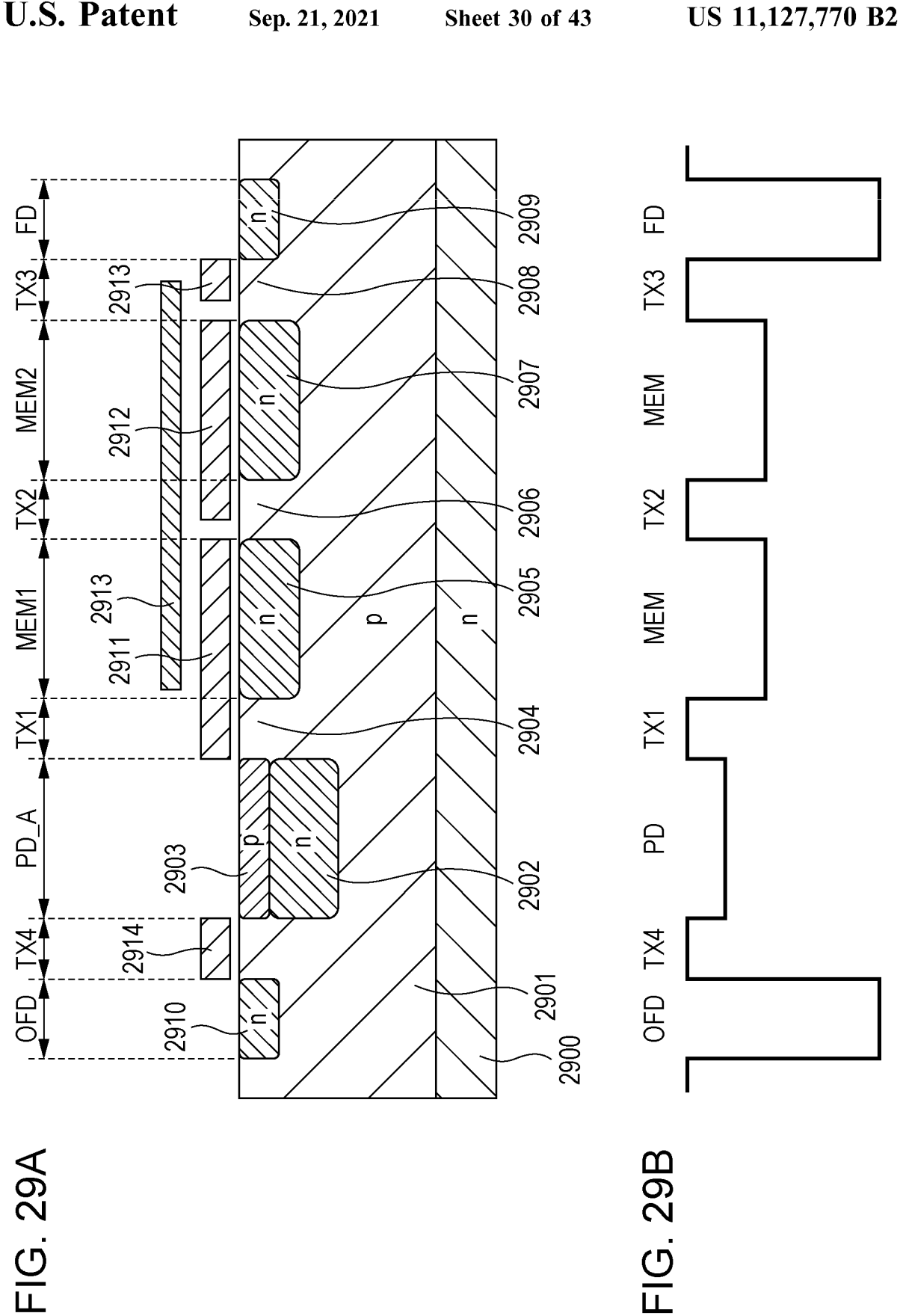

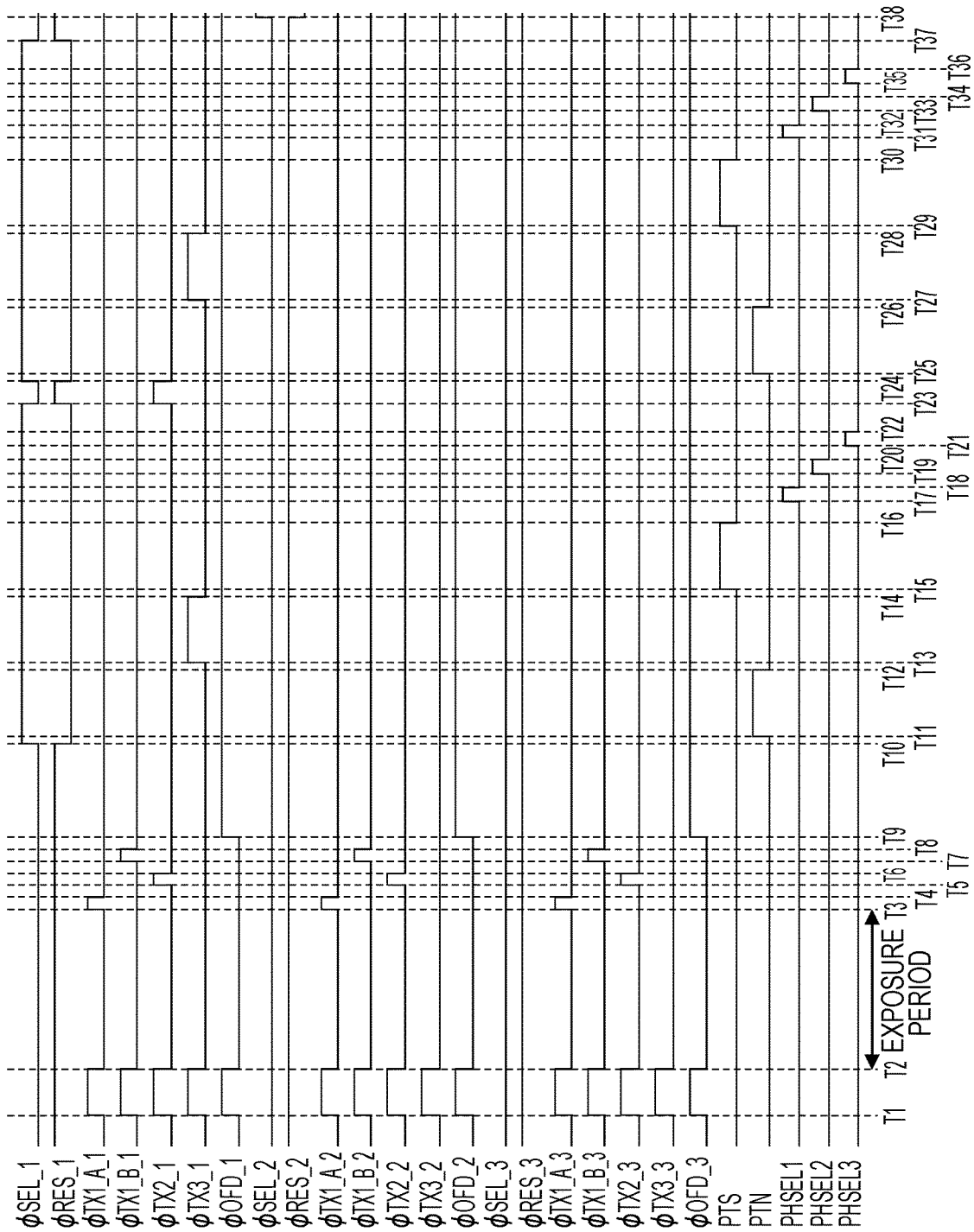

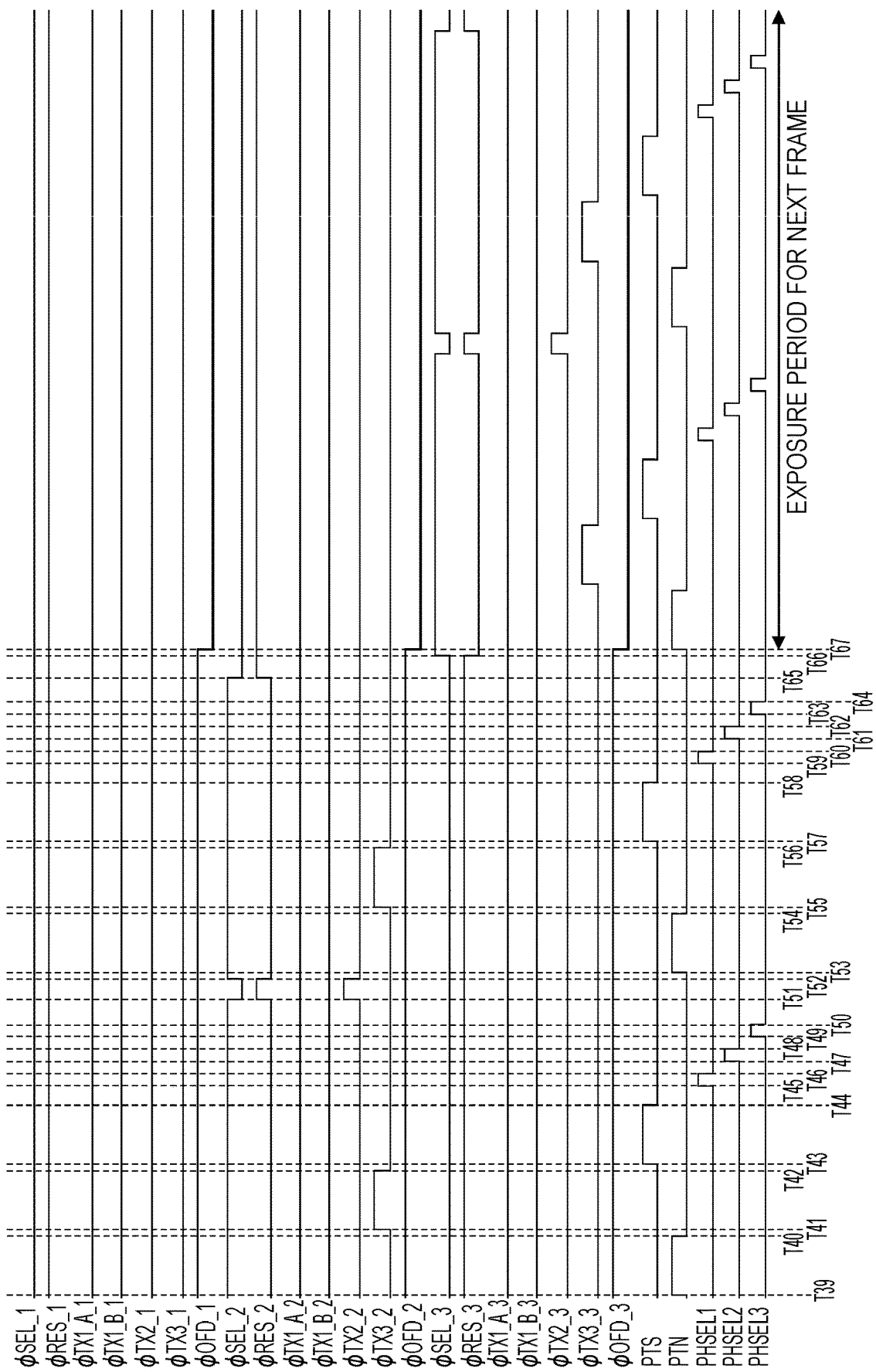

1001

IMAGING APPARATUS WITH PHASE CONTRAST DETECTION TYPE OF FOCAL POINT DETECTION

CROSS-REFERENCE TO RELATED APPLICATION

This application is a Continuation of U.S. application Ser. No. 14/956,241, filed Dec. 1, 2015 which is a Continuation of U.S. application Ser. No. 13/764,657, filed Feb. 11, 2013, which now becomes U.S. Pat. No. 9,224,771, issued on Dec. 29, 2015 which claims the benefit of Japanese Patent Application No. 2012-033367 filed Feb. 17, 2012, which are hereby incorporated by reference herein in their entireties.

BACKGROUND OF THE INVENTION

Field of the Invention

The present invention relates to an imaging apparatus, and particularly relates to an imaging apparatus that performs a phase contrast detection type of focal point detection at the imaging face.

Description of the Related Art

With the related art, configurations performing a phase contrast detection type of focal point detection at an imaging face of an imaging apparatus are known. Japanese Patent Laid-Open No. 2010-288083, for example, discloses a CMOS imaging device that includes imaging pixels to generate image generation signals, and focal point detection pixels to generate phase contrast detection signals. Also, for frames in which focal point detection is performed, all imaging pixels of the imaging devices are exposed simultaneously, and the imaging signal generated as a result of this exposure is read out. For frames in which focal point detection is not performed, the imaging signals from the imaging devices are read out by a slit rolling read out. Further, FIG. 4 and paragraph 0018 of Japanese Patent Laid-Open No. 2010-288083 describe a collective electron shutter being performed to align accumulated point-in-time of all pixels.

However, despite that the configuration in Japanese Patent Laid-Open No. 2010-288083 does not perform the phase contrast detection type of focal point detection at the imaging face, but does perform the collective electronic shutter, enough consideration has not been given to the configuration of pixels to actually achieve these results. Referencing FIGS. 2 and 4 of Japanese Patent Laid-Open No. 2010-288083 illustrates that a charge generated at a photoelectric conversion unit is transferred together for all pixels to a floating diffusion (hereafter, FD). Also, this charge is accumulated in the FD until a timing for the read out of each row of pixels. The configuration of the FD is basically not suitable for long-term holding of charges. Specifically, it is difficult to create a configuration in which little dark current is generated during the signal holding period. Further, it is also difficult to remove noise signals related to the pixel signals. It is theoretically possible to remove noise by including several rows worth of circuits to hold noise signals in a column circuit, but the space taken by the column circuits may become large. Further, the length of the holding period for the noise signal column circuit differs for each row, which may decrease the precision of noise removal.

SUMMARY OF THE INVENTION

It has been found desirable to provide an imaging apparatus that is capable of a phase contrast detection type of focal point detection at the imaging face, with a configuration that is capable of performing a global electronic shutter with low noise.

According to one aspect, an imaging apparatus includes: a plurality of pixels each including a photoelectric conversion unit, and an amplification element to amplify signals based on signal charges generated by the photoelectric conversion unit, in which the plurality of pixels output signals for performing a phase contrast detection type of focal point detection; and a signal holding unit in an electrical pathway between an output node of the photoelectric conversion unit and an input node of the amplification element, in which signals for performing the phase contrast detection type of focal point detection are held.

Further features of the present invention will become apparent from the following description of exemplary embodiments with reference to the attached drawings.

BRIEF DESCRIPTION OF THE DRAWINGS

FIG. 6 is a diagram illustrating control pulses corresponding to the imaging region of the imaging apparatus in the first Example of the first Embodiment.

FIG. 9 is a top view of the imaging region of the imaging apparatus in a first Example of a second Embodiment.

FIG. 12A is a cross-sectional diagram illustrating the first pixel of the imaging apparatus in the first Example of the second Embodiment, and FIG. 12B is a diagram illustrating the potential of the parts illustrated in FIG. 12A.

FIG. 20 is a diagram illustrating control pulses corresponding to the imaging region of the imaging apparatus in the second Example of the second Embodiment.

FIG. 21B is a diagram illustrating control pulses corresponding to the imaging region of the imaging apparatus in the second Example of the second Embodiment.

FIG. 23A is a cross-sectional diagram illustrating the first pixel in the imaging region of the imaging apparatus in a fourth Example of the second Embodiment, and FIG. 23B is a diagram illustrating the potential of the parts illustrated in FIG. 23A.

FIG. 28 is an equivalent circuit diagram illustrating the imaging region of the imaging apparatus in the sixth Example of the second Embodiment.

FIG. 29A is a cross-sectional diagram illustrating the first pixel of the imaging apparatus in the sixth Example of the second Embodiment. FIG. 29B is a diagram illustrating the potential of the parts illustrated in FIG. 29A.

FIG. 30A is a diagram illustrating control pulses corresponding to the imaging region of the imaging apparatus in the sixth Example of the second Embodiment.

FIG. 30B is a diagram illustrating control pulses corresponding to the imaging region of the imaging apparatus in the sixth Example of the second Embodiment.

DESCRIPTION OF THE EMBODIMENTS

The present technology is divided into two embodiments. Each embodiment includes multiple examples. The first Embodiment is a configuration with distinctly different pixels for focal point detection and pixels for imaging, in which to perform a phase contrast detection type of focal point detection on an imaging face. For example, the aperture of the focal point detection pixels is narrower than the aperture of the imaging pixels. The focal point detection pixels include a light-shielding member, and are configured such that an orthogonally projected image of the light-shielding member as to a photoelectric conversion unit partially overlaps the photoelectric conversion unit.

The second Embodiment is a configuration for performing the phase contrast detection type of focal point detection on the imaging face, in which the configuration includes multiple photoelectric conversion units that correspond to one microlens in one pixel, and so focal point detection is performed by using each of the signals from multiple photoelectric conversion units.

While the present technology will be described here by way of the first Embodiment and the second Embodiment, the present technology may be applicable to portions of other embodiments without departing from the scope of the present technology. For example, the first Embodiment has different pixel configurations for imaging pixels and for focal point detection pixels. The configuration of pixels in the second Embodiment may be used in an imaging apparatus that includes the focal point detection mechanism of the first Embodiment, and so details for these kinds of configurations will be described for each embodiment.

First Embodiment

First Example

Figure 1:
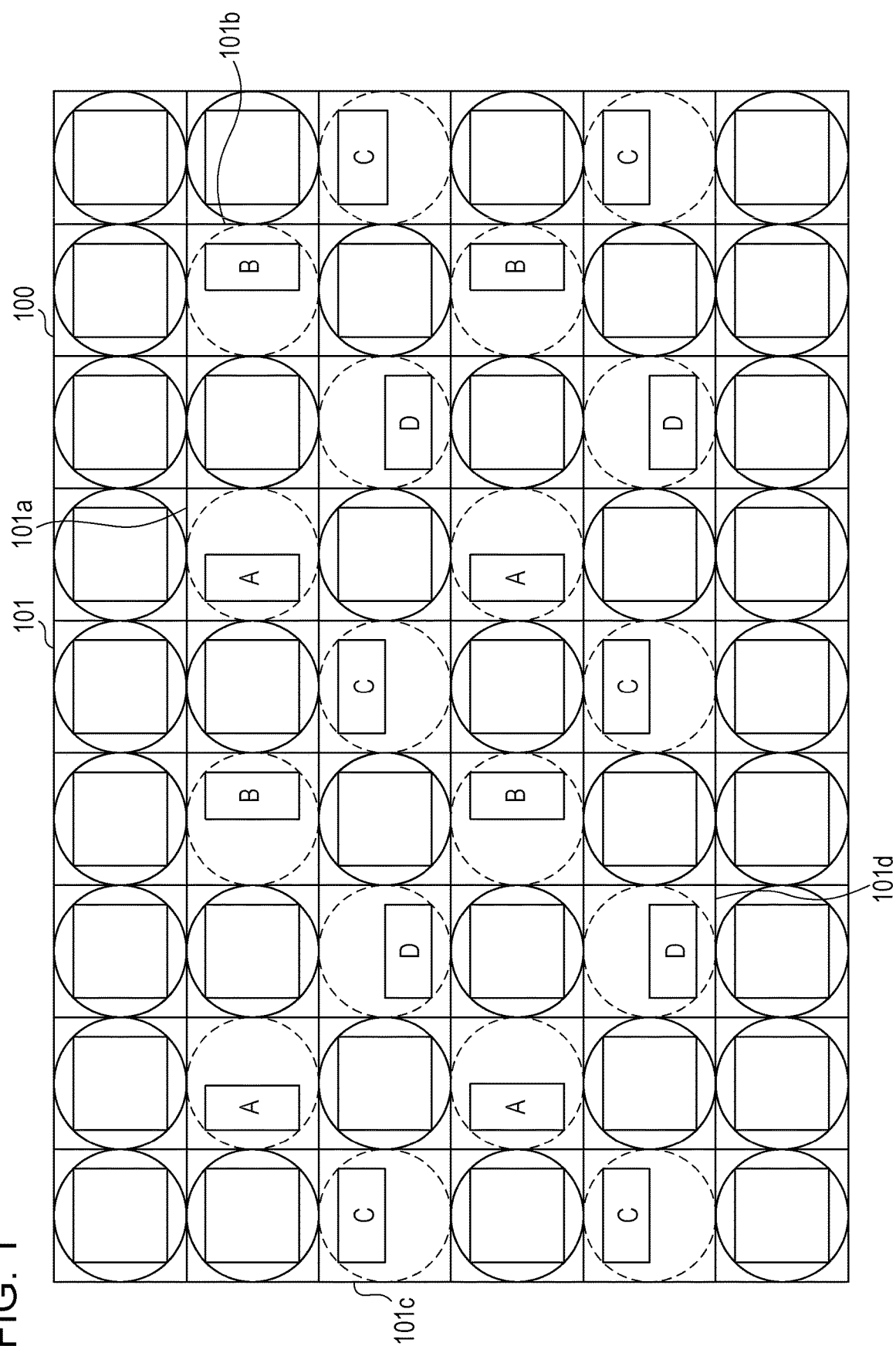
FIG. 1 is a top view of an imaging region of an imaging apparatus in a first Example of a first Embodiment.

FIG. 1 is a top view of a portion of an imaging region of an imaging apparatus in the first Example of the first Embodiment. The imaging region of the imaging apparatus in the present embodiment has both imaging pixels and focal point detection pixels, which output signals for performing focal point detection, and these pixels are disposed in an array.

Multiples pixels 101, 101a, 101b, 101c, and 101d are disposed in an array on an imaging region 100. Circles in FIG. 1 represent microlenses. Squares within the circles represent the aperture of each pixel.

The first pixel 101 is an imaging pixel. Its aperture is wider as compared to other pixels. The aperture of a second pixel 101a is narrower than that of the first pixel 101, and the region of the aperture of the first pixel 101 on the right side of FIG. 1 is shielded from light. The aperture of a third pixel 101b is narrower than that of the first pixel 101, and the region of the aperture of the first pixel 101 on the left side of FIG. 1 is shielded from light. The second pixel 101a and the third pixel 101b enable the phase contrast detection type of focal point detection to be performed by pupil slicing.

The aperture of a fourth pixel 101c is narrower than that of the first pixel 101, and the region of the aperture of the first pixel 101 on the bottom side of FIG. 1 is shielded from light. The aperture of a fifth pixel 101d is narrower than that of the first pixel 101, and the region of the aperture of the first pixel 101 on the top side of FIG. 1 is shielded from light. The fourth pixel 101c and the fifth pixel 101d enable the phase contrast detection type of focal point detection to be performed by pupil slicing.

Figure 2:
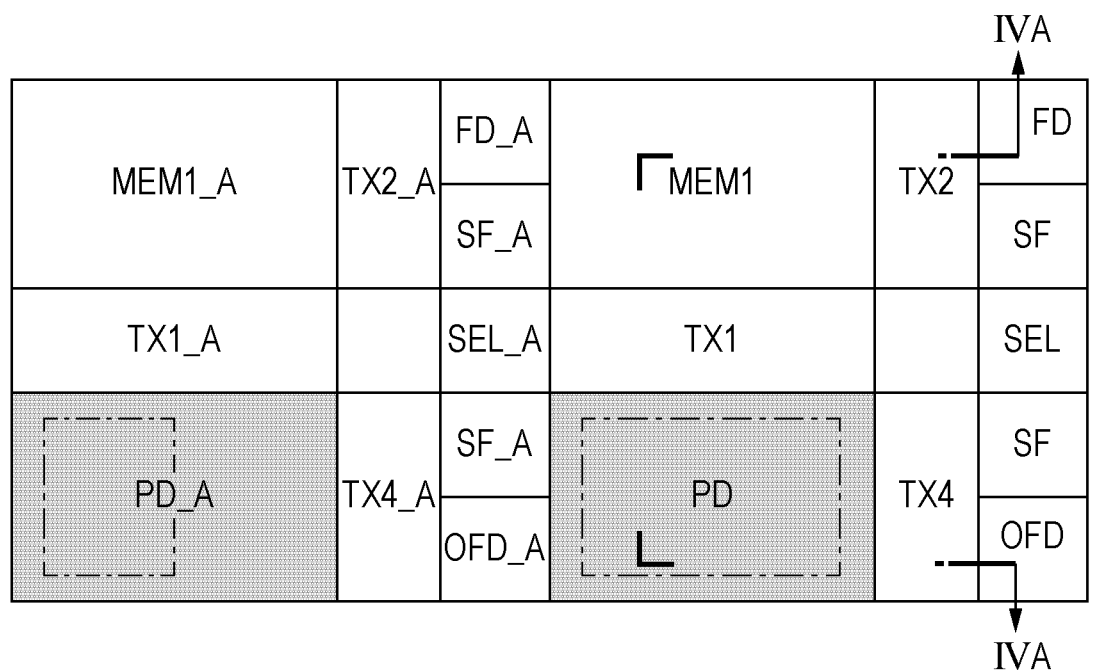
FIG. 2 is an enlarged top view of the imaging region of the imaging apparatus in the first Example of the first Embodiment.
Figure 3:
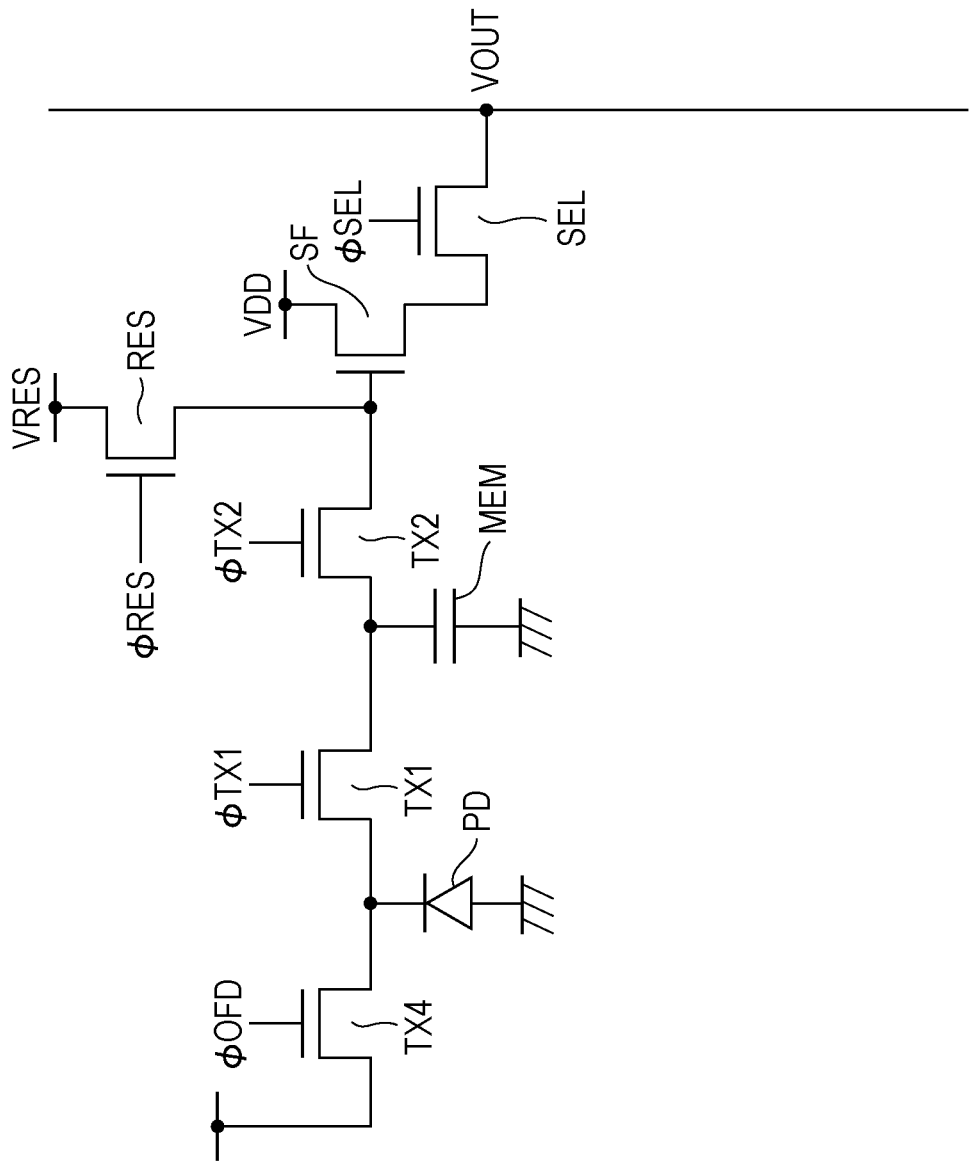
FIG. 3 is an equivalent circuit diagram illustrating a first pixel of the imaging apparatus in the first Example of the first Embodiment.

FIG. 2 illustrates an expanded top view of the imaging region of the imaging apparatus in the present embodiment. The first pixel 101 and the second pixel 101a are adjacent with each other in the region illustrated here. FIG. 3 illustrates an example equivalent circuit diagram of pixels in the present embodiment. The members denoted with the same reference numerals in FIGS. 2 and 3 have the same functions. Members denoted with the same numerals in FIG. 2 have the same functions in both the first pixel and the second pixel. Configuration elements of the second pixel are denoted with a reference code A to distinguish between the first pixel and the second pixel. Only those portions of the second pixel that differ from the first pixel will be described.

An electron hole is generated when light illuminates on the photoelectric conversion unit PD. A first signal holding unit MEM1 is configured to hold a charge to be used as a signal charge from the electron hole. The following describes cases where electrons are used as the signal charge. A first charge transfer unit TX1 is disposed in the electrical pathway between the photoelectric conversion unit PD and the first signal holding unit MEM1.

The electrons held at the first signal holding unit MEM1 are transferred to a floating diffusion FD via a second charge transfer unit TX2. FD is electrically connected to an input node of an amplification transistor SF in the pixel. The floating diffusion FD may also be configured with the input node of the amplification transistor SF. A selection transistor SEL is disposed in the electrical pathway between the amplification transistor SF and a vertical signal line VOUT. Pixels read out from each vertical signal line VOUT are selected by the selection transistor SEL. A reset transistor RES performs resets by supplying a reference voltage to a gate of the amplification transistor SF. An overflow drain control unit (hereafter OFD control unit) TX4 drains electrons generated at the photoelectric conversion unit PD to an OFD region 210.

A control pulse φTX1 is supplied to the first charge transfer unit TX1. A control pulse φTX2 is supplied to the second charge transfer unit TX2. A control pulse φOFD is supplied to the OFD control unit TX3. A control pulse φSEL is supplied to the gate of the selection transistor SEL. A control pulse φRES is supplied to the gate of the reset transistor RES.

The first pixel through the fifth pixel may have the same equivalent circuit. What is different between the first pixel through the fifth pixel is the shape of the light-shielding member disposed on the photoelectric conversion unit PD. Specifically, the shapes are different as illustrated in FIG. 1.

Figure 4A:
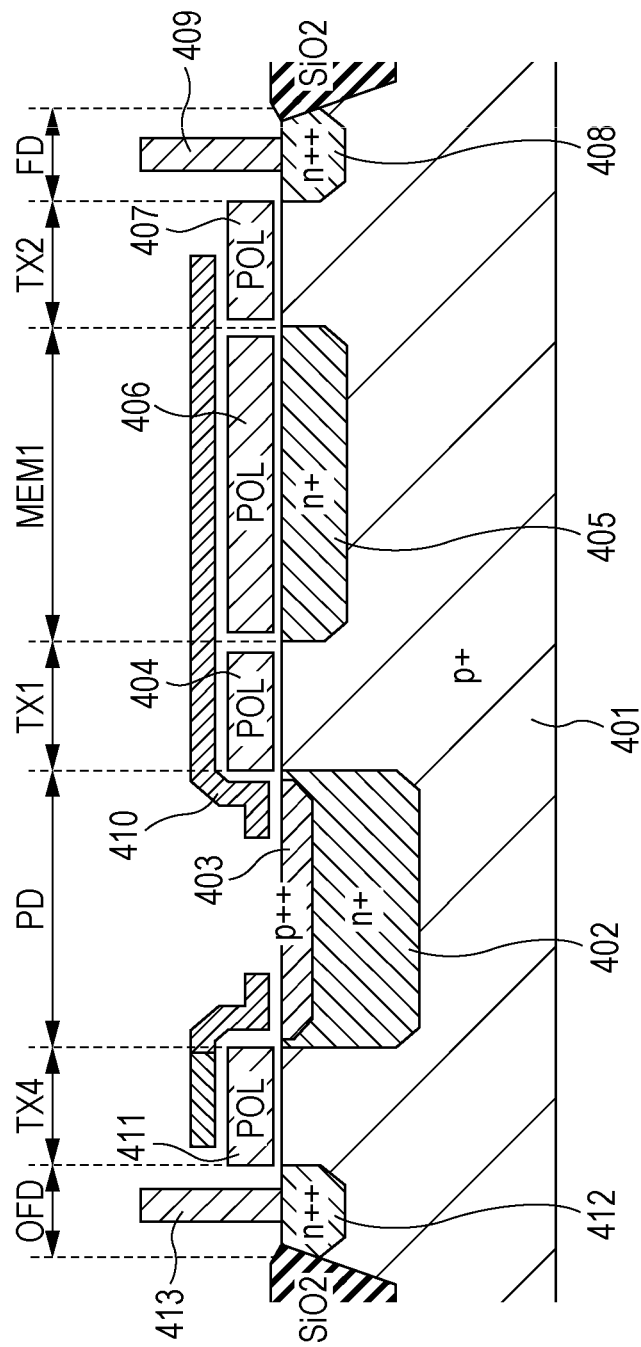
FIG. 4A is a cross-sectional diagram illustrating the first pixel of the imaging apparatus in the first Example of the first Embodiment.
Figure 4B:
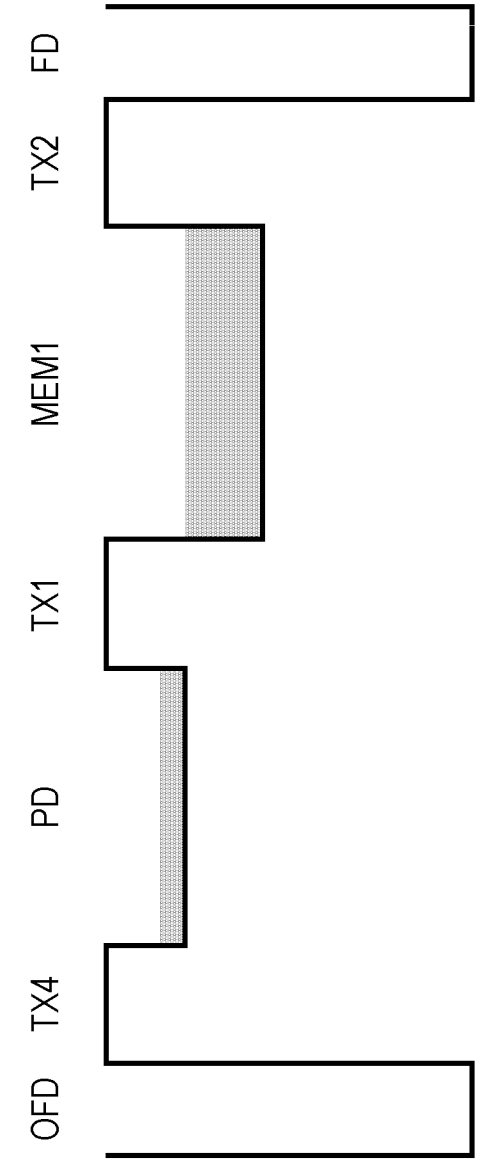
FIG. 4B is a diagram illustrating the potential of the parts illustrated in FIG. 4A.

FIG. 4A is a cross-sectional diagram illustrating the first pixel of the imaging apparatus in the present embodiment. This illustrates the cross-section of IVA-IVA in FIG. 2. FIG. 4B is a diagram illustrating the potential of the parts illustrated in FIG. 4A.

The photoelectric conversion unit PD, the first signal holding unit MEM1, an FD region FD, and others are configured by disposing multiple N-type semiconductor regions in a P-type semiconductor region 401. The P-type semiconductor region 401 may use a P-type semiconductor substrate, or may use a P-type semiconductor region formed by ion implantation in an N-type semiconductor substrate.

The photoelectric conversion unit PD includes a P-type conductor region 401, an N-type semiconductor region 402 disposed to configure a PN junction with the P-type semiconductor region 401, and a P-type semiconductor region 403 disposed on the N-type semiconductor region 402. The photoelectric conversion unit PD is configured as a so-called embedded photodiode.

The first charge transfer unit TX1 includes a first control electrode 404 and a first channel disposed in the lower portion of the first control electrode 404 via an insulating layer. Here, the first channel is configured from a portion of the P-type semiconductor region 401. Further, the height of the potential barrier of the first channel is adjusted by implanting impurity ions in the P-type semiconductor region 401.

The first signal holding unit MEM1 is configured with the inclusion of a second control electrode 406, and an N-type semiconductor region 405 disposed in the lower portion of the second control electrode 406 via an insulating layer. It is preferable if the voltage of the second control electrode 406 is controlled by negative voltage during accumulation in order to stop the generation of dark current on the face of the N-type semiconductor region 405. During transfers from the photoelectric conversion unit to the first signal holding unit MEM1, the application of a positive voltage, when desired and appropriate, may improve transfer properties.

The second charge transfer unit TX2 includes a third control electrode 407 and a second channel disposed in and the lower portion of the third control electrode 407 via an insulating layer. Here, the second channel is configured from a portion of the P-type semiconductor region 401. Further, the height of the potential barrier of the second channel may be adjusted by implanting impurity ions in the P-type semiconductor region 401.

The FD region FD includes an N-type semiconductor region 408. The N-type semiconductor region 408 is electrically connected to the gate of the amplification transistor SF via a plug 409.

The OFD control unit TX4 includes a fourth control electrode 411 and a third channel disposed in the lower portion of the fourth control electrode 411 via an insulating layer. Here, the third channel is configured as a portion of the P-type semiconductor region 401. Further, the height of the potential barrier of the third channel may be adjusted by implanting impurity ions in the P-type semiconductor region 401.

The OFD region OFD includes an N-type semiconductor region 412. The N-type semiconductor region 412 is electrically connected to a power supply line via a plug 413.

A light-shielding member 410 is disposed on the first signal holding unit MEM1. It is more desirable for the second control electrode 406 to be included in the orthogonal projection toward the second control electrode 406 of the light-shielding member 410. Further, it is preferable if the light-shielding member 410 is disposed so that it extends onto the first control electrode 404 until the side wall of the photoelectric conversion unit PD side of the first control electrode 404. Further, a light-shielding member 411 may extend to other members, or may extend onto the second charge transfer unit TX2 and the fourth control electrode 411.

FIG. 4B is a diagram illustrating the potential state when non-electroconducting control pulses are supplied to the first control electrode through the fourth control electrode. That is to say, this is the state when the control pulse with the highest electron potential from among the control pulses supplied to the first control electrode through the fourth control electrode is supplied. Such a potential state is, for example, a period when, after signals from all pixels for the nth frame are transferred to the first signal holding unit MEM1 simultaneously, electrons are accumulated in the photoelectric conversion unit PD and the first signal holding unit MEM1 during a period until the second charge transfer unit TX2 is scanned per row.

Figure 5:
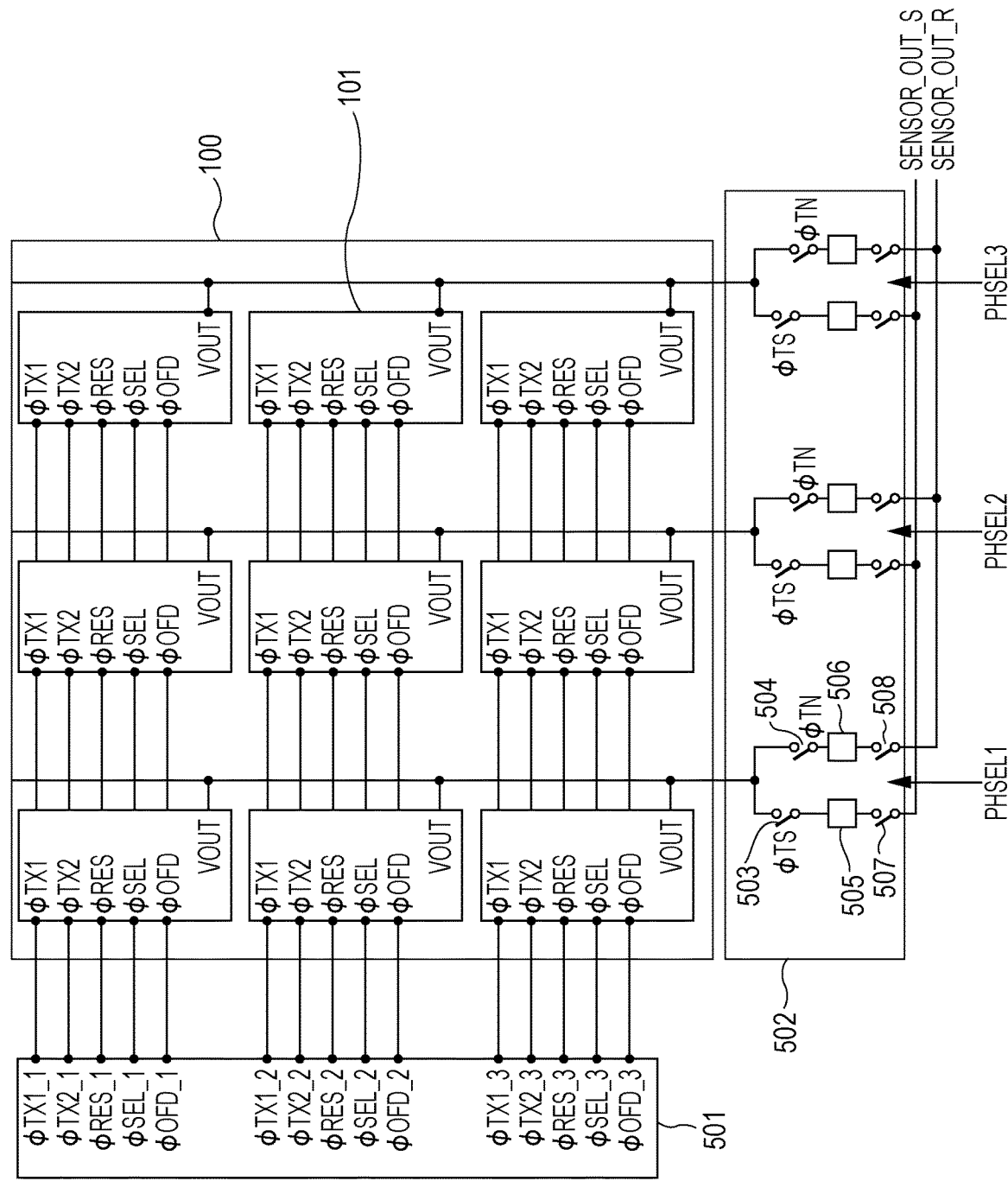
FIG. 5 is a total block diagram illustrating the imaging apparatus in the first Example of the first Embodiment.

FIG. 5 is a total block diagram illustrating the imaging apparatus in the present example. The functions that are the same as those in FIG. 1 through FIG. 4 are denoted with the same reference numerals, and thus their descriptions are omitted here. Three rows by three columns of pixels are illustrated in FIG. 5 for a total of 9 pixels, but many more pixels may be disposed. Also, regarding the arrangement of the first through the fifth pixels, the first pixel 101, the second pixel 101a, and the third pixel 101b are disposed in the first row; and the first pixel 101a, the fourth pixel 101c, and the fifth pixel 101d are disposed in the second row. Further, the first pixel 101, the second pixel 101a, and the third pixel 101b are disposed in the third row.

The control pulses are supplied from a vertical scanning unit 501 per pixel row, or at intervals of multiple pixel rows. The vertical scanning unit 500 may be configured with a shift register and an address decoder.

A column circuit 502 is configured with multiple circuit blocks that correspond to each of the pixel rows. Each circuit block includes a first switch 503 controlled by a control pulse φTS, and a second switch 504 controlled by a control pulse φTN. Further, an optical signal holding unit 505 is disposed downstream of the first switch 503, and a noise signal holding unit 506 is disposed downstream of the second switch 504. Also, the optical signal holding unit 505 is disposed downstream of a third switch 507, and the noise holding unit 506 is disposed downstream of a fourth switch 508. The third switch 507 and the fourth switch 508 are controlled by a PHSEL. A horizontal signal line SENSOR_OUT_S is disposed downstream of the third switch 507, and a horizontal signal line SENSOR_OUT_N is disposed downstream of the fourth switch 508.

The signal transfer scenario for such a total block diagram will be described next. Multiple pixels included in a predetermined pixel row are reset, and during a period where noise signals may be output and multiple pixels in a predetermined pixel row are selectable by the vertical scanning unit 501, noise signals are output to the vertical signal line VOUT. The noise signals are offset noise from the pixel transistors or random noise. They may also be noise signals from the column circuit.

The noise signals transferred on the vertical signal line VOUT are held in the noise holding unit 506 via the second switch 504. Afterwards, the signals based on the charges generated by the photoelectric conversion units in the multiple pixels change to a state where they may be output. Also, during the period where the multiple pixels in the predetermined row are in a selectable state by the vertical scanning unit 501, an optical signal with the noise signals superimposed in the vertical signal line (hereafter, referred to simply as "optical signal") is output.

The noise signals transferred on the vertical signal line VOUT are held in the noise holding unit 505 via the first switch 503. Afterwards, the optical signal and noise signal are output in phase to the horizontal output line SENSOR_OUT_S and SENSOR_OUT_N, by the third switch and the fourth switch being changed to an electroconductive state by the PHSEL per row or for intervals of multiple rows. Noise may be removed when these signals are processed by a signal processing circuit not illustrated.

FIG. 6 illustrates more specific control pulses. All control pulses are at a high level and in an electroconductive state.

Until a timing T1, the φRES of all pixels on the imaging face are at a high level, and the reference voltage has been supplied to the gate of the amplification transistor. Other control pulses illustrated in FIG. 6 are at a low level.

At the timing T1, the φTX1, φTX2, φOFD of all pixels on the imaging face change from a low level to a high level, and at a timing T2, the φTX1, φTX2, φOFD of all pixels on the imaging face change from a high level to a low level. Such an operation enables the electrons in the photoelectric conversion unit PD and the first signal holding unit MEM1 to be drained to the reset transistor RES drain via the OFD region or the FD region. Also at the timing T2, the imaging exposure period of the nth frame begins. As illustrated in FIG. 6, the exposure period is the same for the entire imaging face.

At a timing T3, the φTX1 of all pixels on the imaging face changes from a low level to a high level, and at a timing T4, the φTX1 of all pixels on the imaging face changes from a high level to a low level. Such an operation enables the electrons in the photoelectric conversion unit PD for all pixels on the imaging face to be transferred simultaneously to the first signal holding MEM1.

At a timing T5, the φOFD of all pixels on the imaging face change from a low level to a high level, and electrons generated by the illumination of light on the photoelectric conversion unit PD are drained to the OFD region.

Next, at a timing T6, a φSEL_1 changes from a low level to a high level. At the same time, a φRES_1 changes from a high level to a low level. Such an operation enables pixel noise signals to be output to the vertical signal line VOUT.

At a timing T7, a PTN changes from a low level to a high level, and at a timing T8, the PTN changes from a high level to a low level. Such an operation enables the noise signals for the first row of pixels to be held in the noise signal holding unit 506 in the column circuit.

At a timing T9, a φTX2_1 changes from a low level to a high level. At a timing T10, the φTX2_1 changes from a high level to a low level. Such an operation enables electrons for the multiple pixels in the first row to be transferred from the first signal holding MEM1 to the gate of the amplification transistor SF.

At a timing T11, the PTS changes from a low level to a high level, and at a timing T12, the PTS changes from a high level to a low level. Such an operation enables the optical signal from the pixels in the first row to be held in the optical signal holding unit 505 in the column circuit.

Next, at timings T13 through T19, PHSEL_1 through PHSEL_3 are consecutively changed to an electroconductive state, which enables signals of each pixel row to be consecutively output to the horizontal output line. This period is called the horizontal scanning period (horizontally enabled period). The optical signals and the noise signals are simultaneously output in units of rows.

At a timing T20, a φSEL1 changes from a high level to a low level. The pixels in the first row change from a selectable state to a non-selectable state. In continuance, at timings T21 through T33, the signals from the pixels in the second row are read out in the same way as those in the first row.

Next, at timings from T34, the signals from the pixels in the third row are read out. Regarding the present example, the exposure period of the next frame begins during the read out period of the pixels in the third row. At a timing T35, the φOFD of all pixels on the imaging face change from a high level to a low level. Such an operation enables the electrons generated from light illuminated on the photoelectric conversion unit PD to be accumulated in the photoelectric conversion unit PD.

Such operations enable the implementation of a global electron shutter, and further, noise signals generated from each pixel may be removed via a downstream circuit not illustrated. Also, the focal point detection signals may be output while the next frame is accumulated.

Second Example

Figure 7A:
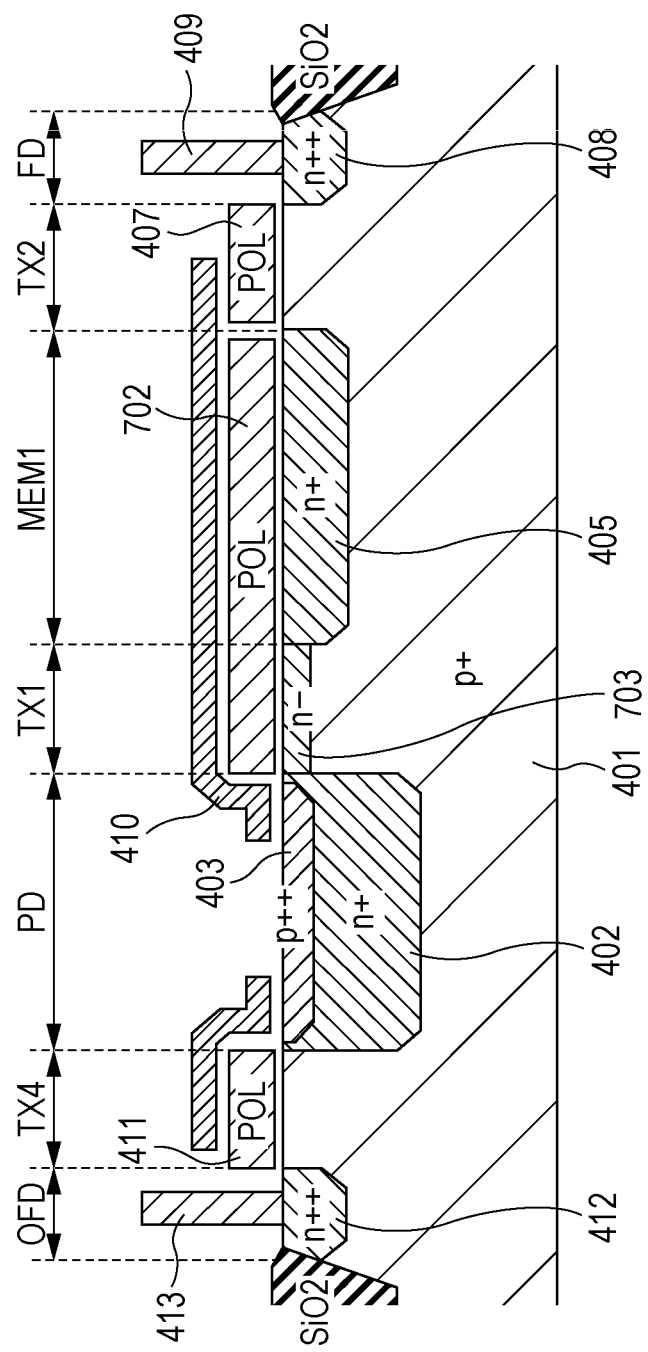
FIG. 7A is a cross-sectional diagram illustrating the first pixel of the imaging apparatus in a second Example of the first Embodiment.
Figure 7B:
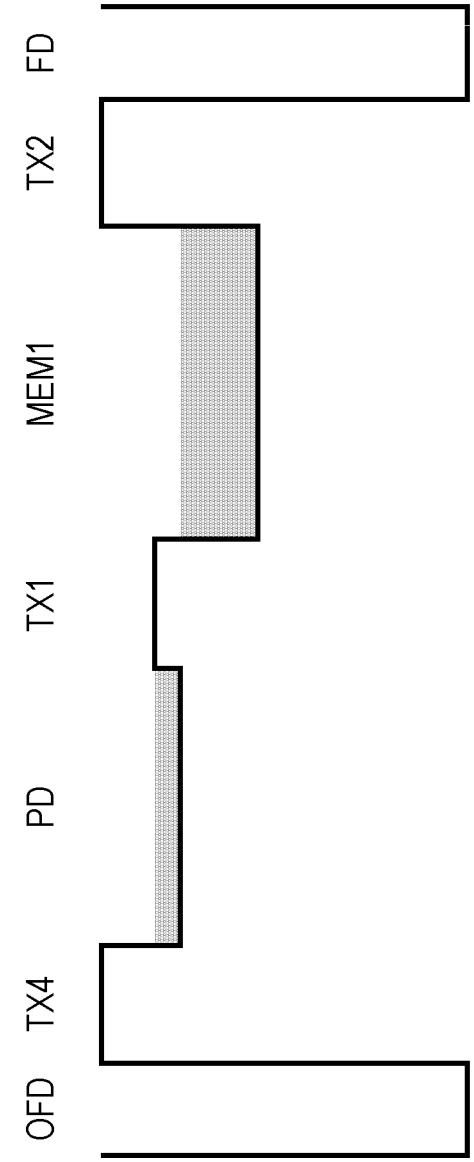
FIG. 7B is a diagram illustrating the potential of the parts illustrated in FIG. 7A.

FIG. 7A is a cross-sectional diagram illustrating the first pixel in the second Example of the first Embodiment, and FIG. 7B is a diagram illustrating the potential of the parts illustrated in FIG. 7A. The key characteristic of the first Example is the height of the potential barrier between the photoelectric conversion unit PD and the first signal holding unit MEM1. The configuration enables electrons to be transferred from the photoelectric conversion unit to the first signal holding unit MEM1 when the first charge transfer unit TX1, which is disposed in the electrical pathway between the photoelectric conversion unit PD and the first signal holding unit MEM1, is in a non-electroconductive state. Here, the non-electroconductive state is a state in which the generated potential barrier is supplied with the highest pulse value from among the pulse values to be supplied to the first charge transfer unit TX1. Thus, it does not have to be so-called completely off, and so includes a state in which some sort of potential barrier has occurred as compared to a case where it is completely on.

As a specific configuration example, this may be implemented by using a MOS transistor as the first charge transfer unit TX1, where this MOS transistor has an embedded channel. More generally, the configuration has a portion that is in a region deeper than the surface, and has an electron potential barrier lower than the surface when the first charge transfer unit TX1 is in a non-electroconductive state. In this case, the control pulse supplied to the first charge transfer unit TX1 may be a fixed value. In other words, instead of a configuration that switches between an electroconductive state and a non-electroconductive state, a configuration with a fixed potential barrier may be used. When light is illuminated on the photoelectric conversion unit PD in such a configuration, the majority of electrons generated by the photoelectric conversion are transferred to the first signal holding unit MEM1 during the exposure period. Thus, the accumulation period for all pixels on the imaging face may be aligned together.

When the first charge transfer unit TX1 is in a non-electroconductive state, a hole accumulates in a first channel face of the first charge transfer unit. Next, as electrons to be transferred are in the first channel, whose predetermined depth is deeper than that of the surface, the influence of dark current may be reduced as compared to when electrons are transferred on an insulating layer interface.

The first charge transfer unit TX1 in FIG. 7A includes a first control electrode 702 and an N-type semiconductor region 703. FIG. 7B is a diagram illustrating the potential of the state when the non-electroconductive control pulse is supplied to each control electrode. In other words, this is the state when the control pulse with the highest potential from among the control pulses to be supplied to each control electrode is supplied. This potential state is, for example, the period when, after the signals from the nth frame are transferred to the first signal holding unit MEM1, electrons are accumulated at the photoelectric conversion unit PD and the first signal holding unit until the time that the second charge transfer unit TX2 scans each row.

Also, compared to the height of the potential barrier generated by the OFD control unit TX4, the height of the potential barrier generated by the first charge transfer unit TX1 is lower. Such a configuration enables the N-type semiconductor region 703 to be disposed in proximity to the first channel.

Figure 8:
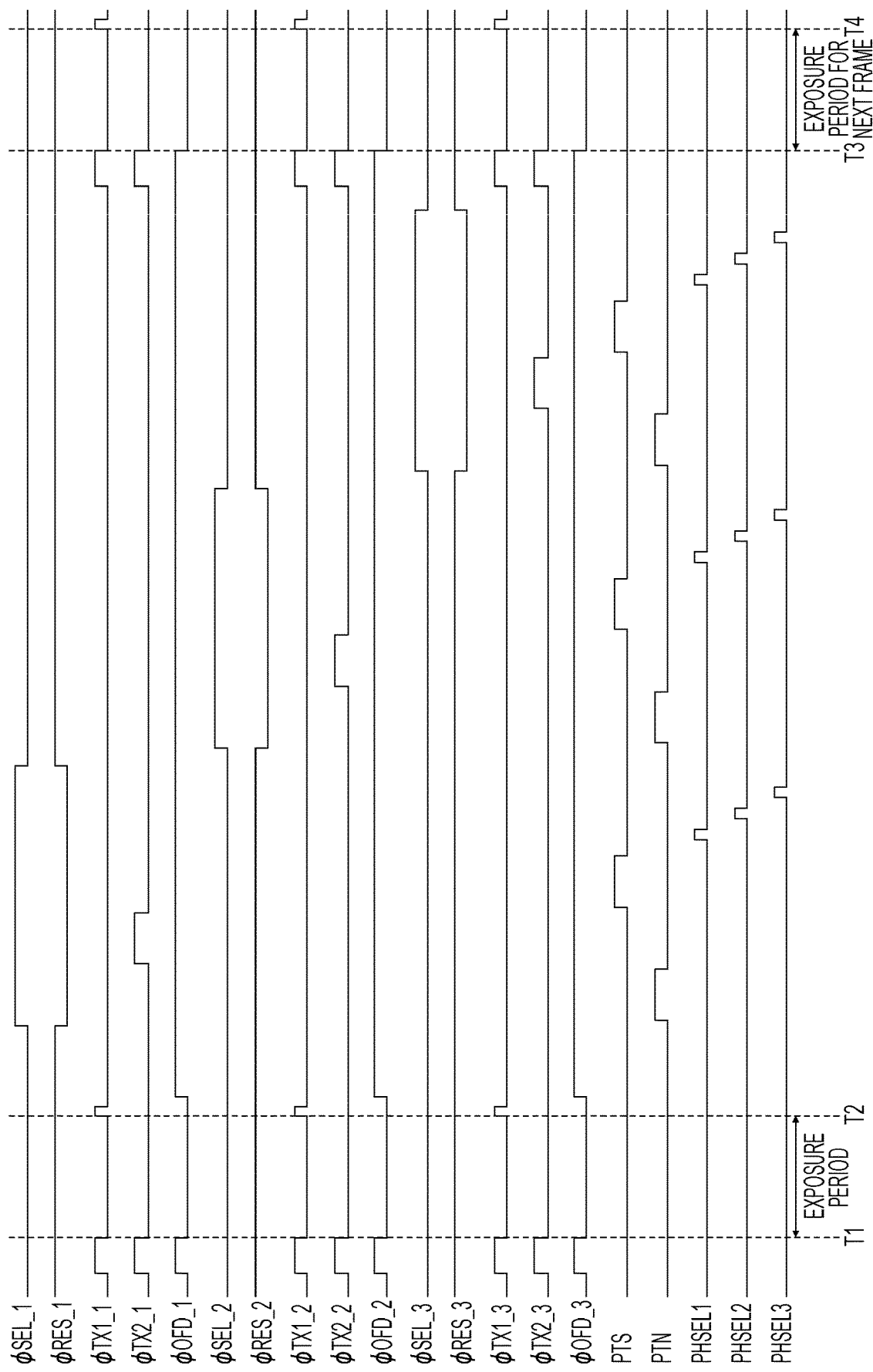
FIG. 8 is a diagram illustrating control pulses corresponding to the imaging region of the imaging apparatus in the second Example of the first Embodiment.

FIG. 8 illustrates an example of control pulses for the imaging region of the imaging apparatus in the present example. The basic operation is the same as that of FIG. 6. Compared to the operation in FIG. 6 however, the height of the potential barrier of the first charge transfer unit TX1 is lower. Thus, during the period in which electrons are held in the first signal holding unit MEM1, the φOFD remains at a high level, which then is controlled to drain the electrons generated by the photoelectric conversion unit PD to the OFD region. Specifically, the timing T3, which starts the exposure period of the N+1 frame, is set to execute after all pixel rows on the imaging face for the nth frame are read out.

Further, it is preferable if the low level state of the φTX1 is a negative voltage. This decreases dark current by gathering holes on the face of the N-type semiconductor region 405 of the first charge holding unit MEM1.

Second Embodiment

First Example

Figure 9:
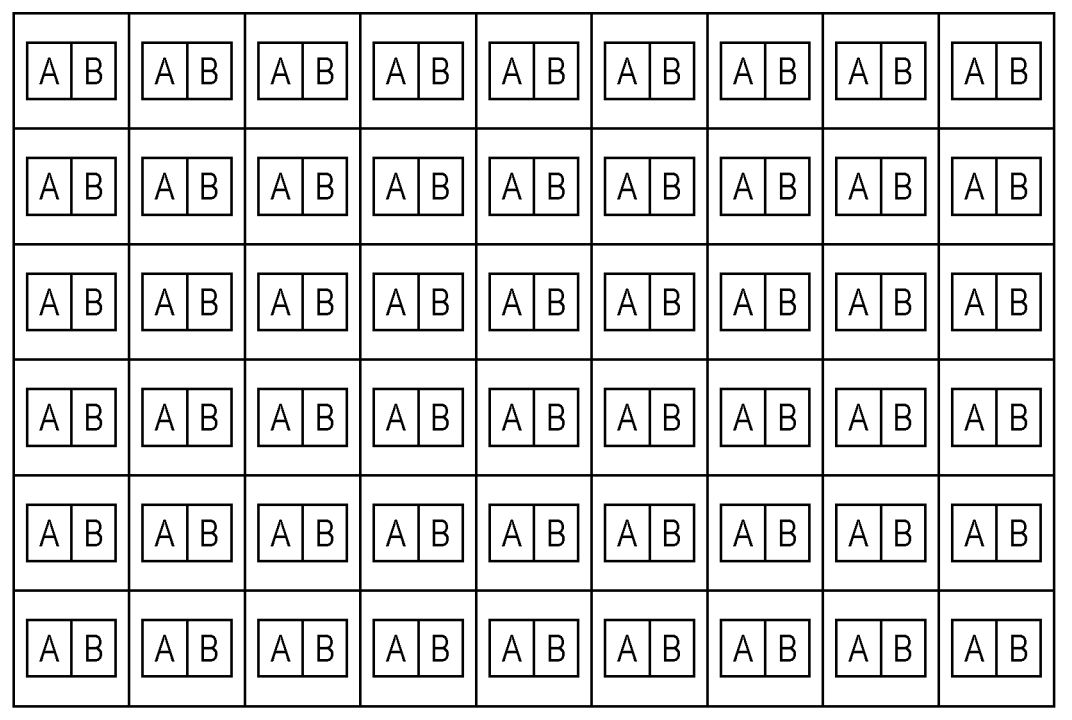

FIG. 9 is a top view of the imaging region of the imaging apparatus in the present example. The difference with the first Embodiment is that while different pixels are used to configure the imaging pixels and the focal point detection pixels for the first Embodiment, in the present example, the first pixel is divided with multiple photoelectric conversion units, and focal point detection is performed by using signals from these multiple photoelectric conversion units. The pixels here are imaging pixels of the smallest unit. For example, when including a microlens array that includes multiple microlenses, one microlens is the unit of measurement that represents one pixel. That is to say, this configuration includes multiple photoelectric conversion units to receive light condensed by one microlens, which is then able to extract the signals from each photoelectric conversion unit independently. Multiple methods to independently extract each signal may be conceived, and processing is performed at a downstream circuit to enable such a configuration.

In FIG. 9, two photoelectric conversion units are disposed to correspond to a single microlens. This is illustrated as a first photoelectric conversion unit A and a second photoelectric conversion unit B. All pixels in FIG. 9 include two photoelectric conversion units which are juxtaposed horizontally therein. However, they may be juxtaposed vertically as well, and pixels with photoelectric conversion units juxtaposed horizontally and pixels with photoelectric conversion units juxtaposed vertically may be mixed together.

Figure 10:
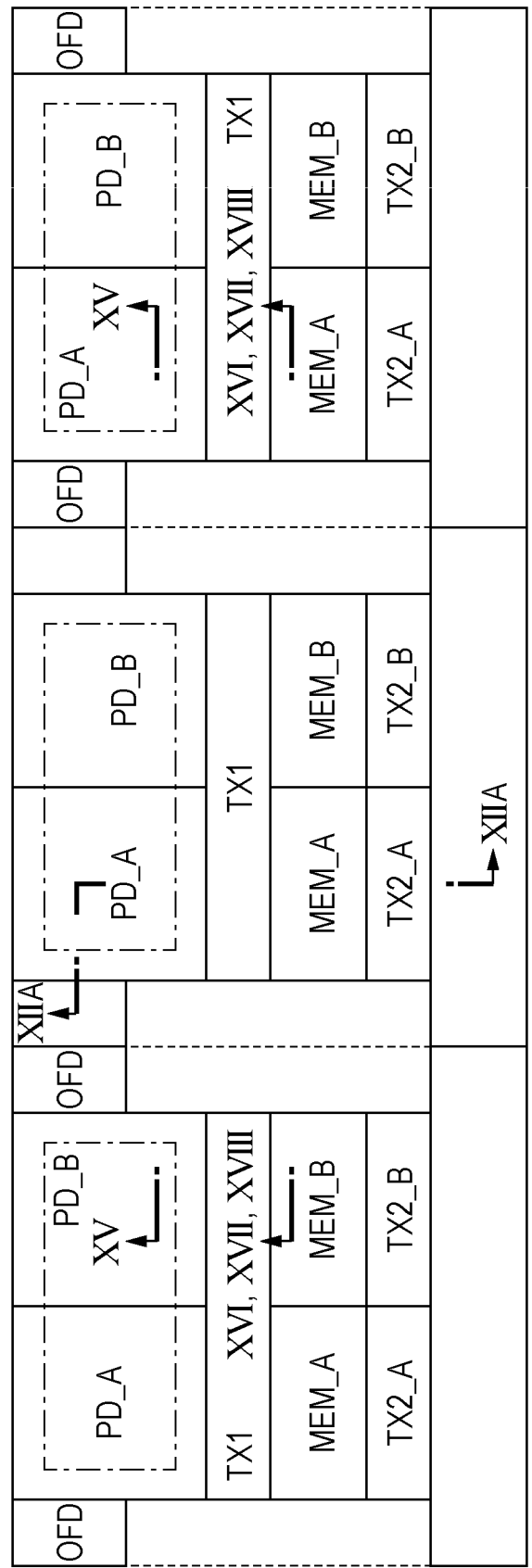
FIG. 10 is an expanded top view of the imaging region of the imaging apparatus in the first Example of the second Embodiment.

FIG. 10 is a top view of the pixels in the present example. Here, three adjacent pixels are illustrated. Many more pixels may be arranged.

The first photoelectric conversion unit PD_A is adjacent to the second photoelectric conversion unit PD_B, on which light condensed by the one mircrolens per unit is illuminated. Electrons generated at each photoelectric unit are transferred to and held at first signal holding units MEM_A and MEM_B via the first charge transfer unit TX1. Other transistors and similar that configure pixel circuits are disposed in a region disposed in the lower section of FIG. 10. Electrons generated at the photoelectric conversion units PD_A and PD_B may be drained to the OFD region.

Figure 11:
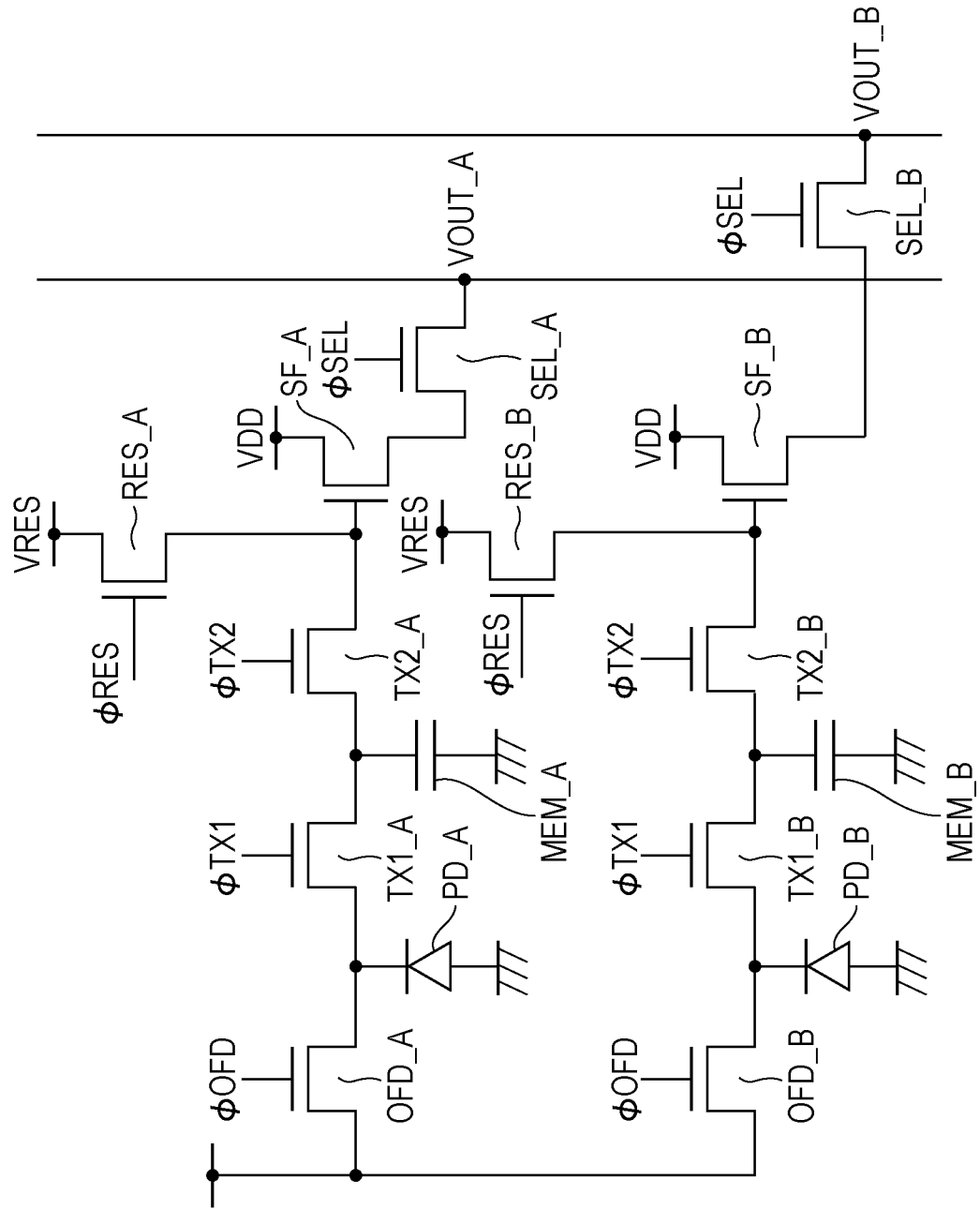
FIG. 11 is an equivalent circuit diagram illustrating the first pixel of the imaging region of the imaging apparatus in the first Example of the second Embodiment.

FIG. 11 is an equivalent circuit diagram illustrating the first pixel of the present example. The functions that are the same as those in FIG. 10 are denoted with the same reference numerals, and thus their descriptions are omitted here. A circuit is provided for the first photoelectric conversion unit PD_A, and another circuit is provided for the second photoelectric conversion unit PD_B. Also, multiple vertical signal lines are provided for each pixel row. In the present example, two vertical signal lines are provided for each pixel row. Each of these operations is similar, and so only the pixel circuit for the first photoelectric conversion unit PD_A will be described.

An electron hole is generated when light illuminates on the photoelectric conversion unit PD_A. The first charge transfer unit TX1_A is disposed in an electrical pathway between the first photoelectric conversion unit PD_A and the first signal holding unit MEM_A.

The electrons held at the first signal holding unit MEM_A are transferred to an input node of an amplification transistor SF_A via a second charge transfer unit TX2_A. The input node includes an FD. The selection transistor SEL is disposed in an electrical pathway between the amplification transistor SF_A and a vertical signal line VOUT_A. Pixels read out to the vertical signal line VOUT_A are selected by the selection transistor SEL_A. A reset transistor RES_A performs resets by supplying a reference voltage to the input node of the amplification transistor SF_A. An OFD control unit OFD_A drains electrons generated at the first photoelectric conversion unit PD_A to the OFD region. Particularly, it is preferable if the OFD control unit OFD_A operates when during the period when signal charges for generating the focal point detection signals are accumulating at the first signal unit MEM1.

The control pulse φTX1 is supplied to the first charge transfer unit TX1_A. The control pulse φTX2 is supplied to the first charge transfer unit TX2. The control pulse φOFD is supplied to the OFD control unit OFD_A. The control pulse φSEL is supplied to the gate of the selection transistor SEL_A. The control pulse φRES is supplied to the gate of the reset transistor RES_A.

It should be noted here that the control pulse supplied to each control electrode and transistor is shared for the same pixel row. Such a configuration enables high speed read out of signals as it is possible to read out focal point detection signals on multiple vertical signal lines in parallel. Also, imaging signals are obtained by first being read out to vertical signal lines VOUT_A and VOUT_B, and then added or averaged at a signal processing unit.

FIG. 12A is a cross-sectional diagram illustrating a portion of the pixel configuration corresponding to the first photoelectric conversion unit PD_A in the present example. The cross sections of E through F in FIG. 10 are illustrated. FIG. 12B is a diagram illustrating the potential of the parts illustrated in FIG. 12A. The pixel configuration for the second photoelectric conversion unit PD_B is basically the same, and accordingly description will be made only with additional notes where desirable.

The photoelectric conversion units PD_A and PD_B, the first signal holding units MEM_A and MEM_B, and the FD region are configured by the disposing of multiple N-type semiconductor regions in a P-type semiconductor region 1201. The P-type semiconductor region 1201 may use a P-type semiconductor substrate, or a P-type semiconductor formed by ion implantation into an N-type semiconductor substrate.

The photoelectric conversion unit PD_A includes the P-type semiconductor region 1201, the N-type semiconductor region 402 disposed to configure the PN junction with the –type semiconductor region 401, and the P-type semiconductor region 403 disposed on the N-type semiconductor region 402. The photoelectric conversion unit PD is configured as a so-called embedded photodiode.

The first charge transfer unit TX1_A includes a first control electrode 1204 and a first channel disposed in the lower portion of the first control electrode 1204 via an insulating layer. The first channel is configured as a portion of the P-type semiconductor region 1201. Further, the height of the potential barrier of the first channel may be adjusted by implanting impurity ions in the P-type semiconductor region 1201.

The first signal holding unit MEM_A includes a second control electrode 1206 and an N-type semiconductor region 1205 disposed in the lower portion of the second control electrode 1206 via and an insulating layer.

The second charge transfer unit TX2_A includes a third control electrode 1207 and a second channel disposed in the lower portion of the third control electrode 1207 via an insulating layer. The second channel is configured as a portion of the P-type semiconductor region 1201. Further, the height of the potential barrier of the second channel may be adjusted by implanting impurity ions in the P-type semiconductor region 1201.

The FD region includes an N-type semiconductor region 408. The N-type semiconductor region 408 is electrically connected to the gate of the amplification transistor via a plug 1209.

The OFD control unit OFD_A includes a fourth control electrode 1211 and a third channel disposed in the lower portion of the fourth control electrode 1211 via an insulating layer. The third channel is configured as a portion of the P-type semiconductor region 1201. Further, the height of the potential barrier of the third channel may be adjusted by implanting impurity ions in the P-type semiconductor region 1201.

The OFD region includes an N-type semiconductor region 1212. The N-type semiconductor region 1212 is electrically connected to a power supply line via a plug 1213.

A light-shielding member 1210 is disposed on the first signal holding unit MEM_A. It is more desirable for the second control electrode 1206 to be included in the orthogonal projection toward the second control electrode 1206 of the light-shielding member 1210. Further, it is preferable if the light-shielding member 1210 is disposed so that it extends onto the first control electrode 1204 until the side wall of the photoelectric conversion unit PD_A side of the first control electrode 1204. Further, a light-shielding member 1211 may extend to other members, or may extend onto the second charge transfer unit TX2_A and the fourth control electrode 1211.

FIG. 12B is a diagram illustrating the potential state when non-electroconducting control pulses are supplied to the first control electrode through the fourth control electrode. That is to say, this is the state when the control pulse with the highest electron potential from among the control pulses supplied to the first control electrode through the fourth control electrode is supplied. Such a potential state is, for example, a period when, after signals from all pixels for the nth frame are transferred to the first signal holding unit MEM_A simultaneously, electrons are accumulated in the photoelectric conversion unit PD_A and the first signal holding unit MEM_A during a period until the second charge transfer unit TX2_A is scanned per row.

As can be seen from FIG. 12B, the height of the potential barrier generated by the first charge transfer unit TX1 is low. As for relative relationships, for example, this potential barrier is even lower than the potential barrier generated by the OFD control unit.

Figure 13:
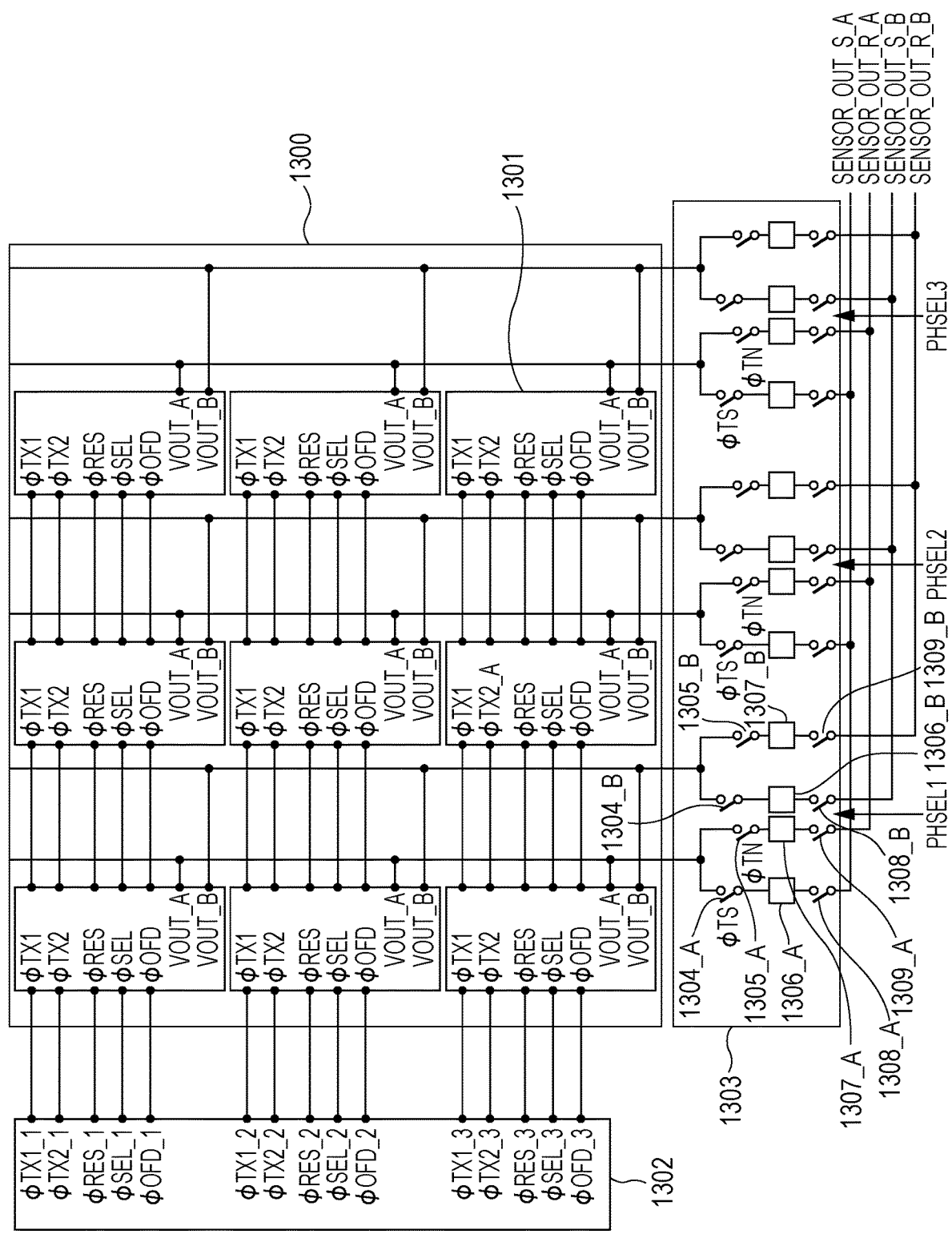
FIG. 13 is a total block diagram illustrating the imaging apparatus in the first Example of the second Embodiment.

FIG. 13 is a total block diagram illustrating the imaging apparatus of the present example. Three rows by three columns of pixels are illustrated in FIG. 13 for a total of 9 pixels, but many more pixels may be disposed.

Multiple pixels 1301 are disposed in an imaging region 1300. Control pulses are supplied from a vertical scanning unit 1302 per pixel row or for intervals of multiple pixel rows. It is preferable if pulses are sent at the same timing to the circuits corresponding to both the first photoelectric conversion unit PD_A and the second photoelectric conversion unit PD_B, both of which are included in the same pixel.

The vertical scanning unit 1302 may be configured with a shift register and an address decoder.

A column circuit 1303 is configured with multiple circuit blocks that correspond to each of the pixel rows. Each circuit block includes first switches 1304_A and 1304_B controlled by a control pulse φTS, and second switches 1305_A and 1305_B controlled by a control pulse φTN. Further, optical signal holding units 1306_A and 1306_B are disposed downstream of the first switches 1304_A and 1304_B. Noise signal holding units 1307_A and 1307_B are disposed downstream of the second switches 1305_A and 1305_B. Also, the optical signal holding units 1306_A and 1306_B are disposed downstream of third switches 1308_A and 1308_B, and the noise holding units 1307_A and 1307_B are disposed downstream of fourth switches 1309_A and 1309_B.

The third switches 1308_A and 1308_B and the fourth switches 1309_A and 1309_B are controlled by a PHSEL. Horizontal signal lines SENSOR_OUT_S_A and SENSOR_OUT_S_B are disposed downstream of the third switches 1308_A and 1308_B. Horizontal signal lines SENSOR_OUT_N_A and SENSOR_OUT_N_B are disposed downstream of the fourth switches 1309_A and 1309_B.

The signal transfer scenario for such a total block diagram will be described next. The photoelectric conversion units PD_A and PD_B in multiple pixels included in a predetermined pixel row are reset to enable a period where noise signals may be output. Next, during a period where multiple pixels in a predetermined pixel row are selectable by the vertical scanning unit 1302, noise signals are output to the vertical signal lines VOUT_A and VOUT_B. These noise signals are output to the vertical noise signal lines VOUT_A and VOUT_B nearly simultaneously.

The noise signals are offset noise from the pixel transistors corresponding to each photoelectric conversion unit, or random noise. They may also be noise signals from the column circuit.

The noise signals transferred on the vertical signal lines VOUT_A and VOUT_B are held in the noise holding units 1307_A and 1307_B via the second switches 1305_A and 1305_B nearly simultaneously. Afterwards, the signals based on the charge generated at the photoelectric conversion units PD_A and PD_B of the multiple pixels included in the predetermined pixel row change to a state where they may be output. Also, during the period where the multiple pixels in the predetermined row are in a selectable state by the vertical scanning unit 1302, an optical signal with the noise signals superimposed in the vertical signal line (hereafter, referred to simply as "optical signal") is output to the vertical signal lines VOUT_A and VOUT_B nearly simultaneously.

The optical signals transferred on the vertical signal lines VOUT_A and VOUT_B are held in the optical signal holding units 1306_A and 1306_B via the first switches 1304_A and 1304_B nearly simultaneously. Afterwards, the optical signal and noise signal are output in phase to corresponding horizontal output lines, by the third switch and the fourth switch being changed to an electroconductive state by the PHSEL per row or for intervals of multiple rows. Noise may be removed when this signal is processed by a signal processing circuit not illustrated.

Figure 14:
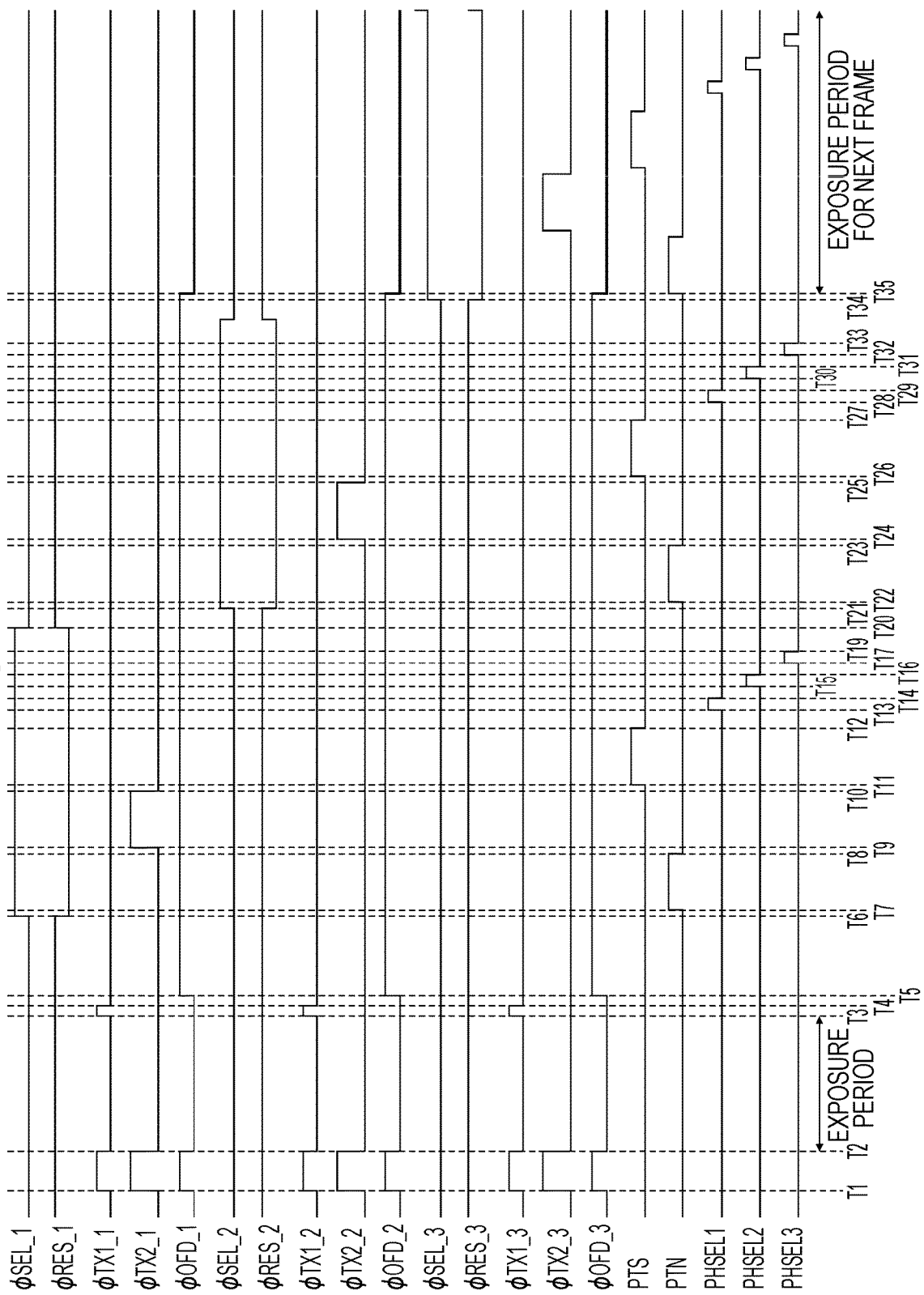
FIG. 14 is a diagram illustrating control pulses corresponding to the imaging region of the imaging apparatus in the first Example of the second Embodiment.

FIG. 14 illustrates more specific control pulses. All control pulses are at a high level and in an electroconductive state.

Until a timing T1, the φRES of all pixels on the imaging face are at a high level, and the reference voltage has been supplied to the gate of the amplification transistor. Other control pulses illustrated in FIG. 14 are at a low level. Also, a shared control pulse is supplied to each circuit element which has the same function as that of the pixel circuits for the first photoelectric conversion unit PD_A and the pixel circuits for the second photoelectric conversion unit PD_B for the same pixel row. That is to say, for the same pixel row, the signals from the first photoelectric conversion unit PD_A and the second photoelectric conversion unit PD_B are simultaneously output to the vertical signal lines VOUT_A and VOUT_B.

At the timing T1, the φTX1, φTX2, φOFD of all pixels on the imaging face change from a low level to a high level, and at a timing T2, the φTX1, φTX2, φOFD of all pixels on the imaging face change from a high level to a low level. Such an operation enables the electrons in the first photoelectric conversion unit PD_A, the second photoelectric conversion unit PD_B, and the first signal holding units MEM_A and MEM_B to be drained to the reset transistor drain via the OFD region or the FD region. Also at the timing T2, the imaging exposure period of the nth frame begins. As illustrated in FIG. 14, the exposure period is the same for the entire imaging face.

At a timing T3, the φTX1 of all pixels on the imaging face changes from a low level to a high level, and at a timing T4, the φTX1 of all pixels on the imaging face changes from a high level to a low level. Such an operation enables the electrons in the photoelectric conversion unit PD_A to be transferred to the first signal holding unit MEM_A, for all pixels on the imaging face simultaneously. Similarly, the electrons in the second photoelectric conversion unit PD_B are transferred to the first signal holding unit MEM_B, for all pixels on the imaging face simultaneously.

At a timing T5, the φOFD of all pixels on the imaging face change from a low level to a high level, and electrons generated by the light illuminated on the photoelectric conversion units PD_A and PD_B are drained to the OFD region. The OFD operation should be run period when signal charges for generating focal point detection signals are held in the first signal holding unit MEM1.

Next, at a timing T6, a φSEL_1 changes from a low level to a high level, and at the same time, a φRES_1 changes from a high level to a low level. Such an operation enables pixel noise signals to be output to the vertical signal lines VOUT_A and VOUT_B.

At a timing T7, a PTN changes from a low level to a high level, and at a timing T8, the PTN changes from a high level to a low level. Such an operation enables the noise signals for the first row of pixels to be held in the noise signal holding units in the column circuit.

At a timing T9, a φTX2_1 changes from a low level to a high level, and at a timing T10, the φTX2_1 changes from a high level to a low level. Such an operation enables signal charges from the multiple pixels in the first row to be transferred from the first signal holding units MEM_A and MEM_B to the input node of the amplification transistors SF_A and SF_B.

At a timing T11, the PTS changes from a low level to a high level, and at a timing T12, the PTS changes from a high level to a low level. Such an operation enables the optical signal for focal point detection from the pixels in the first row to be held in the optical signal holding units in the column circuit. Noise signals are superimposed in these optical signals for focal point detection.

Next, at timings T13 through T19, PHSEL_1 through PHSEL_3 are consecutively changed to an electroconductive state, which enables signals of each pixel row to be consecutively output to the horizontal output lines. This period is called the horizontal scanning period (horizontally enabled period).

At a timing T20, a φSEL1 changes from a high level to a low level. The pixels in the first row change from a selectable state to a non-selectable state. In continuance, during the period of timings T21 through T33, the signals from the pixels in the second row are read out in the same way as those in the first row.

Next, at timings from T34, the signals from the focal point detecting pixels in the third row are read out. Regarding the present example, the exposure period of the next frame begins during the read out period of the signals for focal point detection from the pixels in the third row. At a timing T35, the φOFD of all pixels on the imaging face change from a high level to a low level. Such an operation enables the signal charges for generating focal point detection signals, which are generated from light illuminated on the photoelectric conversion units PD_A and PD_B, to be accumulated in the photoelectric conversion units PD_A and PD_B.

Such operations enable the implementation of a global electron shutter, and further, noise signals generated from each pixel may be removed via a downstream circuit not illustrated.

Figure 15:
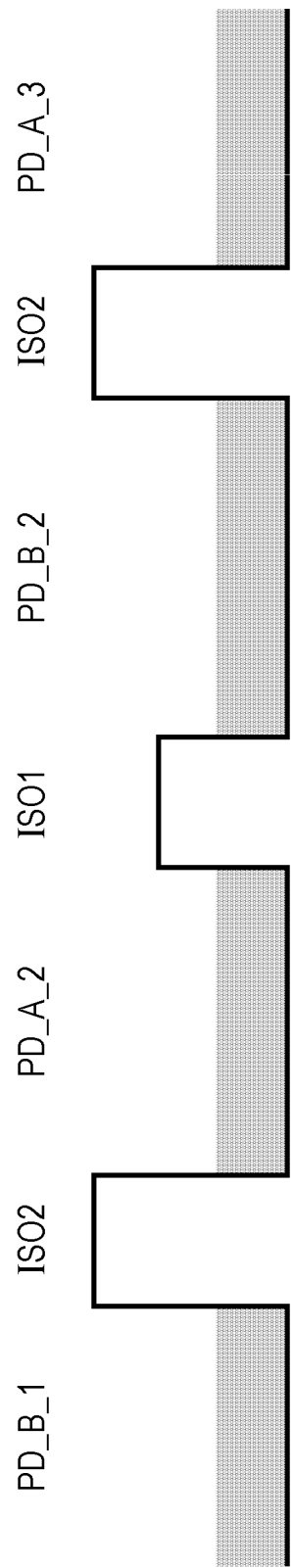
FIG. 15 is a diagram illustrating the potential of the imaging region of the imaging apparatus in the first Example of the second Embodiment.

FIG. 15 is a diagram illustrating the potential of G through H illustrated in FIG. 10. FIG. 15 describes the magnitude relationship between the potentials of the photoelectric conversion units PD_A and PD_B for the 3 adjacent pixels, and of regions between these units. As can be seen from FIG. 15, the height of the potentials generated by the regions between the first photoelectric conversion unit PD_A and the second photoelectric conversion unit PD_B in the same pixel are lower than the height of potentials generated by regions between photoelectric conversion units of different pixels which have multiple photoelectric conversion units that are adjacent to each other.

The suffix numbers denoting the photoelectric conversion units in FIG. 15 indicate which pixel each unit is included in, and so photoelectric conversion units with the same suffix number belong to the same pixel. Units with different numbers belong to different pixels.

Three adjacent pixels are illustrated in FIG. 15. Let us say that from the left, these are a first pixel, a second pixel, and a third pixel respectively. Illustrated in FIG. 15 are a second photoelectric conversion unit PD_B_1 of the first pixel, a first photoelectric conversion unit PD_A_2 and a second photoelectric conversion unit PD_B_2 of the second pixel, and a first photoelectric conversion unit PD_A_3 of the third pixel. The region between the first photoelectric conversion unit PD_A_2 and the second photoelectric conversion unit PD_B_2 included in the same pixel (the second pixel) is illustrated as ISO1. The regions (second regions) between the photoelectric conversion units (PD_B_1 and PD_A_2) adjacent to the photoelectric conversion units of different pixels (first pixel and second pixel, for example) are illustrated as ISO2. Also, the minimum values for the potentials in the pathway are illustrated. The height of the potential of the first region ISO1 is lower than the height of the potential of the second region ISO2. Such a relationship between potentials has the following advantages.

Let us say that, for example, at least the first photoelectric conversion unit PD_A_2 is saturated by the difference in sensitivity and the difference in luminance between the first photoelectric conversion unit PD_A_2 and the second photoelectric conversion unit PD_B_2, which are adjacent to each other and included in the same pixel. At such a time, a portion of the charge generated at the first photoelectric conversion unit PD_A_2 crosses the potential barrier generated by the first region ISO1, and transfers to the second photoelectric conversion unit PD_B_2. Not only this, the charge generated at the first photoelectric conversion unit PD_A_2 will also transfer to the photoelectric conversion unit PD_B_1. Further, this charge will also transfer to a transistor array region disposed adjacent to the first photoelectric conversion unit PD_A_2 not illustrated.

When the first photoelectric conversion unit PD_A_2 is saturated, but the second photoelectric conversion unit PD_B_2 is not saturated, signals that have a linearity in accordance with the incident light are output from the second photoelectric conversion unit PD_B_2 alone. For this reason, when these signals are combined, the combined output is determined by the output of the second photoelectric conversion unit PD_B_2 from the point where the first photoelectric conversion unit PD_A_2 is saturated, and as a result, the combined output ends up having a knee characteristic from the point that the first photoelectric conversion unit PD_A_2 is saturated. This phenomenon is noticeable when the charge generated after the first photoelectric conversion unit PD_A_2 becomes saturated leaks to parts other than the PD_B_2. This type of phenomenon may cause situations where the desired combined signal is not obtainable. By implementing a potential state such as that illustrated in FIG. 15 to counter this type of phenomenon, charge transfers more readily to the adjacent photoelectric conversion unit of the same pixel, and so a desirable combined signal may be obtained.

Figure 16:
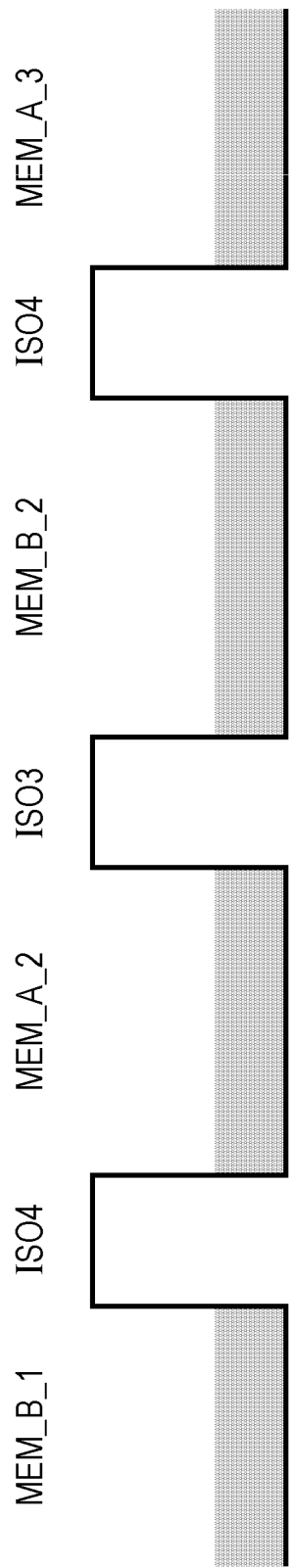
FIG. 16 is a diagram illustrating the potential of the imaging region of the imaging apparatus in the first Example of the second Embodiment.

FIG. 16 is a diagram illustrating the potential of I through J illustrated in FIG. 10. FIG. 16 describes the magnitude relationship between the potentials of the first signal holding units for the 3 adjacent pixels, and of regions between these units. The suffix number represents the same information as that of FIG. 15.

The region (the third region) between the first signal holding unit MEM_A_2 and the first signal holding unit MEM_B_2 included in the same pixel is illustrated as ISO3. The regions between the first signal holding units adjacent to the first signal holding units of different pixels are illustrated as ISO4. The height of the potential of the third region ISO3 is the same as the height of the potential of the fourth region ISO4. That is to say, the potential between the first signal holding units of the same pixel and between those that are adjacent but belonging to different pixels does not change. This is because whether the space between the first signal holding units is the space between multiple first signal holding units of the same pixel, or whether it is the space between the first signal holding units that are adjacent but belonging to different pixels, it is desirable to maintain independence between these signals. Particularly when using a global electron shutter operation, if the height of the potential barriers between the third region ISO3 and the fourth region ISO4 is changed, one portion in the imaging face will be different when signals are read out, and this will cause the degree of signal mixing to change.

Further, it is preferable if the height of the potential between the third region ISO3 and the fourth region ISO4 is higher than the height of the first region. Further, it is preferable if the height of the potential between the third region ISO3 and the fourth region ISO4 is the same as the height of the potential of the second region ISO2.

Figure 17:
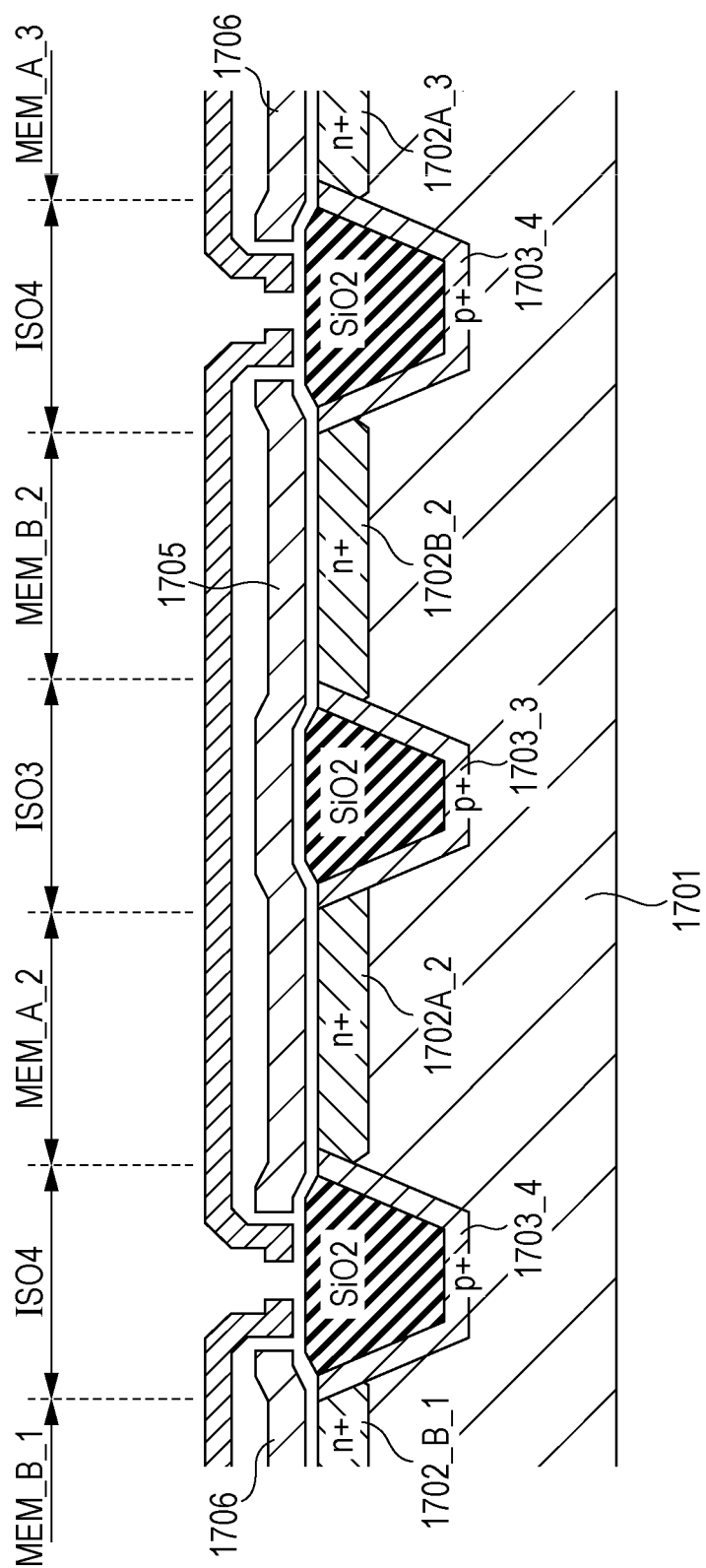
FIG. 17 is an example cross-sectional diagram corresponding with the parts illustrated in FIG. 16.

FIG. 17 is a cross-sectional diagram illustrating the potential of I through J illustrated in FIG. 10. The portions that have the same functions as those in FIG. 10 are denoted with the same reference numerals, and thus their descriptions are omitted here.

Each of the multiple first signal holding units include multiple N-type semiconductor regions disposed in a P-type semiconductor region 1701. The P-type semiconductor region 1701 may use a P-type semiconductor substrate, or may use a P-type semiconductor region formed by ion implantation in an N-type semiconductor substrate.

The first signal holding unit MEM_B_1 includes an N-type semiconductor region 1702B_1, and the first signal holding unit MEM_A_2 includes an N-type semiconductor region 1702A_2. Further, the first signal holding unit MEM_B_2 includes an N-type semiconductor region 1702B_2, and the first signal holding unit MEM_A_3 includes an N-type semiconductor region 1702A_3. The N-type semiconductor regions 1702B_1, 1702A_2, 1702B_2, and 1702A_3 are configured with a PN junction to the P-type semiconductor region 1701. Further, a P-type semiconductor region may be disposed on the face of each N-type semiconductor region.

The third region ISO3 includes a P-type semiconductor region 1703_3 disposed next to an isolating region SiO2 via an insulating layer. This may use the so-called channel stop region.

The fourth region ISO4 includes a P-type semiconductor region 1703_4 disposed next to an isolating region SiO2 via an insulating layer. This may use the so-called channel stop region.

The first charge transfer unit TX1_2 includes a control electrode 1705. The control electrode 1705 is disposed continuously on the N-type semiconductor regions 1702A_1 and 1702A_2 via an insulating layer. As illustrated in FIG. 17, this may be disposed on the third region ISO3, which is disposed between the N-type semiconductor regions 1702A_1 and 1702A_2.

The first charge transfer unit TX1_2 includes a control electrode 1706. The control electrode 1706 may be disposed in the same way as the control electrode 1705, which is continuously on the N-type semiconductor regions that correspond to each of the multiple first signal holding units included in the same pixel.

According to the configuration in FIG. 17, the height of the potential for the third region ISO3 and the fourth region ISO4 may readily be raised due to the provision of element isolating regions, which are implemented via insulating layers.

Figure 18:
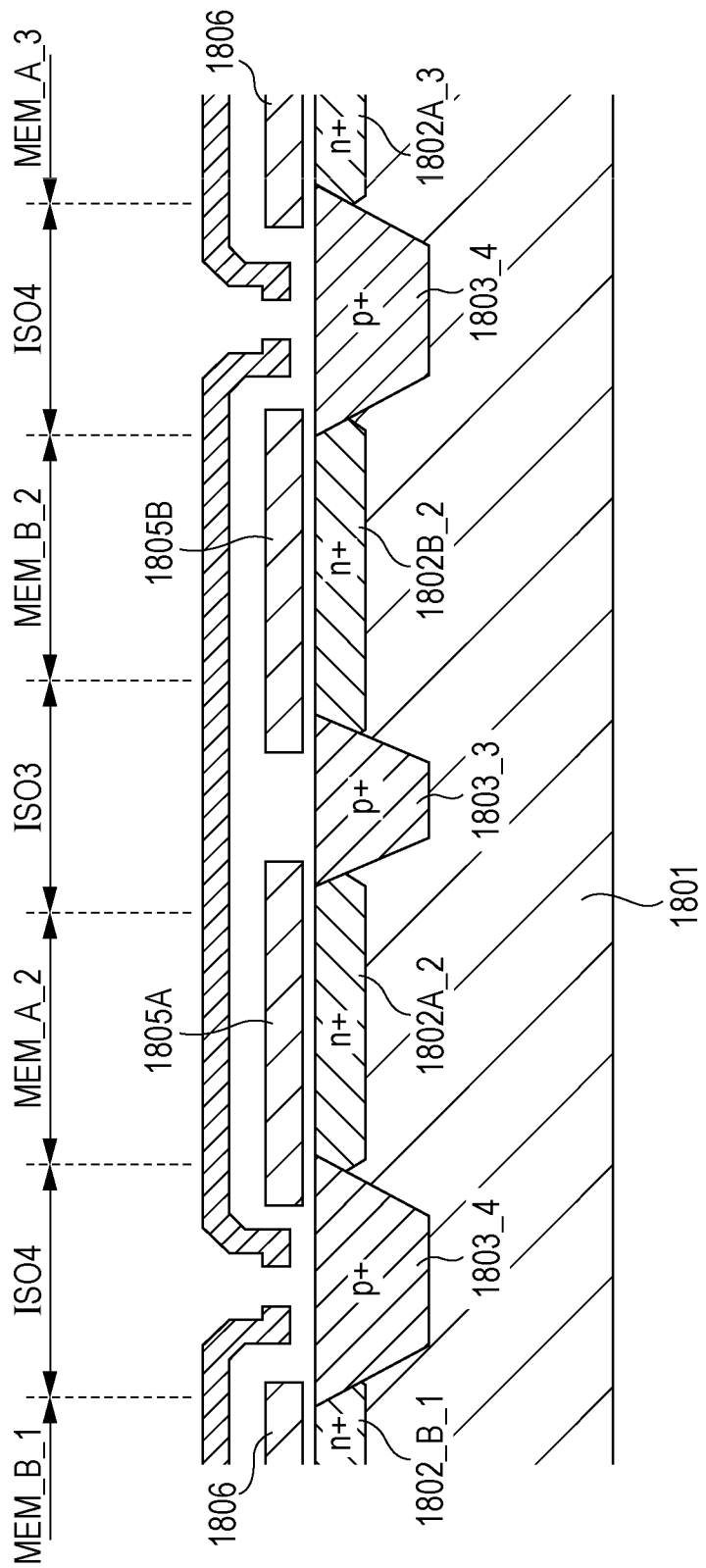
FIG. 18 is another example cross-sectional diagram corresponding with the parts illustrated in FIG. 16.

FIG. 18 illustrates an example of another cross-section of I through J illustrated in FIG. 10. The portions that have the same functions as those in FIG. 10 are denoted with the same reference numerals, and thus their descriptions are omitted here. The biggest difference from the configuration in FIG. 17 is the configuration of the third region ISO3 and the fourth region ISO4. Specifically, the element isolating region implemented via the insulating layers are not provisioned, and so the configuration only contains the semiconductor regions.

Each of the multiple first signal holding units includes multiple N-type semiconductor regions disposed in a P-type semiconductor region 1801. The P-type semiconductor region 1801 may use a P-type semiconductor substrate, or may use a P-type semiconductor region formed by ion implantation in an N-type semiconductor substrate.

The first signal holding unit MEM_B_1 includes an N-type semiconductor region 1802B_1, and the first signal holding unit MEM_A_2 includes an N-type semiconductor region 1802A_2. The first signal holding unit MEM_B_2 includes an N-type semiconductor region 1802B_2, and the first signal holding unit MEM_A_3 includes an N-type semiconductor region 1802A_3. The N-type semiconductor regions 1802B_1, 1802A_2, 1802B_2, and 1802A_3 are configured with a PN junction to the P-type semiconductor region 1801. Further, a P-type semiconductor region may be disposed on the face of each N-type semiconductor region.

The third region ISO3 includes a P-type semiconductor region 1803_3. Here, one of the semiconductor regions may be configured from multiple regions disposed with different depths as illustrated in FIG. 18.

The fourth region ISO4 includes a P-type semiconductor region 1803_4. Similar to the third region ISO3, this may be configured from regions disposed with different depths via multiple processes.

The first charge transfer unit TX1_2 includes control electrodes 1805A and 1805B. The control electrode 1805A is disposed on the N-type semiconductor region 1802A_2 via an insulating layer. The control electrode 1805B is disposed on the N-type semiconductor region 1802B_2 via an insulating layer.

The first charge transfer units TX1_1 and TX1_3 each include a control electrode 1806. The control electrode 1806 is disposed on an N-type semiconductor region which configures the corresponding first signal holding unit.

According to the configuration in FIG. 18, there are few depressions on the surface of the semiconductor substrate, and so it is easy to dispose light-shielding members. Also, illumination of light transmitted through insulating layers, which would be disposed between adjacent pixels, may be prevented even without any coating of a light-shielding layer thus improving light-shielding properties. Also, the element isolating unit electrodes are eliminated, which decreases the area of holding unit electrodes, and this enables relatively high-speed propagation of driving pulses.

Second Example

Figure 19:
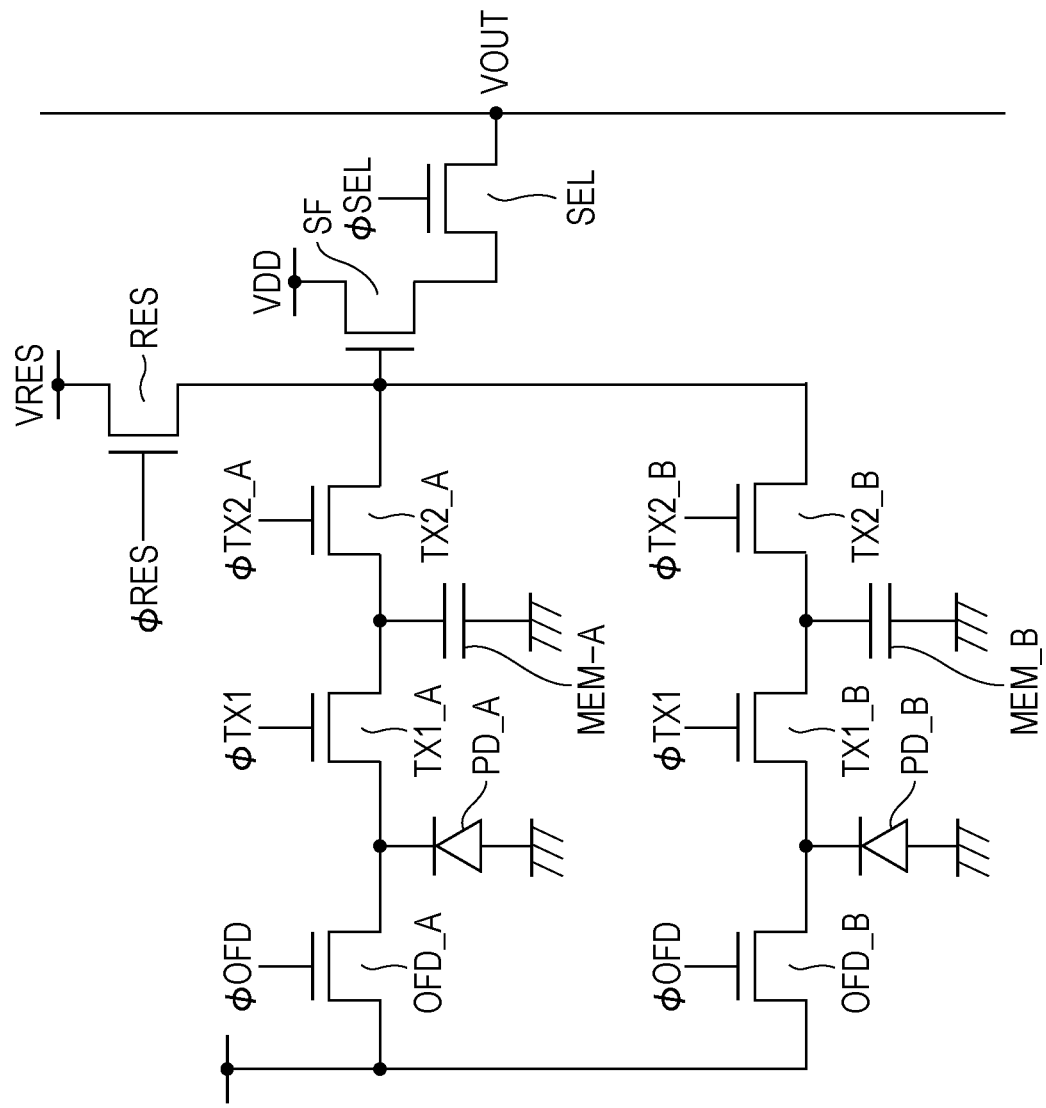
FIG. 19 is an equivalent circuit diagram illustrating the first pixel of the imaging region of the imaging apparatus in a second Example of the second Embodiment.

FIG. 19 illustrates an example of an equivalent circuit for a pixel in the first Example of the second Embodiment. The portions that have the same functions as those in FIG. 11 are denoted with the same reference numerals, and thus their descriptions are omitted here. The difference between the present example and the example in FIG. 11 is that the amplification transistor SF is shared between the multiple photoelectric conversion units PD_A and PD_B of the same pixel. Thus, it is desirable to have a configuration where the second charge transfer unit TX2_A corresponding to the first photoelectric conversion unit PD_A and the second charge transfer unit TX2_B corresponding to the first photoelectric conversion unit PD_B are independently controllable.

FIG. 20 is a diagram illustrating control pulses for the imaging apparatus in the present example. The driving pulses illustrated in FIG. 20 for this example are signals from the multiple photoelectric conversion units of the same pixel which are added at the input node of the amplification transistor. Further, a pulse PTS is a control pulse used when signals are held in the photoelectric conversion unit disposed in the column circuit. A pulse PTN is a control pulse used when signals are held in the noise signal holding unit disposed in the column circuit. A pulse PHSEL is a control pulse output from the horizontal scanning circuit, and is used for the read out of signals from each row held in the column circuit to the horizontal signal lines. The driving pulses in FIG. 20 may be used in a still image mode.

Until a timing T1, the φRES of all pixels on the imaging face are at a high level, and the reference voltage has been supplied to the gate of the amplification transistor. Other control pulses illustrated in FIG. 20 are at a low level.

At the timing T1, the φTX1, φTX2_A, φTX2_B, and φOFD of all pixels on the imaging face change from a low level to a high level, and at a timing T2, the φTX1, φTX2_A, φTX2_B, and φOFD of all pixels on the imaging face change from a high level to a low level.

Such an operation enables the electrons in the first photoelectric conversion unit PD_A, the second photoelectric conversion unit PD_B, and the first signal holding units MEM_A and MEM_B to be drained to the reset transistor drain via the OFD region or the FD region. Also at the timing T2, the imaging exposure period of the nth frame begins. As illustrated in FIG. 20, the exposure period is the same for the entire imaging face.

At a timing T3, the φTX1 of all pixels on the imaging face changes from a low level to a high level, and at a timing T4, the φTX1 of all pixels on the imaging face changes from a high level to a low level. Such an operation enables the signal charges for imaging in the first photoelectric conversion unit PD_A to be transferred to the first signal holding MEM_A, for all pixels on the imaging face simultaneously. Similarly, the signal charges for imaging in the second photoelectric conversion unit PD_B are transferred to the first signal holding unit MEM_B, for all pixels on the imaging face simultaneously.

At a timing T5, the φOFD of all pixels on the imaging face change from a low level to a high level, and signal charges generated by light illuminated on the photoelectric conversion units PD_A and PD_B are drained to the OFD region.

Next, at a timing T6, a φSEL_1 changes from a low level to a high level, and at the same time, a φRES_1 changes from a high level to a low level. Such an operation enables a state where noise signals may be output to the vertical signal line VOUT.

At a timing T7, a PTN changes from a low level to a high level, and at a timing T8, the PTN changes from a high level to a low level. Such an operation enables the noise signals for the first row of pixels to be held in the noise signal holding units in the column circuit.

At a timing T9, a φTX2_A_1 and a φTX2_B_1 change from a low level to a high level, and at a timing T10, the φTX2_A_1 and the φTX2_B_1 change from a high level to a low level. Such an operation enables electrons from the multiple pixels in the first row to be transferred from the first signal holding units MEM_A and MEM_B to the input node of the amplification transistors SF, and then added.

At a timing T11, the PTS changes from a low level to a high level, and at a timing T12, the PTS changes from a high level to a low level. Such an operation enables the optical signal for imaging from the pixels in the first row to be held in the optical signal holding units in the column circuit.

Next, at timings T13 through T18, PHSEL_1 through PHSEL_3 are consecutively changed to an electroconductive state, which enables signals of each pixel row to be consecutively output to the horizontal output lines. This period is called the horizontal scanning period (horizontally enabled period).

At a timing T19, a φSEL1 changes from a high level to a low level, and the pixels in the first row change from a selectable state to a non-selectable state. In continuance, at timings T20 through T34, the signals from the pixels in the second row are read out in the same way as those in the first row.

Next, at timings from T34, the signals from the pixels in the third row are read out. Regarding the present example, the exposure period of the next frame begins during the read out period of the imaging signals in the third row. At a timing T35, the φOFD of all pixels on the imaging face change from a high level to a low level. Such an operation enables the signal charges generated from light illuminated on the photoelectric conversion units PD_A and PD_B to be accumulated in the photoelectric conversion units PD_A and PD_B. Such operations enable the implementation of a global electron shutter, and further, noise signals may be removed via a downstream circuit not illustrated.

Figure 21A:
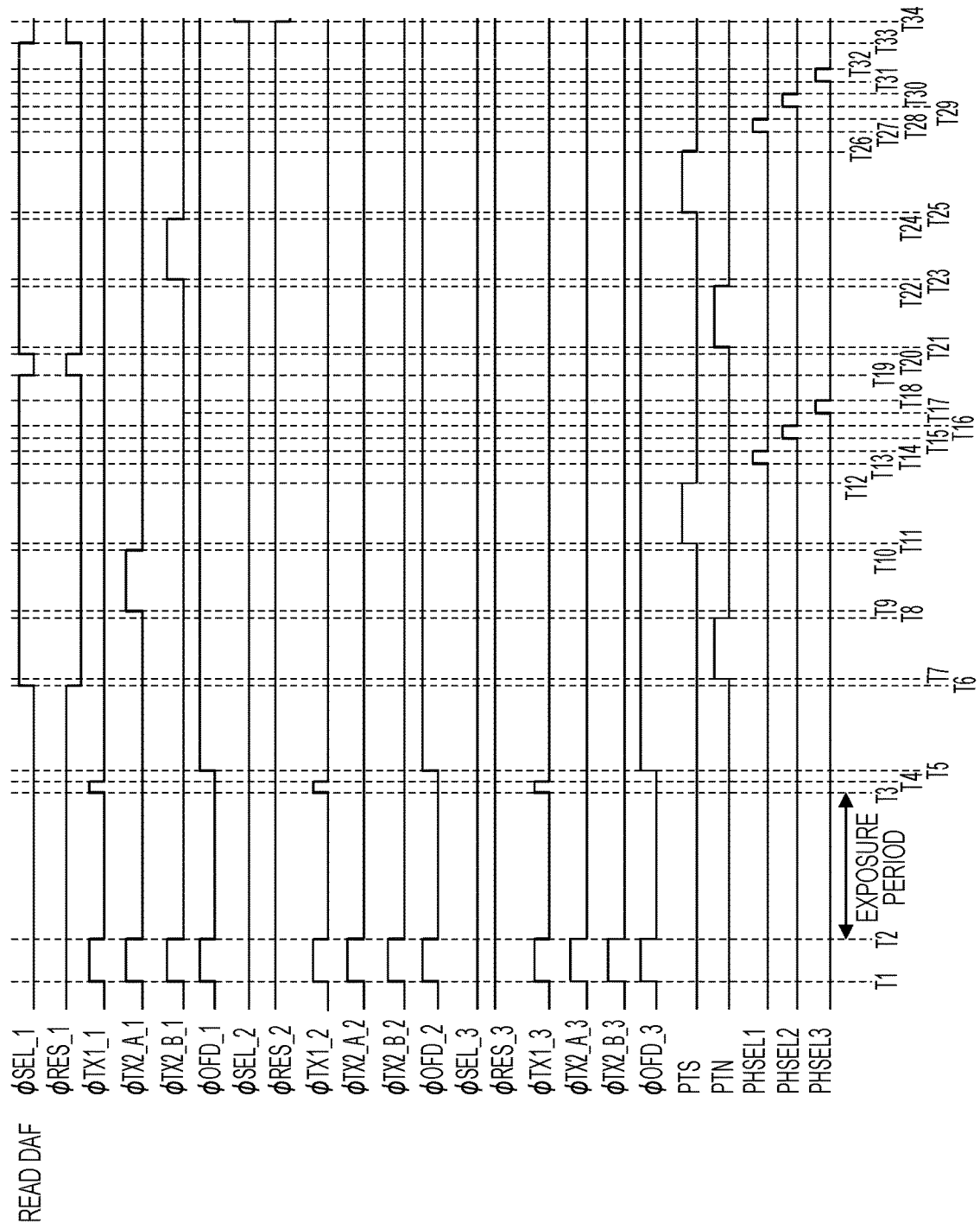
FIG. 21A is a diagram illustrating control pulses corresponding to the imaging region of the imaging apparatus in the second Example of the second Embodiment.

Next, FIGS. 21A and 21B are diagrams illustrating the driving pulses that are used for the output of focal point detection signals. The biggest difference as compared to the driving pulses in FIG. 20 is that signals from the first photoelectric conversion unit PD_A and the second photoelectric conversion unit PD_B of the same pixel are independently read out to the vertical signal lines. The following describes the driving pulses focusing on this point in detail.

The period of timings T1 through T8 is the same as that of FIG. 20, and so description thereof is omitted here. FIGS. 21A and 21B combine to form one diagram of the driving pulses where timings T1 through T34 are illustrated in FIG. 21A and timings from T35 are illustrated in FIG. 21B.

At a timing T9, a φTX2_A_1 changes from a low level to a high level, and at a timing T10, the φTX2_A_1 changes from a high level to a low level. Such an operation enables signal charges for generating focal point detection signals from the multiple pixels in the first row to be transferred from the first signal holding unit MEM_A to the input node of the amplification transistor SF.

At a timing T11, the PTS changes from a low level to a high level, and at a timing T12, the PTS changes from a high level to a low level. Such an operation enables the optical signals for generating focal point detection signals from the first photoelectric conversion unit PD_A in the pixels in the first row to be held in the optical signal holding units in the column circuit.

Next, at timings T13 through T18, PHSEL_1 through PHSEL_3 are consecutively changed to an electroconductive state, which enables signals of each pixel row to be consecutively output to the horizontal output lines. This period is called the horizontal scanning period (horizontally enabled period).

At a timing T19, a φSEL1 changes from a high level to a low level, and a φRES1 changes from a low level to a high level, and at a timing T20, the φSEL1 changes from a low level to a high level, and the φRES1 changes from a high level to a low level. Such an operation enables the pixels in the first row to be temporarily changed to a non-selectable state. Also, a floating state results after the voltage of the input node in the amplification transistor is reset to the reference voltage. Such an operation enables the signals of the pixels in the first row to be output again to the vertical signal lines.

At a timing T21, the PTN changes from a low level to a high level, and at a timing T22, the PTN changes from a high level to a low level. Such an operation enables the noise signals from the first row to be held in the noise signal holding units in the column circuit.

At a timing T23, a φTX2_B_1 changes from a low level to a high level, and at a timing T24, the φTX2_B_1 changes from a high level to a low level. Such an operation enables signal charges for focal point detection from the multiple pixels in the first row to be transferred from the first signal holding unit MEM_B to the input node of the amplification transistor SF.

At a timing T25, the PTS changes from a low level to a high level, and at a timing T26, the PTS changes from a high level to a low level. Such an operation enables the optical signals for generating focal point detection signals from the second photoelectric conversion unit PD_B in the pixels in the first row to be held in the optical signal holding units in the column circuit.

Next, at timings T27 through T32, PHSEL_1 through PHSEL_3 are consecutively changed to an electroconductive state, which enables signals of each pixel row to be consecutively output to the horizontal output lines.

At a timing T33, the φSEL1 changes from a high level to a low level. The pixels in the first row change from a selectable state to a non-selectable state. Such an operation enables the completion of the read out of focal point detection signals of the pixels in the first row.

Next, at timings T34 through T62, the focal point detection signals from the pixels in the second row are read out in the same way as with the first row.

Regarding the present example, the exposure period of the next frame begins during the read out period of the signals for focal point detection from the pixels in the third row. At a timing T63, the φOFD of all pixels on the imaging face change from a high level to a low level. Such an operation enables the signal charges for generating focal point detection signals generated from light illuminated on the photoelectric conversion units PD_A and PD_B to be accumulated in the photoelectric conversion units PD_A and PD_B.

Third Example

Figure 22:
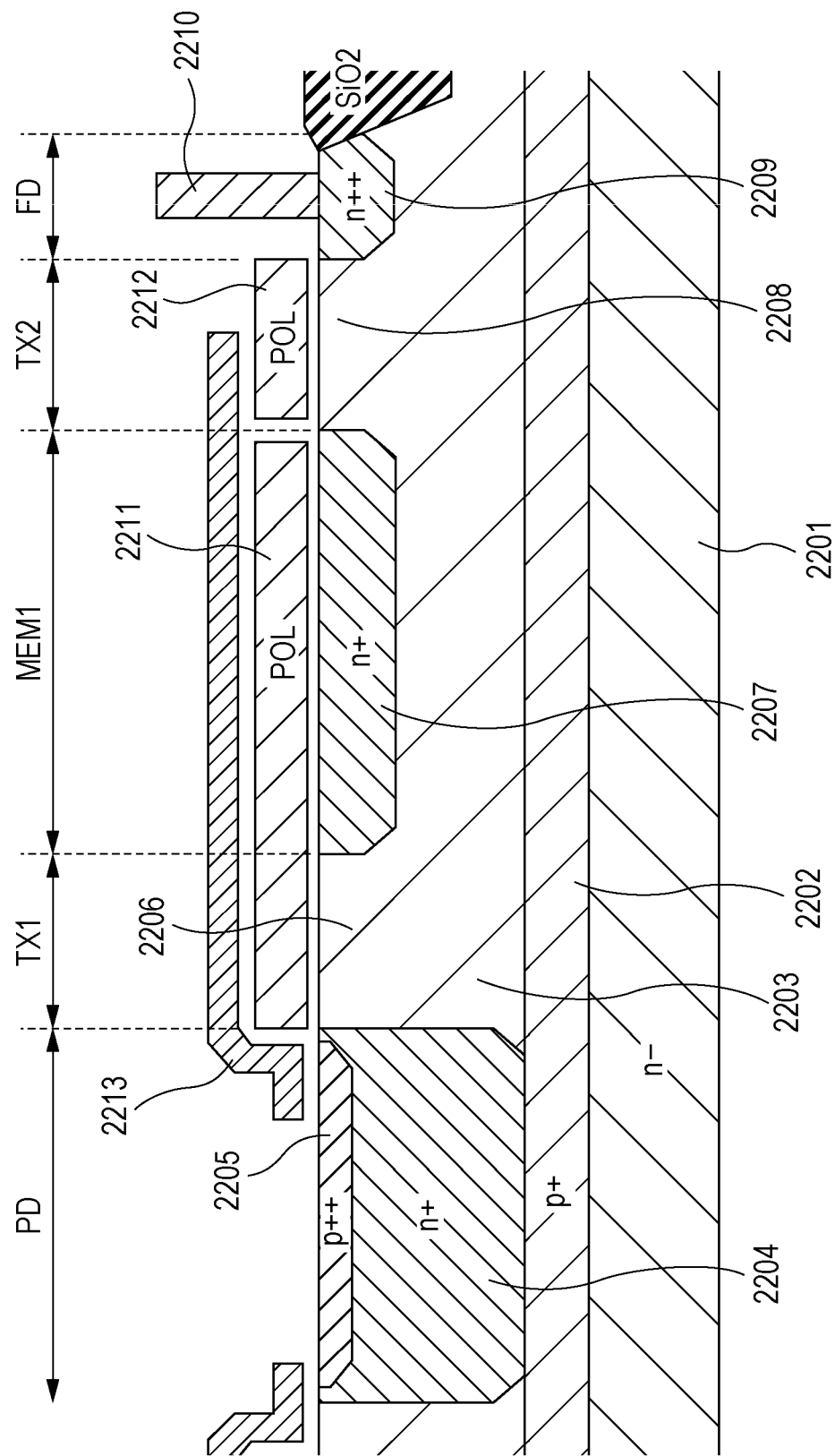
FIG. 22 is a cross-sectional diagram illustrating the first pixel of the imaging region of the imaging apparatus in a third Example of the second Embodiment.

FIG. 22 is a cross-sectional diagram illustrating the imaging apparatus in the present example. Regarding the cross sections that have been described until this point, the OFD regions have been disposed in the photoelectric conversion units laterally, i.e., a lateral overflow drain (LOFD) structure. The present example uses a different configuration which employs a vertical overflow drain (VOFD).

Power supply voltage is supplied to an N-type semiconductor region 2201, which functions as the VOFD region. A P-type semiconductor region 2202 is disposed on the N-type semiconductor region 2201. A P-type semiconductor region 2203 is disposed on the P-type semiconductor region 2202. An N-type semiconductor region 2204 is disposed here to configure a PN junction with the P-type semiconductor region 2203, and a P-type semiconductor region 2205 is also disposed on the N-type semiconductor region 2204. The photoelectric conversion unit PD is configured from the P-type semiconductor region 2203, the N-type semiconductor region 2204, and the P-type semiconductor region 2205. This is a so-called embedded type of photodiode.

The first charge transfer unit TX1 is configured with a control electrode 2211 and a first channel 2206 disposed in the lower portion of the control electrode via an insulating layer. The first channel 2206 is configured from a portion of the P-type semiconductor region 2203. Further, the height of the potential barrier may be adjusted by the implantation of impurity ions.

The first signal holding unit MEM1 is configured with the control electrode 2211 and an N-type semiconductor region 2207 disposed in the lower portion of the control electrode 2211 via an insulating layer. Negative voltage is supplied to the control electrode to gather holes on the face of the N-type semiconductor region 2207, which enables the reduction of dark current during the signal holding period at the first signal holding unit MEM1.

The second charge transfer unit TX2 is configured with a control electrode 2212 and a second channel 2208 disposed in the lower portion of the control electrode 2212 via an insulating layer. The second channel 2208 is configured from a portion of the P-type semiconductor region 2203. Further, the height of the potential barrier may be adjusted by the implantation of impurity ions.

The FD is configured from an N-type semiconductor region 2209. The N-type semiconductor region 2209 is electrically connected to the gate of the amplification transistor via a plug 2210.

A light-shielding member 2213 is disposed on the first signal holding unit MEM1. It is more preferable if this extends to the photoelectric conversion unit side of the control electrode 2211.

The operation of the VOFD is performed by the changing of the relationship of the potential of the N-type semiconductor region 2201 and P-type semiconductor region 2202 by bias applied externally. Electrons in the N-type semiconductor region 2204 are drained to the N-type semiconductor region 2201. At this time, it is preferable that electrons held at the first signal holding unit MEM1 are not drained. That is to say, it is preferable for the transfer of electrons between the N-type semiconductor region 2201 and the N-type semiconductor region 2204 to be performed less readily than the transfer of electrons between the N-type semiconductor region 2201 and the N-type semiconductor region 2207. As a specific implementation method, a potential barrier may be provisioned between the N-type semiconductor region 2201 and the N-type semiconductor region 2207. Further, the distance between the N-type semiconductor region 2201 and the N-type semiconductor region 2207 may be longer than the distance between the N-type semiconductor region 2201 and the N-type semiconductor region 2204.

Fourth Example

FIG. 23 is a cross-sectional diagram illustrating the imaging apparatus of the present example. The difference between the present example and the configurations explained until this point is the height of the potential barrier between the photoelectric conversion unit PD and the first signal holding unit MEM1. In other words, the configuration of the first charge transfer unit TX1 is different.

The configuration enables electrons to be transferred from the photoelectric conversion unit PD to the first signal holding unit MEM1 when the first charge transfer unit TX1, which is disposed in the electrical pathway between the photoelectric conversion unit PD and the first signal holding unit MEM1, is in a non-electroconductive state. Here, the non-electroconductive state is a state in which the generated potential barrier is supplied with the highest pulse value from among the pulse values to be supplied to the first charge transfer unit TX1. Thus, it does not have to be so-called completely off, and so includes a state in which some sort of potential barrier has occurred as compared to a case where it is completely on.

As a specific configuration example, this may be implemented if a MOS transistor is used as the first charge transfer unit TX1, and this MOS transistor has an embedded channel. More generally, the configuration has a portion that is in a region deeper than the surface, and has an electron potential barrier lower than the surface when the first charge transfer unit TX1 is in a non-electroconductive state. In this case, the control pulse supplied to the first charge transfer unit TX1 may be a fixed value. In other words, instead of a configuration that switches between an electroconductive state and a non-electroconductive state, a configuration with a fixed potential barrier may be used. When light is illuminated on the photoelectric conversion unit PD in such a configuration, the greater part of the charge for generating signals for focal point detection, generated by the photoelectric conversion, is transferred to the first signal holding unit MEM1 during the exposure period. Thus, the accumulation period for all pixels on the imaging face may be aligned together.

Further, when the first charge transfer unit TX1 is in a non-electroconductive state, a hole accumulates on the face. Next, as electrons to be transferred are in the channel, whose predetermined depth is deeper than that of the surface, the influence of dark current may be reduced as compared to when electrons are transferred on an insulating layer interface.

Regarding FIG. 23A, photoelectric conversion units PD_A and PD_B, the first signal holding units MEM_A and MEM_B, and the FD region are configured by the disposing of multiple N-type semiconductor regions on the P-type semiconductor region 2301. A P-type semiconductor region 2301 may use a P-type semiconductor substrate, or may use a P-type semiconductor region formed by ion implantation in an N-type semiconductor substrate. Only the first photoelectric conversion unit PD_A and related circuit parts are illustrated in FIG. 23A.

The photoelectric conversion unit PD includes the P-type semiconductor region 2301, an N-type semiconductor region 2302 disposed to configure a PN junction with the P-type semiconductor region 2301, and a P-type semiconductor region 2303 that is disposed on the N-type semiconductor region 2302. This is a so-called embedded type of photodiode.

The first charge transfer unit TX1 includes a first control electrode 2312 and a first channel disposed in the lower portion of the first control electrode 2312 via an insulating layer. Here, the first channel is configured from an N-type semiconductor region 2304.

The first signal holding unit MEM includes the first control electrode 2312, and an N-type semiconductor region 2305 disposed in the lower portion of the first control electrode 2312 via an insulating layer.

The second charge transfer unit TX2 includes a control electrode 2313 and a second channel 2306 disposed in the lower portion of the second electrode 2313 via an insulating layer. Here, the second channel 2306 is configured as a portion of the P-type semiconductor region 2301. Further, the height of the electron potential barrier of the second channel 2306 is adjusted by implanting impurity ions in the P-type semiconductor region 2301.

The FD region includes an N-type semiconductor region 2307. The N-type semiconductor region 2307 is electrically connected to the gate of the amplification transistor via a plug 2308.

The OFD control unit TX3 includes a third control electrode 2314 and a third channel 2309 disposed in the lower portion of the third control electrode 2314 via an insulating layer. Here, the third channel 2309 is configured as a portion of the P-type semiconductor region 2301. Further, the height of the electron potential barrier of the third channel 2309 is adjusted by implanting impurity ions in the P-type semiconductor region 2301.

The OFD region includes an N-type semiconductor region 2310. The N-type semiconductor region 2310 is electrically connected to a power supply line via a plug 2311.

A light-shielding member 2315 is disposed on the first signal holding unit MEM. It is more desirable for the first control electrode 2312 to be included in the orthogonal projection toward the first control electrode 2312 of the light-shielding member 2315. Further, it is preferable if the light-shielding member 2315 is disposed so that it extends onto the first control electrode 2312 until the side wall of the photoelectric conversion unit MEM side of the first control electrode 2312. Further, the light-shielding member 2315 may extend to other members, or may extend onto the second charge transfer unit TX2 and the third control electrode 2314.

FIG. 23B is a diagram illustrating the potential state when non-electroconducting control pulses are supplied to the first control electrode through the third control electrode. That is to say, this is the state when the control pulse with the highest electron potential from among the control pulses supplied to the first control electrode through the third control electrode is supplied. Such a potential state is, for example, a period when, after signals from all pixels for the nth frame are transferred to the first signal holding unit MEM simultaneously, electrons from the nth+1 frame are accumulated in the photoelectric conversion unit PD during a period until the second charge transfer unit TX2 is scanned per row.

As can be seen from FIG. 23B, the height of the potential barrier generated by the first charge transfer unit TX1 is low. As for relative relationships, for example, this potential barrier is even lower than the potential barrier generated by the OFD control unit TX3.

The driving pulses mainly illustrated in FIGS. 14, 20, 21A, and 21B may be used for this kind of pixel driving, depending on the pixel circuit. However, the difference between these driving pulses is that the OFD control unit TX3 for all pixels on the imaging face has to be in an electroconductive state during the period when signals are held at the first signal holding unit MEM1. This is preferable as such an operation enables the suppression of electrons in the first signal holding unit MEM1 from becoming contaminated.

Fifth Example

Figure 24:
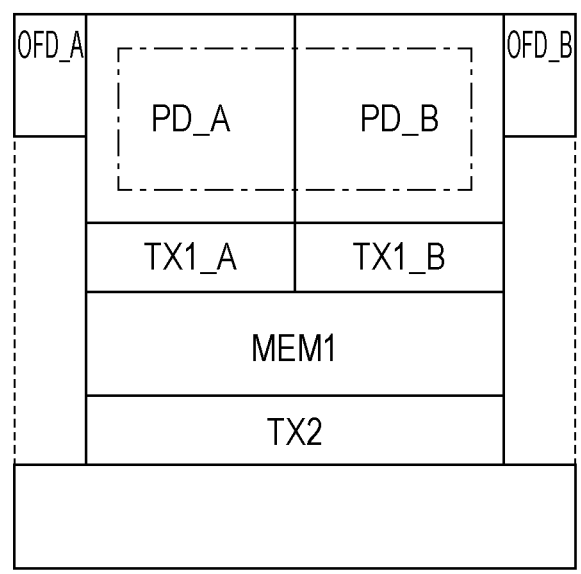
FIG. 24 is a top view of the imaging region of the imaging apparatus in a fifth Example of the second Embodiment.
Figure 25:
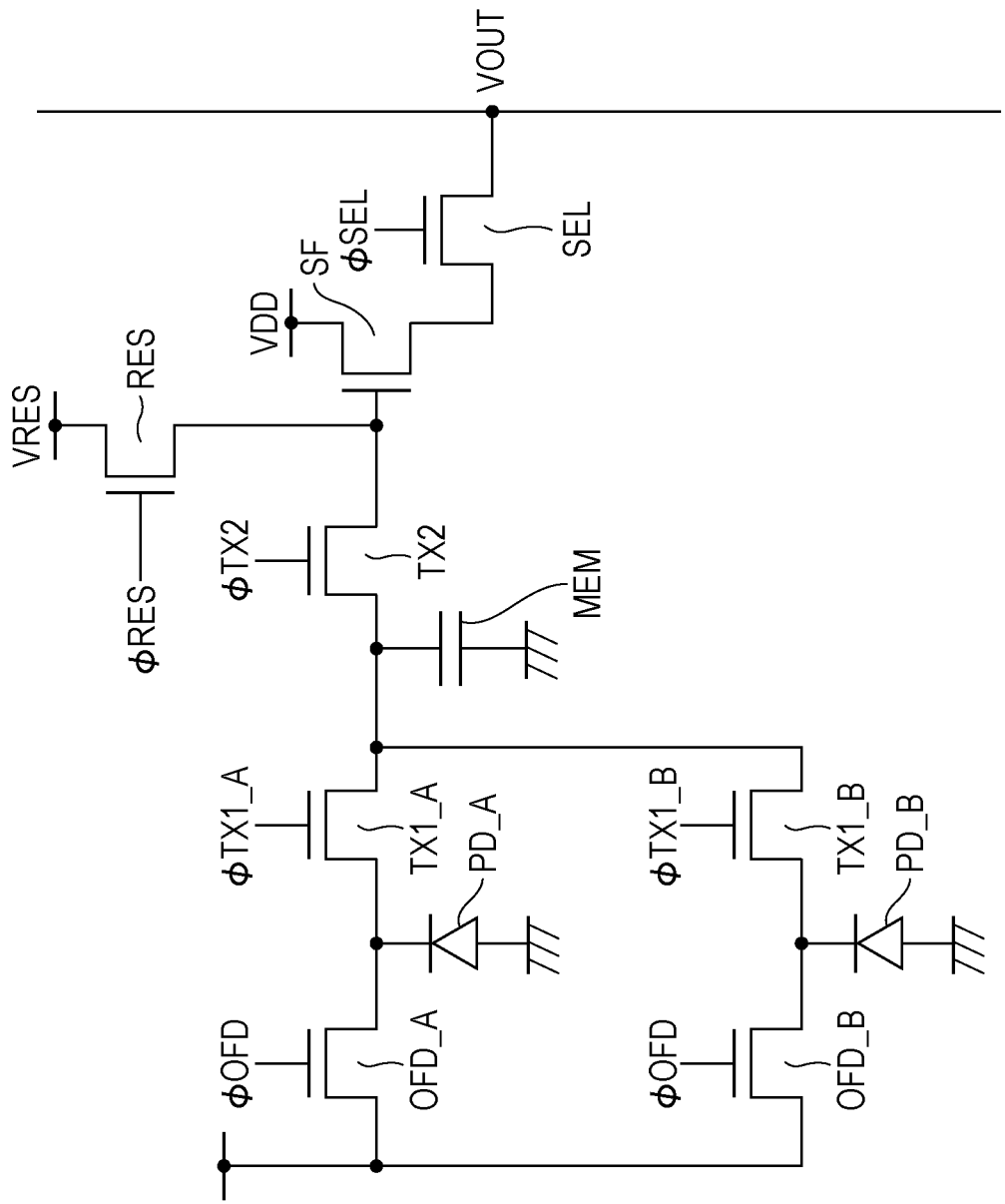
FIG. 25 is an equivalent circuit diagram illustrating the first pixel of the imaging region of the imaging apparatus in the fifth Example of the second Embodiment.

FIG. 24 is a top view of the first pixel of the imaging apparatus in the present example, and FIG. 25 is an equivalent circuit diagram illustrating the first pixel of the imaging apparatus in the present example. The difference between the present example and the examples described unit above is that the first signal holding unit MEM1 is shared between the first photoelectric conversion unit PD_A and the second photoelectric conversion unit PD_B of the same pixel. The portions that have the same functions as those in the previously described examples are denoted with the same reference numerals, and thus their descriptions are omitted here.

The basic operation will be described here. First, the equivalent circuit diagram includes a first charge transfer unit TX1_A to transfer signal charges for generating focal point detection signals at the first photoelectric conversion unit PD_A. Further, a first charge transfer unit TX1_B is included to transfer signal charges for generating focal point detection signals at the second photoelectric conversion unit PD_B. Also, the first charge transfer unit TX1_A and the first charge transfer unit TX1_B both receive an independent control pulse, and so this enables a configuration that may operate independently. In contrast, the OFD control unit OFD_A that drains electrons from the first photoelectric conversion unit PD_A and the OFD control unit OFD_B that drains electrons from the second photoelectric conversion unit PD_B may operate by a shared control pulse.

Such a configuration enables signals based on the signal charges for focal point detection generated at the first photoelectric conversion unit PD_A and the signals based on the signal charges for focal point detection generated at the second photoelectric conversion unit PD_B to be read out independently on the vertical signal lines.

Figure 26:
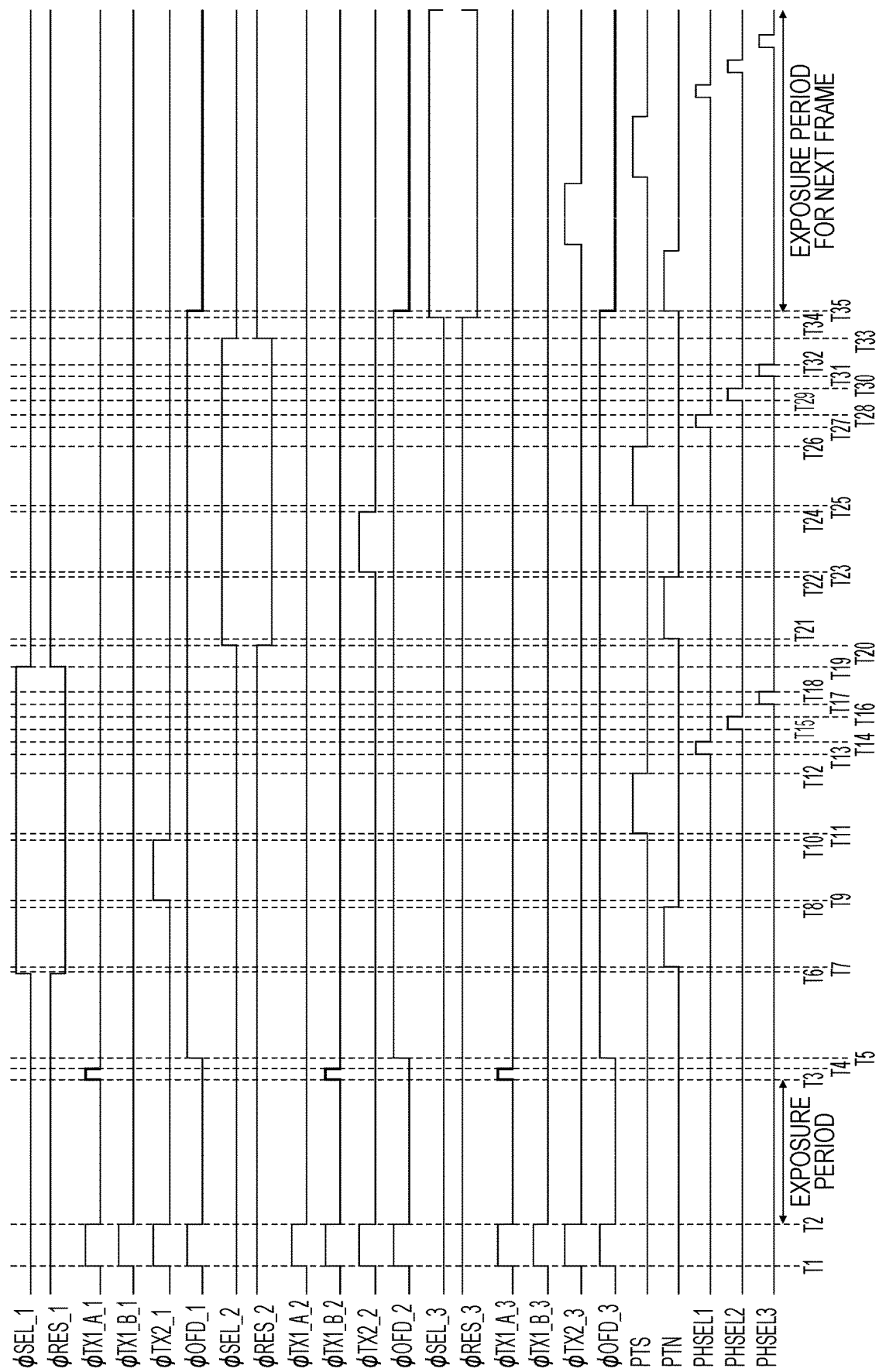
FIG. 26 is a diagram illustrating control pulses corresponding to the imaging region of the imaging apparatus in the fifth Example of the second Embodiment.

FIG. 26 is a diagram illustrating an example of driving pulses for the imaging apparatus in the present example. All driving pulses are at a high level and in an electroconductive state.

Until a timing T1, the φRES of all pixels on the imaging face are at a high level, and the reference voltage has been supplied to the gate of the amplification transistor. Other control pulses illustrated in FIG. 26 are at a low level.

At the timing T1, the φTX1_A, φTX1_B, φTX2, and φOFD of all pixels on the imaging face change from a low level to a high level. Next, at a timing T2, the φTX1_A, φTX1_B, φTX2, and φOFD of all pixels on the imaging face change from a high level to a low level. Such an operation enables the charges in the first photoelectric conversion unit PD_A, the second photoelectric conversion unit PD_B, and the first signal holding unit MEM to be drained to the reset transistor drain via the OFD region or the FD region. Also at the timing T2, the imaging exposure period of the nth frame begins. As illustrated in FIG. 26, the exposure period is the same for the entire imaging face.

At a timing T3, the φTX1_A of all pixels in the first row, the φTX1_B of all pixels in the second row, and the φTX1_A of all pixels in the third row change from a low level to a high level, and at a timing T4, these pulses change from a high level to a low level. Such an operation enables the signal charges for generating focal point detection signals in the first photoelectric conversion unit PD_A for the pixels in the first and third row to be transferred to the first signal holding unit MEM. Similarly, the signal charges for generating focal point detection signals in the second photoelectric conversion unit PD_B for the pixels in the second row are transferred to the first signal holding unit MEM.

At a timing T5, the φOFD of all pixels on the imaging face change from a low level to a high level, and electrons generated by light illuminated on the photoelectric conversion units PD_A and PD_B are drained to the OFD region.

Next, at a timing T6, a φSEL_1 changes from a low level to a high level, and at the same time, a φRES_1 changes from a high level to a low level. Such an operation enables pixel noise signals from the pixels in the first row to be output to the vertical signal line VOUT.

At a timing T7, a PTN changes from a low level to a high level, and at a timing T8, the PTN changes from a high level to a low level. Such an operation enables the noise signals from the first row of pixels to be held in the noise signal holding units in the column circuit.

At a timing T9, a φTX2_1 changes from a low level to a high level, and at a timing T10, the φTX2_1 change from a high level to a low level. Such an operation enables electrons from the multiple pixels in the first row to be transferred from the first signal holding unit MEM to the input node of the amplification transistor SF.

At a timing T11, the PTS changes from a low level to a high level, and at a timing T12, the PTS changes from a high level to a low level. Such an operation enables the optical signals for generating focal point detection signals generated at the first photoelectric conversion unit PD_A from the pixels in the first row to be held in the optical signal holding units in the column circuit.

Next, at timings T13 through T18, PHSEL_1 through PHSEL_3 are consecutively changed to an electroconductive state, which enables signals of each pixel row to be consecutively output to the horizontal output lines. This period is called the horizontal scanning period (horizontally enabled period).

At a timing T19, a φSEL1 of the pixels of the first row changes from a high level to a low level, and a φRES1 changes from a low level to a high level. Such an operation enables the pixels in the first row to change to a non-selectable state, and the FD and the gate potential of the amplification transistor SF are reset by the reset transistor.

At a timing T20, a φSEL1 changes from a high level to a low level, and the pixels in the first row change from a selectable state to a non-selectable state. In continuance, at timings T21 through T33, the signals from the pixels in the second row are read out. There is a difference here from the first row. Signals from the pixels based on the signal charges for generating focal point detection signals generated at the first photoelectric conversion unit PD_A in the first row are output to the vertical signal lines. In contrast, signals based on the signal charges for generating focal point detection signals generated at the second photoelectric conversion unit PD_B from the pixels in the second row are output.

Next, at timings from T34, the signals from the pixels in the third row are read out. Similarly to those of the first row, the signals based on the signal charges for generating focal point detection signals generated at the first photoelectric conversion unit PD_A from the pixels in the third row are output.

In other words, signals based on the signal charges for generating focal point detection signals generated at the first photoelectric conversion unit PD_A from odd-numbered rows are output. Signals based on the signal charges for generating focal point detection signals generated at the second photoelectric conversion unit PD_B from even-numbered rows are then output. Of course this may be changed to even-odd rows, or may be changed randomly per pixel row.

Such an operation enables signals based on the signal charges for generating focal point detection signals from the first photoelectric conversion unit PD_A and the second photoelectric conversion unit PD_B in the same exposure period to be obtained independently from adjacent pixels.

Regarding the present example, the exposure period of the next frame begins during the read out period of the pixels in the third row. At a timing T35, the φOFD of all pixels on the imaging face change from a high level to a low level. Such an operation enables the signal charges for generating focal point detection signals generated from light illuminated on the photoelectric conversion units PD_A and PD_B to be accumulated in the photoelectric conversion units PD_A and PD_B.

Also, if signals from the first photoelectric conversion unit PD_A and the second photoelectric conversion unit PD_B of the same pixel are added, during the period for timings T3 through T4, the φTX1_A and φTX2_B of all pixels on the imaging face may be changed to a high level simultaneously. Operation may be enabled with the imaging apparatus to switch between a mode that performs addition of the signals from the multiple photoelectric conversion units of the same pixel, and the driving pattern illustrated in FIG. 26.

Sixth Example

Figure 27:
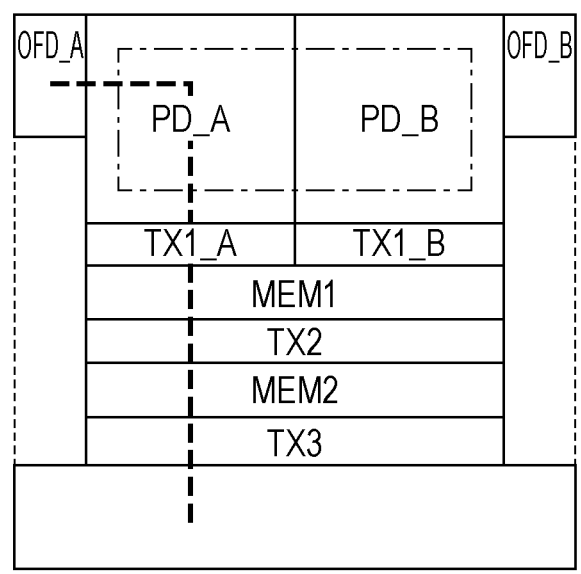
FIG. 27 is a top view of an imaging region of an imaging apparatus in a sixth Example of the second Embodiment.

FIG. 27 is a top view of the imaging apparatus in the present example, and FIG. 28 is an equivalent circuit diagram illustrating the first pixel of the imaging apparatus in the present example. The portions that have the same functions as those in the previously described examples are denoted with the same reference numerals, and thus their descriptions are omitted here.

The difference between the present example and the examples described up to this point is that each pixel includes multiple signal holding units, and the signals generated at each photoelectric conversion unit are transferred consecutively from the multiple signal holding units to the input node of the amplification transistor. This is specifically described in the circuit diagram in FIG. 28.

Each pixel includes a first charge transfer unit TX1_A to transfer electrons from the first photoelectric conversion unit PD_A and a first charge transfer unit TX1_B to transfer electrons from the second photoelectric conversion unit PD_B. Also, an output node_1 of both the first charge transfer unit TX1_A and TX1_B is electrically connected to an input node_2 of the first signal holding unit MEM1. The first signal holding unit MEM1 includes a node which also has a predetermined voltage applied. The predetermined voltage may be the ground voltage, for example.

The second charge transfer unit TX2 transfers signal charges for generating focal point detection signals held at the first signal holding unit MEM1 to a second signal holding unit MEM2. Here the output node of the second charge transfer unit TX2 is electrically connected to an input node_3 of the second signal holding unit MEM2.

A third charge transfer unit TX3 transfers signal charges for generating focal point detection signals held at the second signal holding unit MEM2 to the FD. Also, the FD is electrically connected to the gate of the amplification transistor SF. The selection transistor SEL is disposed electrically between the output node of the amplification transistor SF and the vertical signal line VOUT. Further, a predetermined voltage is supplied to the input node of the amplification transistor, and the reset transistor RES is disposed to performs resets.

FIG. 29A is a cross-sectional diagram illustrating the first pixel in the present example. The cross section from the first photoelectric conversion unit PD_A and the cross section from the second photoelectric conversion unit PD_B is the same, and so the following description uses the first photoelectric conversion unit PD_A as the example. FIG. 27 is a cross-sectional diagram illustrating the portions corresponding to the dotted line.

A P-type semiconductor region 2901 is disposed in an N-type semiconductor region 2900. An N-type semiconductor region 2902 is disposed to configure a PN junction with the P-type semiconductor region 2901. A P-type semiconductor region 2903 is disposed on the surface side of the N-type semiconductor region 2902. A so-called embedded type of photodiode is configured by the P-type semiconductor region 2901, the N-type semiconductor region 2902, and the P-type semiconductor region 2903.

The signal charges for generating focal point detection signals generated at the photoelectric conversion unit PD_A are transferred to a first channel 2904, and reach an N-type semiconductor region 2905 which configures the first signal holding unit MEM1. The signal charges for generating focal point detection signals held at the N-type semiconductor region 2905 are transferred to a second channel 2906, and reach an N-type semiconductor region 2907 which configures the second signal holding unit MEM2. The signal charges for generating focal point detection signals held at the N-type semiconductor region 2907 are transferred to a third channel 2908, and reach an N-type semiconductor region 2909 which configures the FD region. Also, the signal charges for generating focal point detection signals generated at the photoelectric conversion unit PD_A may be drained an N-type semiconductor region 2910 which configures the OFD region via a fourth transfer gate 2914.

A first control electrode 2911 is disposed with the first channel 2904 and in the upper portion of the N-type semiconductor region 2905 via an insulating layer. The first control electrode 2911 has dual functions as the first charge transfer unit TX1 and the first signal holding unit MEM1.

The first charge transfer unit TX1 is configured with the inclusion of a portion of a first control electrode 2911, which is disposed with a first channel 2904 and via an insulating layer on the first channel 2904.

The first signal holding unit MEM1 includes the N-type semiconductor region (the first semiconductor region) 2905, and the P-type semiconductor region (the second semiconductor region) 2901 which configures the PN junction with the N-type semiconductor region 2905. Further, the first signal holding unit MEM1 is configured with the inclusion of a portion of the first control electrode 2911 which is disposed on the N-type semiconductor region 2905 via an insulating layer.

A second control electrode 2912 is disposed above the second channel 2906 and the N-type semiconductor region 2907 via an insulating layer. The second control electrode 2912 has dual functions as the second charge transfer unit TX2 and the second signal holding unit MEM2.

The second charge transfer unit TX2 is configured with the inclusion of a portion of the second control electrode 2912 which is disposed with the second channel 2906 and on the second channel 2906 via an insulating layer.

The second signal holding unit MEM2 includes the N-type semiconductor region 2907, and the P-type semiconductor region 2901 which configures the PN junction with the N-type semiconductor region 2907. Further, the second signal holding unit MEM2 is configured with the inclusion of a portion of the second control electrode 2912 which is disposed on the N-type semiconductor region 2907 via an insulating layer.

A third control electrode 2913 is disposed on the third channel 2908 via an insulating layer. This is configured with the inclusion of the third charge transfer unit TX3, the third channel 2908, and the third control electrode 2913.

FIG. 29B is a diagram illustrating the potential of the cross section corresponding to FIG. 29A. Each control electrode is in a non-electroconductive state, a pulse is supplied. That is to say, the electron potential barrier is in a high state.

Such a potential state exists during the period when signals are held in the photoelectric conversion unit PD, the first signal holding unit MEM1, and the second signal holding unit MEM2. The amount of signal charges that may be held in the first signal holding unit MEM1 is determined by the height of the potential generated by the first charge transfer unit TX1 and the height of the potential generated by the second charge transfer unit TX2. Here, the height of the potential generated by the first charge transfer unit TX1 and the height of the potential generated by the second charge transfer unit TX2 is nearly the same. Such a state may be implemented by equalizing the concentration of impurities in the first channel 2904 and the concentration of impurities in the second channel 2906, and by equalizing the amplitude of control pulses supplied to the first control electrode 2911 and the second control electrode 2912.

FIGS. 30A and 30B are diagrams illustrating an example of the control pulses for the imaging region of the imaging apparatus in the present example. All control pulses are at a high level and in an electroconductive state. FIGS. 30A and 30B combine to form one diagram of the driving pulses where timings T1 through T38 are illustrated in FIG. 30A and timings from T39 are illustrated in FIG. 30B. Further, the pulse PTS is a control pulse used to hold signals in the photoelectric conversion unit disposed in the column circuit. The pulse PTN is a control pulse used to hold signals in the noise signal holding unit disposed in the column circuit. The pulse PHSEL is a control pulse output from the horizontal scanning circuit, and controls the read out of each row of signals held in the column circuit to the horizontal signal lines. The driving pulses in FIGS. 30A and 30B may be used in a still image mode.

Until a timing T1, the φRES of all pixels on the imaging face are at a high level, and the reference voltage has been supplied to the gate of the amplification transistor. Other control pulses illustrated in FIG. 30A are at a low level.

At the timing T1, the φTX1_A, φTX1_B, φTX2, φTX3, and φOFD of all pixels on the imaging face change from a low level to a high level. Next, at a timing T2, the φTX1_A, φTX1_B, φTX2, φTX3, and φOFD of all pixels on the imaging face change from a high level to a low level. Such an operation enables the charges in the first photoelectric conversion unit PD_A, the second photoelectric conversion unit PD_B, and the first signal holding unit MEM1 to be drained to the reset transistor drain via the OFD region or the FD region. Also at the timing T2, the imaging exposure period of the nth frame begins. As illustrated in FIG. 30A, the exposure period is the same for the entire imaging face.

At a timing T3, the φTX1_A of all pixels in the first row on the imaging face change from a low level to a high level, and at a timing T4, the φTX1_A of all pixels in the first row on the imaging face change from a high level to a low level. Such an operation enables the signal charges for generating focal point detection signals in the first photoelectric conversion unit PD_A for all pixels on the imaging face to be transferred to the first signal holding unit MEM1.

At a timing T5, the φTX2 of all pixels on the imaging face change from a low level to a high level, and at a timing T6, the φTX2 of all pixels on the imaging face change from a high level to a low level. Such an operation enables the signal charges for generating focal point detection signals held in the first signal holding unit MEM1 to be transferred to the second signal holding unit MEM2 via the second charge transfer unit TX2.

At a timing T7, the φTX1_B for all pixels on the imaging face changes from a low level to a high level, and at a timing T8, the φTX1_B for all pixels on the imaging face changes from a high level to a low level. Such an operation enables the signal charges for generating focal point detection signals in the second photoelectric conversion unit PD_B for all pixels on the imaging face to be transferred to the first signal holding unit MEM1.

At a timing T9, the φOFD of all pixels on the imaging face change from a low level to a high level, and the electrons generated from light illuminated on the photoelectric conversion units PD_A and PD_B are drained to the OFD region.

At a timing T10, a φSEL_1 changes from a low level to a high level, and at the same time, a φRES_1 changes from a high level to a low level. Such an operation enables the noise signals of pixels in the first row to be output to the vertical signal line VOUT.

At a timing T11, the PTN changes from a low level to a high level, and at a timing T12, the PTN changes from a high level to a low level. Such an operation enables the noise signals from the pixels in the first row to be held in the noise signal holding unit in the column circuit.

Next, at a timing T13, a φTX3 changes from a low level to a high level, and at a timing T14, the φTX3 changes from a high level to a low level. Such an operation enables signal charges for generating focal point detection signals for all pixels in the first row to be transferred from the second signal holding unit MEM2 to the input node of the amplification transistor SF.

At a timing T15, a PTS changes from a low level to a high level, and at a timing T16, the PTS changes from a high level to a low level. Such an operation enables optical signals based on the signal charges for generating focal point detection signals generated at the first photoelectric conversion unit PD_A of pixels in the first row to be held in the optical signal holding unit in the column circuit.

At timings T17 through T22, PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals based on the signal charges for generating focal point detection signals generated at the first photoelectric conversion unit PD_A of pixels in the first row to be read out to a device external to the imaging apparatus.

At a timing T23, a φSEL1 changes from a high level to a low level, and a φRES1 changes from a low level to a high level. Also, a φTX2_1 changes from a low level to a high level. In continuance, at a timing T24, the φSEL1 changes from a low level to a high level, and the φRES1 changes from high level to a low level. Also, the φTX2_1 changes from a high level to a low level. Such an operation enables the signals based on the signal charges for generating focal point detection signals generated by the second photoelectric conversion unit PD_B of the pixels in the first row to be held in the second signal holding unit MEM2.

At a timing T25, the PTN changes from a low level to a high level, and at a timing T26, the PTN changes from a high level to a low level. Such an operation enables the noise signals from the pixels in the first row to be held in the noise signal holding units in the column circuit.

At a timing T27, a φTX3 changes from a low level to a high level, and at a timing T28, the φTX3 changes from a high level to a low level. Such an operation enables the signal charges for generating focal point detection signals from the multiple pixels in the first row to be transferred from the second signal holding unit MEM2 to the input node of the amplification transistor SF.

At a timing T29, the PTS changes from a low level to a high level, and at a timing T30, the PTS changes from a high level to a low level. Such an operation enables the optical signals based on the signal charges for generating focal point detection signals generated by the second photoelectric conversion unit PD_B of the pixels in the first row to be held in the optical signal holding unit in the circuit row.

At timings T31 through T36, PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals based on the signal charges for generating focal point detection signals generated at the second photoelectric conversion unit PD_B of pixels in the first row to be read out to a device external to the imaging apparatus.

At a timing T37, the φSEL1 changes from a high level to a low level. The pixels in the first row change from a selectable state to a non-selectable state. In continuance, at timings T38 through T64, the signals from the pixels in the second row are read out.

Next, at timings from T65, the signals from the pixels in the third row are read out. Similarly to those of the first row, the signals based on the signal charges for generating focal point detection signals generated at the first photoelectric conversion unit PD_A from the pixels in the third row are output.

Regarding the present example, the exposure period of the next frame begins during the read out period of the pixels in the third row. At a timing T66, the φOFD of all pixels on the imaging face change from a high level to a low level. Such an operation enables the signal charges for generating focal point detection signals generated from light illuminated on the photoelectric conversion units PD_A and PD_B to be accumulated in the photoelectric conversion units PD_A and PD_B.

Seventh Example

Figure 31:
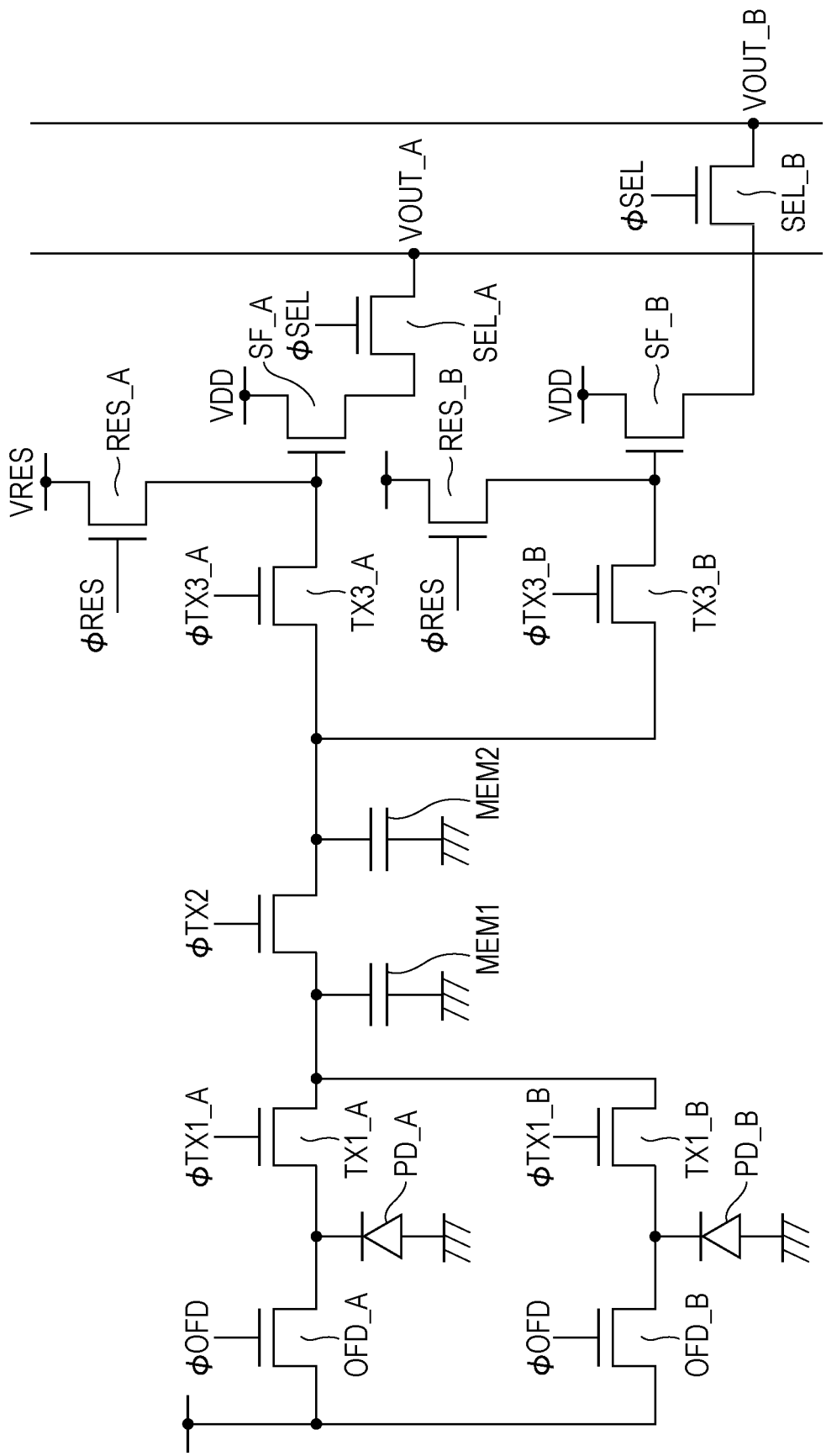
FIG. 31 is an equivalent circuit diagram illustrating the first pixel of the imaging apparatus in a seventh Example of the second Embodiment.

FIG. 31 illustrates an equivalent circuit diagram of the present example. The difference between the present example and the examples previously described is that the circuit configuration downstream of the second signal holding unit MEM2 includes multiple circuit blocks in parallel, and each of these includes multiple vertical signal lines corresponding to each circuit block. The portions that have the same functions as those in the previously described examples are denoted with the same reference numerals, and thus their descriptions are omitted here.

The present example includes multiple third charge transfer units downstream of the second signal holding unit MEM2. Also, the amplification transistor, the reset transistor, and the selection transistor are disposed in each of the third charge transfer units. The configuration enables control pulses to be supplied independently to enable independent operation of third charge transfer units TX3_A and TX3_B. As previously described, by provisioning multiple vertical signal lines for example, operation may be controlled with a shared control pulse to circuit elements which have the same function as that of the circuits downstream of the third charge transfer units TX3_A and TX3_B. According to the present example, the speed of read out of signals may be further improved as compared with the sixth Example or other examples.

Figure 32:
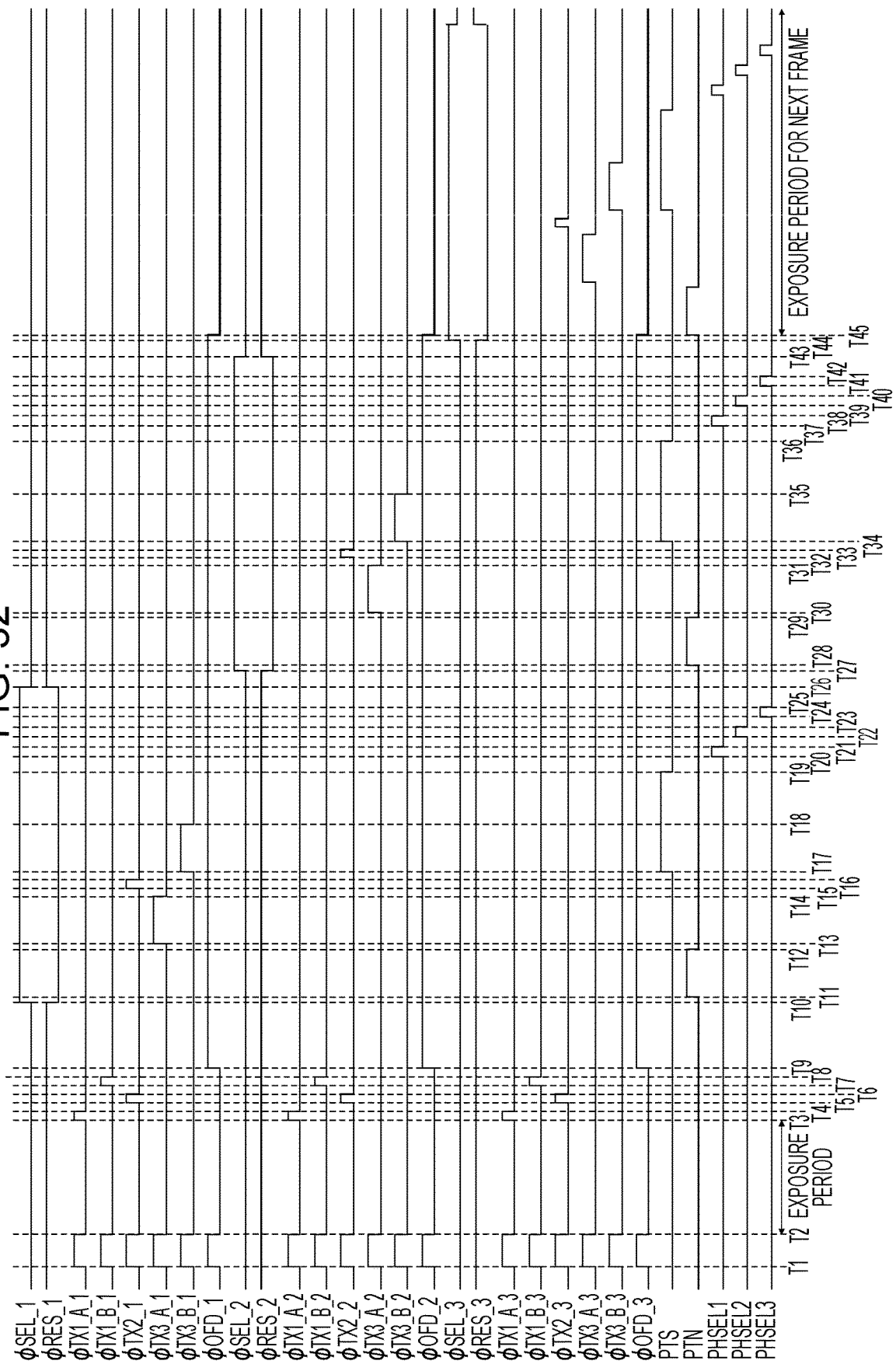
FIG. 32 is a diagram illustrating control pulses corresponding to the imaging region of the imaging apparatus in the seventh Example of the second Embodiment.

FIG. 32 is a diagram illustrating an example of the control pulses in the present example. All control pulses are at a high level and in an electroconductive state. Further, the pulse PTS is a control pulse used to hold signals in the photoelectric conversion unit disposed in the column circuit. The pulse PTN is a control pulse used to hold signals in the noise signal holding unit disposed in the column circuit. The pulse PHSEL is a control pulse output from the horizontal scanning circuit, and controls the read out of each row of signals held in the column circuit to the horizontal signal lines. The driving pulses in FIG. 32 may, for example, be used in a focal point detecting mode.

Until a timing T1, the φRES of all pixels on the imaging face are at a high level, and the reference voltage has been supplied to the gate of the amplification transistor. Other control pulses illustrated in FIG. 32 are at a low level.

At the timing T1, the φTX1_A, φTX1_B, φTX2, φTX3_A, φTX3_B, and φOFD of all pixels on the imaging face change from a low level to a high level. Next, at a timing T2, the φTX1_A, φTX1_B, φTX2, φTX3_A, φTX3_B, and φOFD of all pixels on the imaging face change from a high level to a low level. Such an operation enables the charges in the first photoelectric conversion unit PD_A, the second photoelectric conversion unit PD_B, the first signal holding unit MEM1, and the second signal holding unit MEM2 to be drained to the reset transistor drain via the OFD region or the FD region. Also at the timing T2, the imaging exposure period of the nth frame begins. As illustrated in FIG. 32, the exposure period is the same for the entire imaging face.

At a timing T3, the φTX1_A of all pixels in the first row on the imaging face change from a low level to a high level, and at a timing T4, the φTX1_A of all pixels in the first row on the imaging face change from a high level to a low level. Such an operation enables the signal charges for generating focal point detection signals in the first photoelectric conversion unit PD_A for all pixels on the imaging face to be transferred to the first signal holding unit MEM1.

At a timing T5, the φTX2 of all pixels on the imaging face change from a low level to a high level, and at a timing T6, the φTX2 of all pixels on the imaging face change from a high level to a low level. Such an operation enables the signal charges for generating focal point detection signals held in the first signal holding unit MEM1 to be transferred to the second signal holding unit MEM2 via the second charge transfer unit TX2.

At a timing T7, the φTX1_B for all pixels on the imaging face changes from a low level to a high level, and at a timing T8, the φTX1_B for all pixels on the imaging face changes from a high level to a low level. Such an operation enables the signal charges for generating focal point detection signals in the second photoelectric conversion unit PD_B for all pixels on the imaging face to be transferred to the first signal holding MEM1.

At a timing T9, the φOFD of all pixels on the imaging face change from a low level to a high level, and the charges generated from light illuminated on the photoelectric conversion units PD_A and PD_B are drained to the OFD region.

At a timing T10, a φSEL_1 changes from a low level to a high level, and at the same time, a φRES_1 changes from a high level to a low level. Such an operation enables a state in which the noise signals of pixels in the first row to be output to the vertical signal lines VOUT_A and VOUT_B.

At a timing T11, the PTN changes from a low level to a high level, and at a timing T12, the PTN changes from a high level to a low level. Such an operation enables the noise signals from the pixels in the first row to be held in the noise signal holding unit in the column circuit.

At a timing T13, a φTX3 changes from a low level to a high level, and at a timing T14, the φTX3 changes from a high level to a low level. Such an operation enables signal charges for generating focal point detection signals for multiple pixels in the first row to be transferred from the second signal holding unit MEM2 to the input node of the amplification transistor SF.

At a timing T15, the φTX2 of all pixels on the imaging face changes from a low level to a high level, and at a timing T16, the φTX2 of all pixels on the imaging face changes from a high level to a low level. Such an operation enables the signal charges for generating focal point detection signals generated at the second photoelectric conversion unit PD_B to be transferred from the first signal holding unit MEM1 to the second signal holding unit MEM2.

At a timing T17, the PTS changes from a low level to a high level. Further, a φTX3_B of all pixels on the imaging face change from a low level to a high level. Such an operation enables the signal charges for generating focal point detection signals generated at the second photoelectric conversion unit PD_B to be transferred from the second signal holding unit MEM2 to the input node of the amplification transistor.

At a timing T18, the φTX3_B for all pixels on the imaging face change from a high level to a low level.

At a timing T19, the PTS changes from a high level to a low level. During the period for timings T17 through T19, the optical signals based on signal charges for generating focal point detection signals generated at the first photoelectric conversion unit PD_A and the second photoelectric conversion unit PD_B of pixels in the first row are held in the photoelectric conversion unit in the column circuit.

At timings T20 through T25, PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals based on the signal charges for generating focal point detection signals generated at the first photoelectric conversion unit PD_A and the second photoelectric conversion unit PD_B of pixels in the first row to be read out to a device external to the imaging apparatus.

At a timing T26, a φSEL1 changes from a high level to a low level, and a φRES1 changes from a low level to a high level. The pixels in the first row change from a selectable state to a non-selectable state. In continuance, during the period for timings T27 through T44, the signals for pixels in the second row are read out. Also, at timings from T45, the signals for pixels in the third row are read out.

Regarding the present example, the exposure period of the next frame begins during the read out period of the pixels in the third row. At a timing T45, the φOFD of all pixels on the imaging face change from a high level to a low level. Such an operation enables the electrons generated from light illuminated on the photoelectric conversion units PD_A and PD_B to be accumulated in the photoelectric conversion units PD_A and PD_B.

Eighth Example

Figure 33:
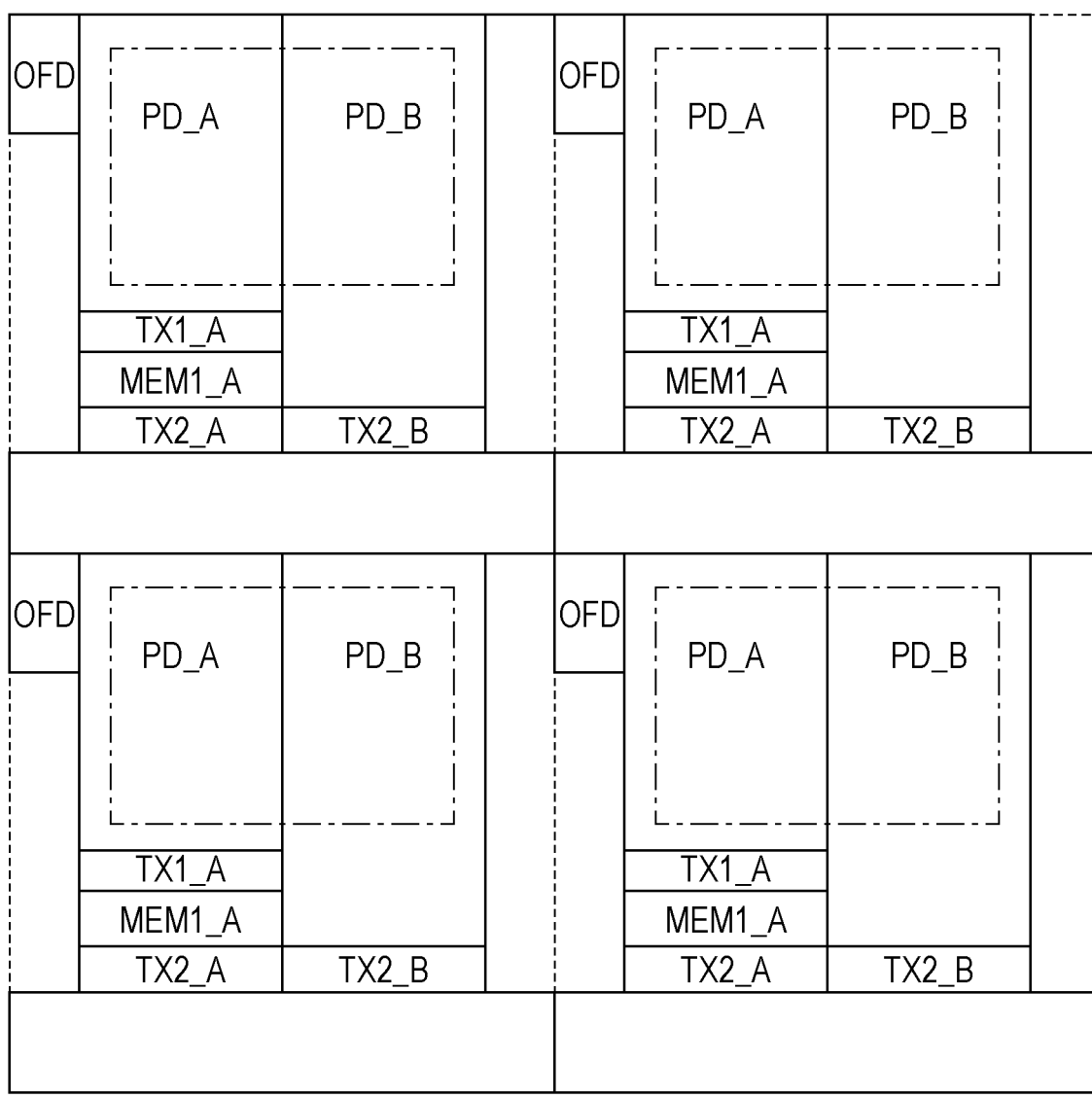
FIG. 33 is a top view of the imaging region of the imaging apparatus in an eighth Example of the second Embodiment.
Figure 34:
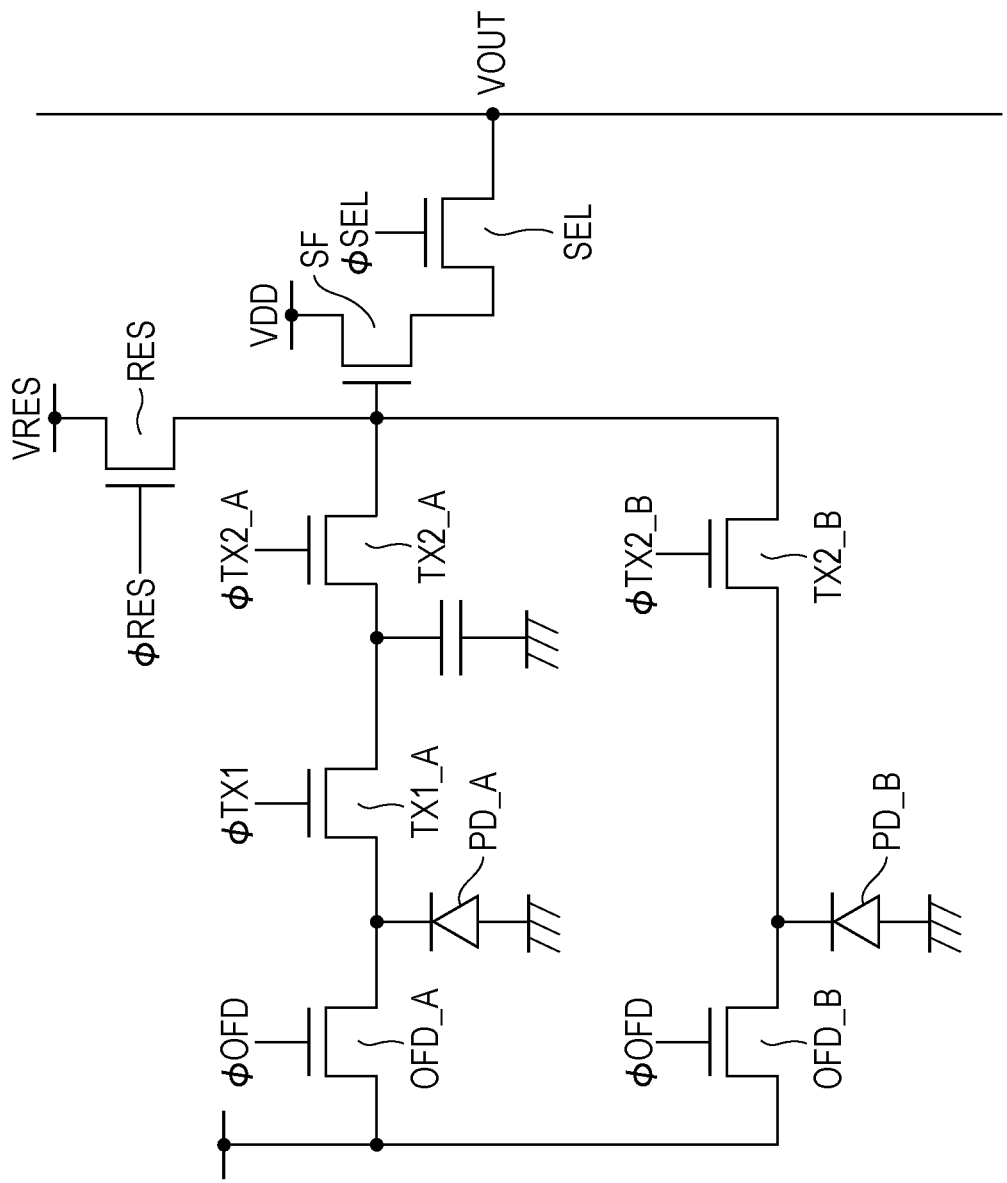
FIG. 34 is an equivalent circuit diagram illustrating the first pixel of the imaging apparatus in the eighth Example of the second Embodiment.

FIG. 33 is a top view of the imaging apparatus in the present example. Also, FIG. 34 is a diagram illustrating an equivalent circuit diagram of the first pixel of the imaging device in the present example. The difference between the present example and the examples previously described is a circuit element that is disposed from the first photoelectric conversion unit PD_A to the input node of the amplification transistor, and a circuit element that is disposed from the second photoelectric conversion unit PD_B to the input node of the amplification transistor. The first photoelectric conversion unit PD_A and the second photoelectric conversion unit PD_B does not have to have the same signal processing, and may be desirable to have different processing depending on the situation. This would apply, for example, if the sensitivity of the first photoelectric conversion unit PD_A and the second photoelectric conversion unit PD_B are different. Also, if the sensitivity of the first photoelectric conversion unit PD_A and the second photoelectric conversion unit PD_B are not different, there are cases where different circuits are desirable due to restrictions on the driving sequence or the like.

With reference to FIG. 34, the configuration related to the first photoelectric conversion unit PD_A has the first signal holding unit MEM1 disposed electrically between the output node of the first photoelectric conversion unit PD_A and the input node of the amplification transistor SF. In contrast, as an independent configuration that does not have a signal holding unit provisioned, only the second charge transfer unit TX2_B is disposed electrically between the output node of the second photoelectric conversion unit PD_B and the input node of the amplification transistor SF.

Figure 35:
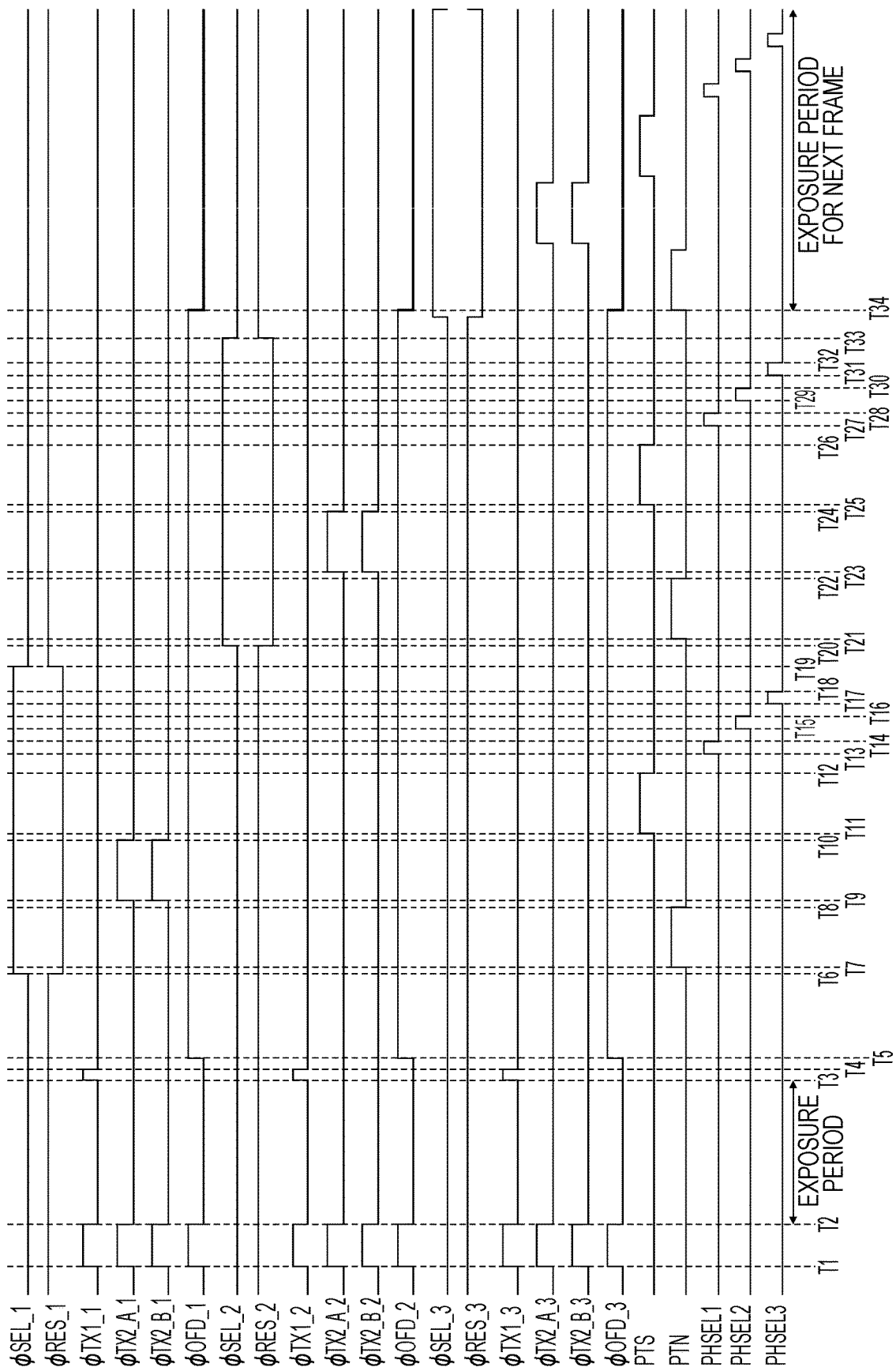
FIG. 35 is a diagram illustrating control pulses corresponding to the imaging region of the imaging apparatus in the eighth Example of the second Embodiment.
Figure 36:
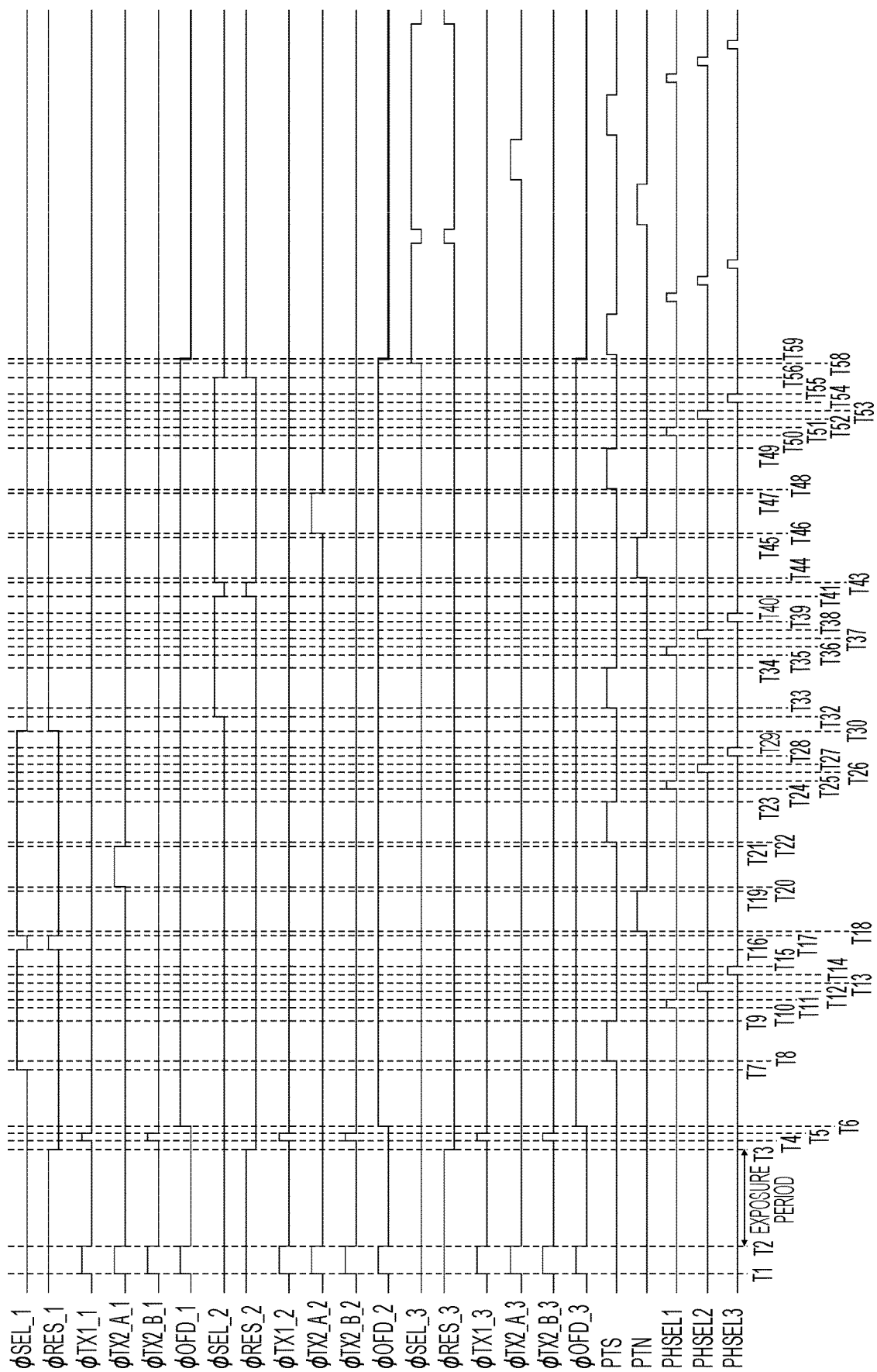
FIG. 36 is a diagram illustrating control pulses corresponding to the imaging region of the imaging apparatus in the eighth Example of the second Embodiment.

FIGS. 35 and 36 are diagrams illustrating specific driving pulses for the imaging apparatus illustrated in FIG. 34. The mode illustrated in FIG. 35 is preferably used in a still image photography or similar mode. The mode illustrated in FIG. 36 is preferably used as a mode for focal point detection signals. Either set of control pulses are at a high level and in an electroconductive state. Further, the pulse PTS is a control pulse used to hold signals in the optical signal holding unit disposed in the column circuit. The pulse PTN is a control pulsed used to hold signals in the noise signal holding unit disposed in the column circuit. The pulse PHSEL is a control pulse output from the horizontal scanning circuit, and controls the read out of each row of signals held in the column circuit to the horizontal signal lines.

First, FIG. 35 will be described. Until a timing T1, the φRES of all pixels on the imaging face are at a high level, and the reference voltage has been supplied to the gate of the amplification transistor. Other control pulses illustrated in FIG. 35 are at a low level.

At the timing T1, the φTX1, φTX2_A, φTX2_B, and φOFD of all pixels on the imaging face change from a low level to a high level. Next, at a timing T2, the φTX1, φTX2_A, φTX2_B, and φOFD of all pixels on the imaging face change from a high level to a low level. Such an operation enables the charges in the first photoelectric conversion unit PD_A, the second photoelectric conversion unit PD_B, and the first signal holding unit MEM1 to be drained to the reset transistor drain via the OFD region or the FD region. Also at the timing T2, the imaging exposure period of the nth frame begins. As illustrated in FIG. 35, the exposure period is the same for the entire imaging face.

At a timing T3, the φTX1 of all pixels in the first row on the imaging face change from a low level to a high level, and at a timing T4, the φTX1_A of all pixels in the first row on the imaging face change from a high level to a low level. Such an operation enables the signal charges for generating focal point detection signals in the first photoelectric conversion unit PD_A for all pixels on the imaging face to be transferred to the first signal holding MEM1.

At a timing T5, the φOFD of all pixels on the imaging face change from a low level to a high level, and the signal charges for generating focal point detection signals generated by light illuminated on the photoelectric conversion units PD_A and PD_B are drained to the OFD region.

At a timing T6, the φSEL_1 changes from a low level to a high level, and at the same time, the φRES_1 changes from a high level to a low level. Such an operation enables a state in which the noise signals of pixels in the first row may be output to the vertical signal lines VOUT_A and VOUT_B.

At a timing T7, the PTN changes from a low level to a high level, and at a timing T8, the PTN changes from a high level to a low level. Such an operation enables the noise signals from the pixels in the first row to be held in the noise signal holding unit in the column circuit.

At a timing T9, the φTX2_A and φTX2_B of all pixels on the imaging face change from a low level to a high level, and at a timing T10, the φTX2_A and φTX2_B change from a high level to a low level. Such an operation enables signal charges for generating focal point detection signals generated by the first photoelectric conversion unit PD_A and the signal charges for generating focal point detection signals generated by the second photoelectric conversion unit PD_B, both of which are in multiple pixels in the first row, to be added at the gate of the amplification transistor SF. In other words, the signal charges for generating focal point detection signals generated by the first photoelectric conversion unit PD_A held at the first signal holding unit MEM1 and the signal charges for generating focal point detection signals generated by the second photoelectric conversion unit PD_B are added at the gate of the amplification transistor SF.

At a timing T11, the PTS changes from a low level to a high level, and at a timing T12, the PTS changes from a high level to a low level. Such an operation enables the optical signals obtained by adding the signal charges for generating focal point detection signals generated at the first photoelectric conversion unit PD_A and the second photoelectric conversion unit PD_B, both of which are in the pixels in the first row, to be held in the optical signal holding unit in the column circuit.

At timings T13 through T18, the PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals obtained by adding the signal charges for generating focal point detection signals generated at the first photoelectric conversion unit PD_A and the second photoelectric conversion unit PD_B, both of which are in pixels in the first row, to be read out to a device external to the imaging apparatus.

At a timing T19, the φSEL1 changes from a high level to a low level, and the φRES1 changes from a low level to a high level. The pixels in the first row change from a selectable state to a non-selectable state. In continuance, during the period for timings T20 through T33, the signals of pixels in the second row are read out. Also, at timings from T34, the signals of pixels in the third row are read out.

Regarding the present example, the exposure period of the next frame begins during the read out period of the pixels in the third row. At a timing T34, the φOFD of all pixels on the imaging face change from a high level to a low level. Such an operation enables the signals charges for generating focal point detection signals generated from light illuminated on the photoelectric conversion units PD_A and PD_B to be accumulated in the photoelectric conversion units PD_A and PD_B.

Next, FIG. 36 will be described. Until a timing T1, the φRES of all pixels on the imaging face are at a high level, and the reference voltage has been supplied to the gate of the amplification transistor. Other control pulses illustrated in FIG. 36 are at a low level.

At the timing T1, the φTX1, φTX2_A, φTX2_B, and φOFD of all pixels on the imaging face change from a low level to a high level. Next, at a timing T2, the φTX1, φTX2_A, φTX2_B, and φOFD of all pixels on the imaging face change from a high level to a low level. Such an operation enables the charges in the first photoelectric conversion unit PD_A, the second photoelectric conversion unit PD_B, and the first signal holding unit MEM1 to be drained to the reset transistor drain via the OFD region or the FD region. Also at the timing T2, the imaging exposure period of the nth frame begins. As illustrated in FIG. 36, the exposure period is the same for the entire imaging face.

At a timing T3, the φRES of all pixels on the imaging face change from a high level to a low level.

At a timing T4, the φTX1 and φTX2_B of all pixels on the imaging face change from a low level to a high level, and at a timing T5, the φTX1 and φTX2_B of all pixels on the imaging face change from a high level to a low level. Such an operation enables signal charges for generating focal point detection signals of the first photoelectric conversion unit PD_A in all pixels on the imaging face to be transferred to the first signal holding unit MEM1. Further, signal charges for generating focal point detection signals of the second photoelectric conversion unit PD_B are transferred to the input node of the amplification transistor SF.

At a timing T6, the φOFD of all pixels on the imaging face change from a low level to a high level, and the signal charges generated by the illumination of light on the photoelectric conversion units PD_A and PD_B are drained to the OFD region.

At a timing T7, the φSEL_1 changes from a low level to a high level. Such an operation enables a state in which the signals based on the signal charges for generating focal point detection signals generated by the second photoelectric conversion unit PD_B in pixels in the first row may be read out to the vertical signal line VOUT.

At a timing T8, the PTS changes from a low level to a high level, and at a timing T9, the PTS changes from a high level to a low level. Such an operation enables the optical signals based on the signal charges for generating focal point detection signals generated by the second photoelectric conversion unit PD_B in the pixels in the first row to be held in the optical signal holding unit in the column circuit.

At timings T10 through T15, the PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals based on the signal charges for generating focal point detection signals generated at the second photoelectric conversion unit PD_B in pixels in the first row to be read out to a device external to the imaging apparatus.

At a timing T16, the φSEL1 temporarily changes from a high level to a low level, and the φRES1 temporarily changes from a low level to a high level. At a timing T17, the φSEL1 changes from a low level to a high level, and the φRES1 temporarily changes from a high level to a low level.

At a timing T18, a CTN changes from a low level to a high level, and at a timing T19, the CTN changes from a high level to a low level.

At a timing T20, the φTX2_A of all pixels on the imaging face change from a low level to a high level, and at a timing T21, the φTX2_A of all pixels on the imaging face change from a high level to a low level.

At a timing T22, the CTS changes from a low level to a high level, and at a timing T23, the CTS changes from a high level to a low level.

At timings T4 through T29, the PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables signals based on the signal charges for generating focal point detection signals generated at the first photoelectric conversion unit PD_B in pixels in the first row to be read out to a device external to the imaging apparatus.

At a timing T30, the φSEL1 changes from a high level to a low level, and the φRES1 changes from a low level to a high level. Such an operation enables the pixels in the first row to change from a selectable state to a non-selectable state.

At timings T32 through T58, the signals of the pixels in the second row are read out in the same way. Also, at timings from T59, the signals of the pixels in the third row are read out. Regarding the present example, the optical signals and the noise signals from the first photoelectric conversion unit PD_A are output, and only the optical signals from the second photoelectric conversion unit PD_B are output.

Ninth Example

Figure 37:
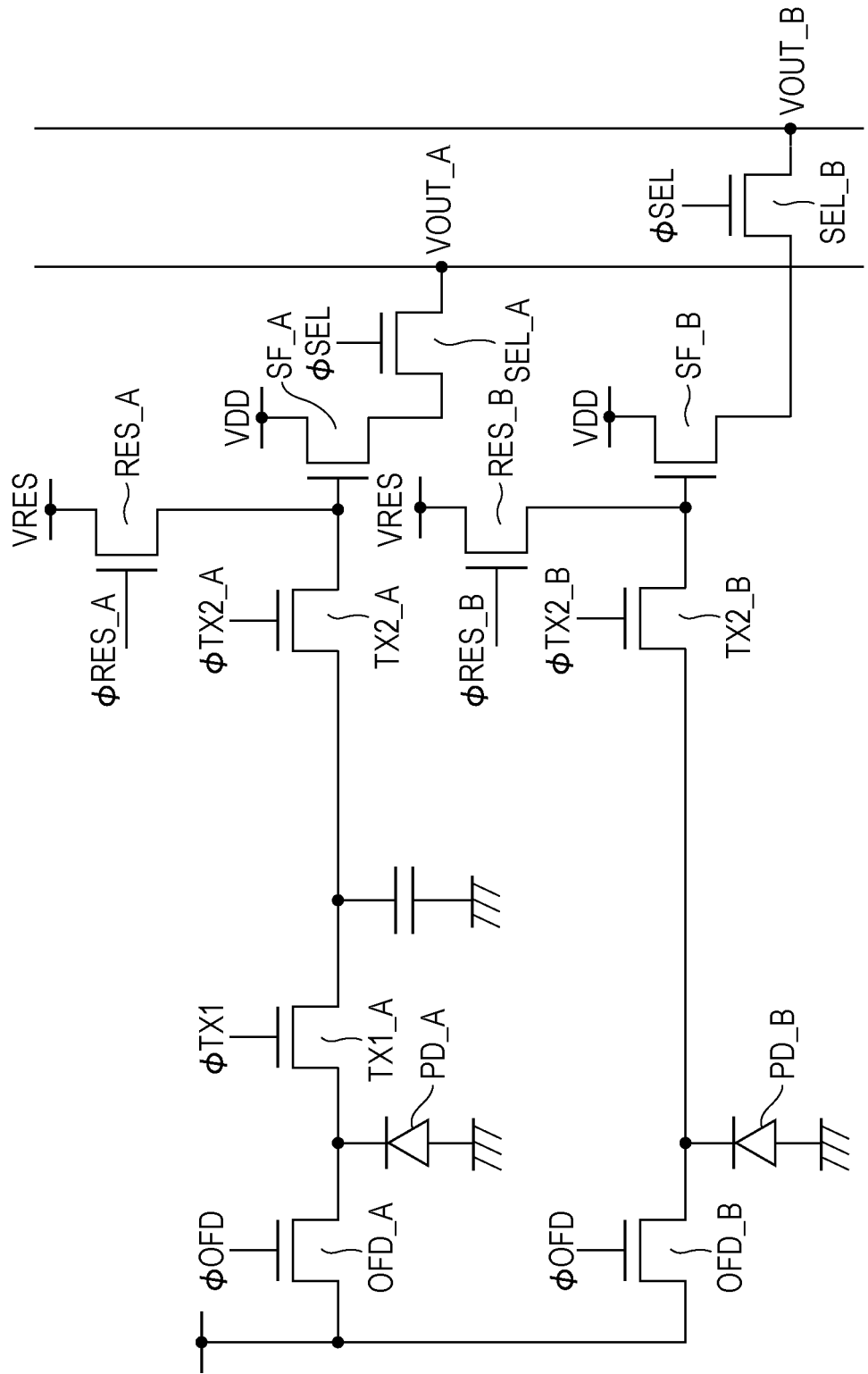
FIG. 37 is an equivalent circuit diagram of the first pixel of the imaging region in a ninth Example of the second Embodiment.

FIG. 37 is a diagram illustrating an equivalent circuit diagram of the first pixel in the present example. The difference between the present example and the eighth Example is the provisioning of independent pixel transistors such as the amplification transistors corresponding to both the first photoelectric conversion unit PD_A and the second photoelectric conversion unit PD_B. The portions that have the same functions as those in the previously described examples are denoted with the same reference numerals, and thus their descriptions are omitted here.

Figure 38:
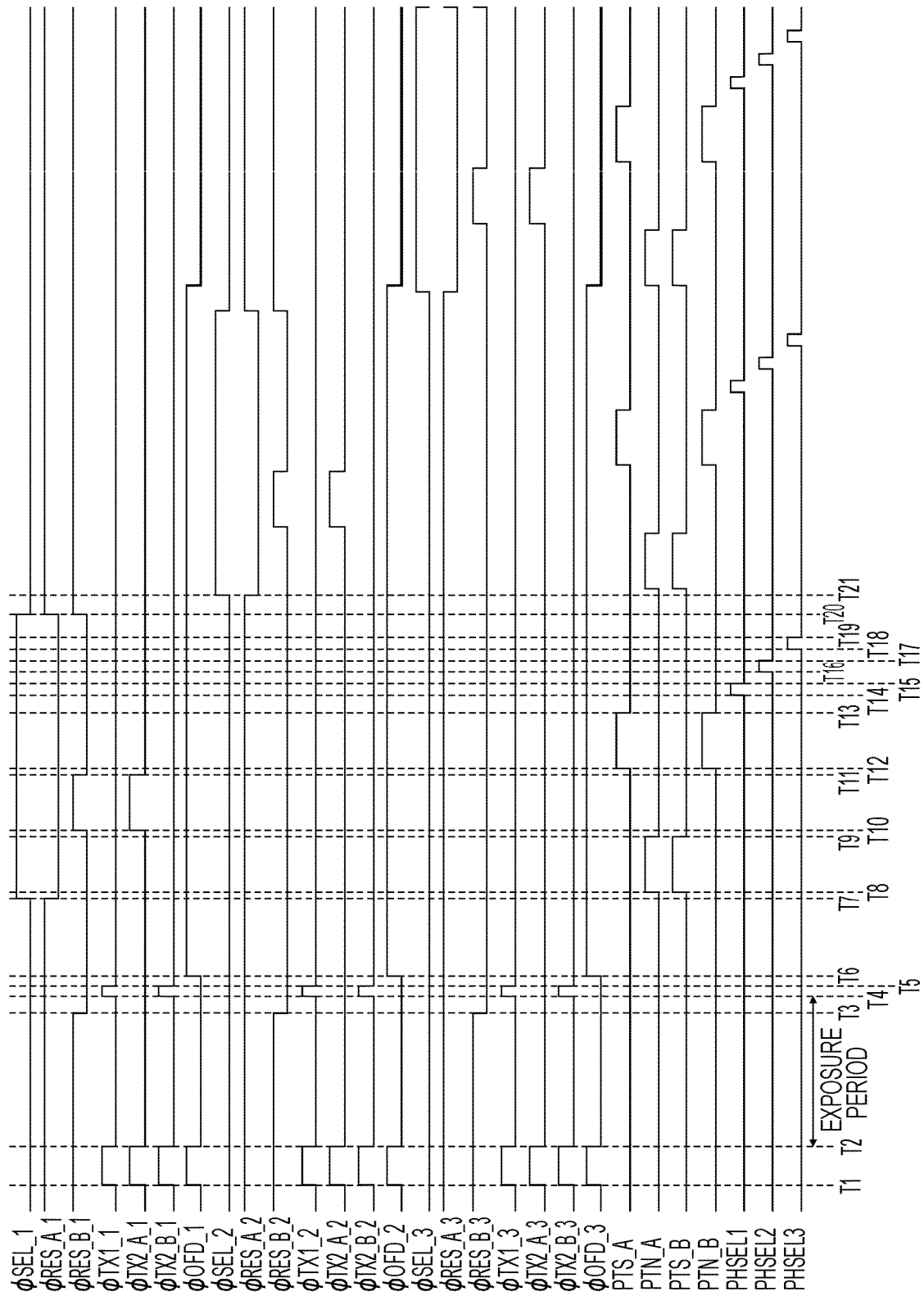
FIG. 38 is a diagram illustrating control pulses corresponding to the imaging region of the imaging apparatus in the ninth Example of the second Embodiment.

FIG. 38 is a diagram illustrating an example of the control pulses supplied to the imaging region of the imaging apparatus in the present example. All control pulses are at a high level and in an electroconductive state. Further, the pulses PTS_A and PTS_B are control pulses used to hold signals in the optical signal holding unit disposed in the column circuit. The pulses PTN_A and PTN_B are control pulses used to hold signals in the noise signal holding unit disposed in the column circuit. The configuration of the present example has to enable independent control of the first photoelectric conversion unit PD_A and the second photoelectric conversion unit PD_B via a sample hold circuit such as a column circuit or similar.

The pulse PHSEL is a control pulse output from the horizontal scanning circuit, and controls the read out of each row of signals held in the column circuit to the horizontal signal lines.

Until a timing T1, the φRES of all pixels on the imaging face are at a high level, and the reference voltage has been supplied to the gate of the amplification transistor. Other control pulses illustrated in FIG. 38 are at a low level.

At the timing T1, the φTX1, φTX2_A, φTX2_B, and φOFD of all pixels on the imaging face change from a low level to a high level. Next, at a timing T2, the φTX1, φTX2_A, φTX2_B, and φOFD of all pixels on the imaging face change from a high level to a low level. Such an operation enables the charges in the first photoelectric conversion unit PD_A, the second photoelectric conversion unit PD_B, and the first signal holding unit MEM1 to be drained to the reset transistor drain via the OFD region or the FD region. Also at the timing T2, the imaging exposure period of the nth frame begins. As illustrated in FIG. 38, the exposure period is the same for the entire imaging face.

At a timing T3, the φRES_B of all pixels on the imaging face change from a high level to a low level.

At a timing T4, the φTX1 and φTX2_B of all pixels on the imaging face change from a low level to a high level, and at a timing T5, the φTX1 and φTX2_B of all pixels on the imaging face change from a high level to a low level. Such an operation enables signal charges for generating focal point detection signals of the first photoelectric conversion unit PD_A of all pixels on the imaging face in all pixels in the first row to be transferred to the first signal holding unit MEM1. Further, signal charges for generating focal point detection signals of the second photoelectric conversion unit PD_B are transferred to the input node of the amplification transistor SF_B.

At a timing T6, the φOFD of all pixels on the imaging face change from a low level to a high level, and the signal charges generated by the illumination of light on the photoelectric conversion units PD_A and PD_B are drained to the OFD region.

At a timing T7, the φSEL_1 changes from a low level to a high level. Such an operation enables a state in which the signals of pixels in the first row may be read out to the vertical signal lines VOUT_A and VOUT_B. Further, the φRES_A of all pixels on the imaging face change from a high level to a low level.

At a timing T8, the PTS_A and PTS_B change from a low level to a high level, and at a timing T9, the PTN_A and PTS_B change from a high level to a low level. Such an operation enables the noise signals generated on the electrical pathway of the first photoelectric conversion unit PD_A in the first row to be held in the noise signal holding unit in the column circuit. Further, the optical signals based on the signal charges for generating focal point detection signals generated by the second photoelectric conversion unit PD_B of pixels in the first row to be held in the optical signal holding unit in the column circuit.

At a timing T10, the φRES_B_1 and φTX2_A_1 change from a low level to a high level. Such an operation enables the reference voltage to be supplied to the voltage of the input node of the amplification transistor SF_B. Further, the signals held in the first signal holding unit MEM1 of pixels in the first row are transferred to the input node of the amplification transistor SF_A. Then, at a timing T11, the φRES_B_1 and φTX2_A_1 change from a high level to a low level.

At a timing T12, the PTS_A and PTN_B change from a low level to a high level, and at a timing T13, the PTS_A and PTN_B change from a high level to a low level. Such an operation enables the noise signals generated on the electrical pathway of the second photoelectric conversion unit PD_A in the first row to be held in the noise signal holding unit in the column circuit. Further, the optical signals based on the signal charges for generating focal point detection signals generated by the first photoelectric conversion unit PD_B of pixels in the first row to be held in the optical signal holding unit in the column circuit.

At timings T14 through T19, the PHSEL_1 through PHSEL_3 are consecutively changed to an electroconductive state, which enables signals of each pixel row to be consecutively output to the horizontal output lines. This period is called the horizontal scanning period (horizontally enabled period). Such an operation enables the optical signal and the noise signals of pixels in the first row to be read out to a device external to the imaging apparatus.

At a timing T20, the φSEL1 changes from a high level to a low level, and the φRES_A_1 and φRES_B_1 change from a low level to a high level. Such an operation enables the first row to change from a selectable state to a non-selectable state.

From a timing T20 on, the signals of the pixels in the second row are read out in the same way.

Focal Point Detection Mechanism

The focal point detection regarding the imaging face of the imaging apparatus in the previously described examples will be described here. Specifically, one example of the phase contrast detection will be described where the focal point detection is performed during imaging on the imaging face.

Figure 39:
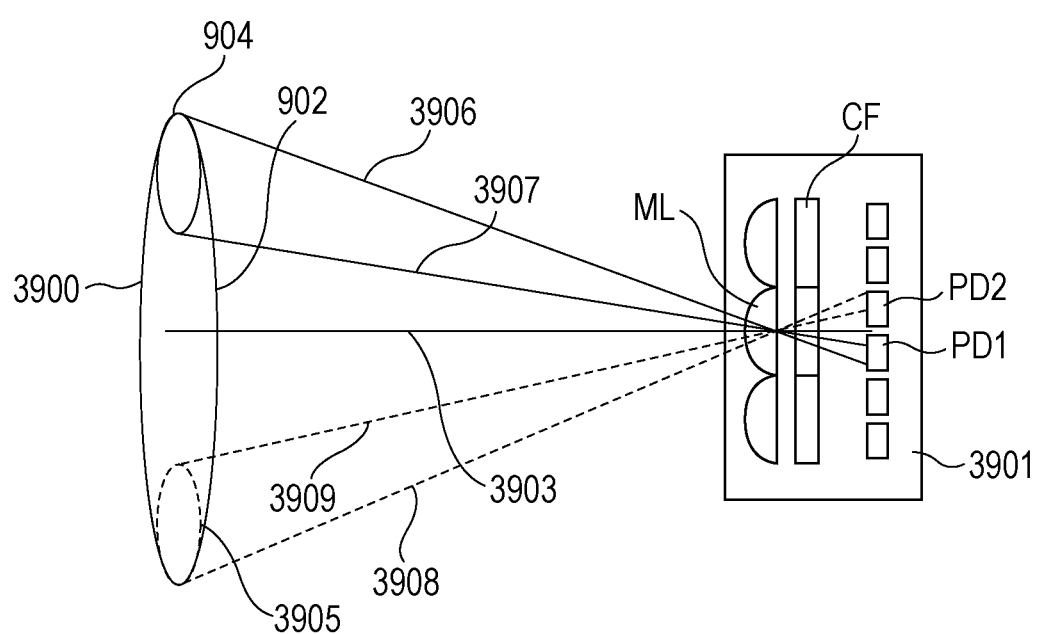
FIG. 39 is a diagram explaining a focal point detection mechanism.

This will be described with reference to FIGS. 39 and 40. FIG. 39 is a conceptual diagram illustrating light beams from an exit pupil of an photography lens 3900 illuminated on an imaging apparatus 3901. ML represents a microlens, CF represents a color filter, and the photoelectric conversion unit PD1 and PD2 represent multiple photoelectric conversion units on which light condensed from one microlens is illuminated. Reference numeral 3902 denotes the exit pupil of the photography lens. Here, one pixel includes one microlens ML, and the focus of light beams condensed from the exit pupil 3902 is represented by an optical axis 3903. Light emitted from the exit pupil is input to the imaging apparatus 3901, primarily on the optical axis 3903. Light beams on the outer rings of light that pass through a partial region 3904 of the exit pupil are denoted with 3906 and 3907. Light beams on the outer rings of light that passes through a partial region 3905 of the exit pupil 3902 are denoted by 3908 and 3909. As can be inferred from FIG. 39, with the optical axis 3903 as a boundary, the upper portion of the light beam that leaves from the exit pupil 3902 is illuminated onto the PD1, and the lower portion of the light beam is illuminated onto the PD2. That is to say, the PD1 and the PD2 each receive light from different regions of the exit pupil of the photography lens.

This property is used to perform the detection of phase contrasts. When looking at the imaging region from the top surface in regard to the region within the pixel, the light condensed by the single microlens is illuminated onto multiple photoelectric conversion units, and so the data obtained from one PD is represented as the first line, and the data obtained from the other PD is represented as the second line. Thus, the obtaining of the correlation data between the two lines enables the detection of phases.

Figure 40A:
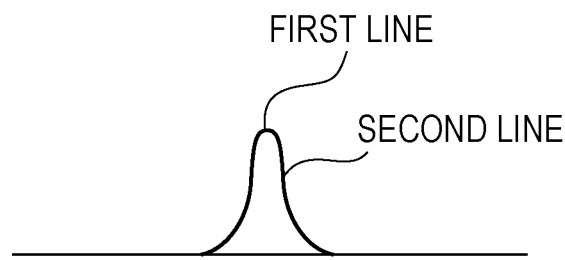
FIGS. 40A and 40B are diagrams explaining the focal point detection mechanism.
Figure 40B:
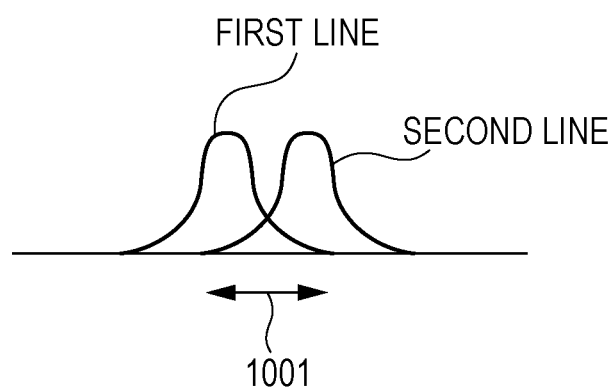

Regarding FIG. 39, let us say for example the light condensed by the single microlens is illuminated onto multiple photoelectric conversion units, and so the data obtained from the PD disposed in the lower region is represented as the first line, and the data obtained from the PD disposed in the upper region is represented as the second line. In this case, PD1 outputs one pixel worth of the data from the first line, and the PD2 outputs one pixel worth of the data from the second line. FIGS. 40A and 40B illustrate the line data at a time when a point light source forms an image. FIG. 40A illustrates data of the first line and second line when in focus. The horizontal axis represents the pixel position, and the vertical axis represents the output. The first line and the second line overlap when in focus. FIG. 40B illustrates the case when this is out of focus. In this case, the first line and second line have phase difference, and pixel positions are shifted. By calculating a shift amount 1001, how far out of focus the image is from when in focus is determined. Such a method enables an image to be set into focus by detection the phase and driving the lens.

Next, image data generation from these pixel arrays will be described. As previously described, the focus may be detected by independently reading out signals from the PD1 and the PD2 from the imaging apparatus 3901, and then performing a calculation to detect the phase contrast. Also, the photographed image may be generated by adding the signals from the PD where light condensed from one microlens has been illuminated.

Although FIG. 39 describes pixels near the center of the imaging device, there is a significant difference in the amount of light actually illuminated between PDs of pixels on the outer right of the imaging device, and for this reason, focal point detection pixels with a higher precision may be disposed in the outer portion than those disposed in the center of the imaging region.

Application to Imaging System

Figure 41:
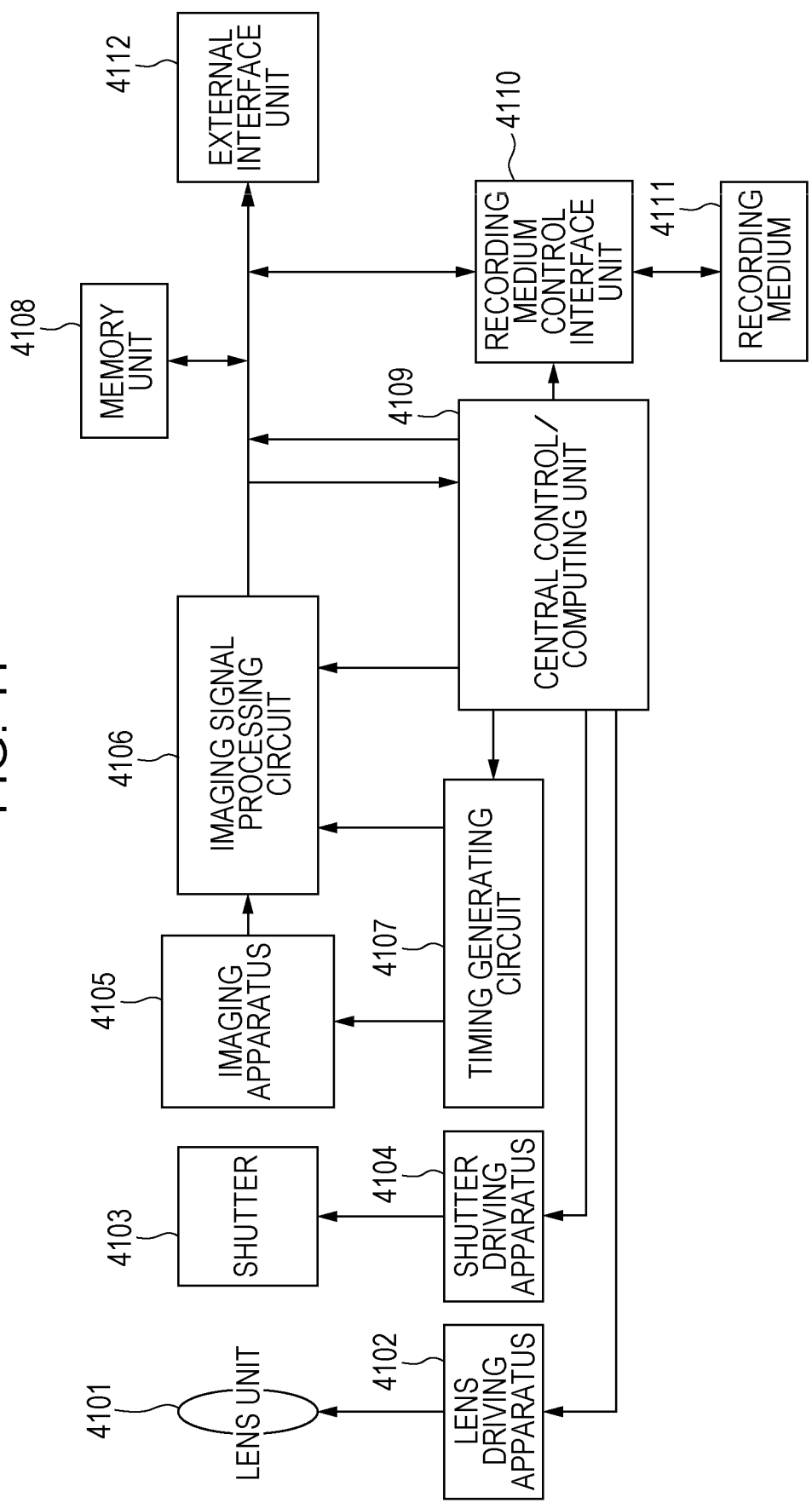
FIG. 41 is a block diagram of an imaging system using the imaging apparatus.

FIG. 41 illustrates an example of an imaging system that may employ the imaging apparatus of the previously described embodiments. In FIG. 41, a lens unit 4101 performs zoom control, focus control, and aperture control by a lens driving apparatus 4102 at lens unit where an imaging apparatus 4105 forms the image from the optical image of the object. A shutter 4103 controls a mechanical shutter by a shutter driving apparatus 4104. A global electron shutter is enabled by using the configuration of the present technology, and so the mechanical shutter does not have to be used; however, it is preferable to have an operation mode that is switchable depending on usage.

Reference numeral 4105 denotes an imaging apparatus for handling the object of the image to be formed by the lens unit 4101 as image signals, and reference numeral 4106 denotes an imaging signal processing circuit that performs various corrections on the imaging signals output from the imaging apparatus 4105, compression of the data, and other functions. Reference numeral 4107 denotes a timing generating circuit includes a driving method to output each type of timing signal to the imaging apparatus 4105 and the imaging signal processing circuit 4106. Reference numeral 4109 denotes a control circuit that controls each type of calculation and the entire imaging apparatus, reference numeral 4108 denotes a memory that temporarily stores the image data, and reference numeral 4110 denotes an interface that performs the recording to and reading out from a recording medium. Reference numeral 4111 denotes a removable recording medium such as semiconductor memory that performs the recording and the reading out of image data, and reference numeral 4112 denotes a display unit that displays each type of information and the photographed image.

Next, the operation of a digital camera using the previously described configuration during photography will be described. When the main power is turned on, the control system power is turned on, and further the imaging system circuit such as the imaging signal processing circuit 1106 is turned on.

Then, when the release button (not illustrated) is pressed, a ranging calculation is performed from the data from the imaging apparatus 4105, a calculation of the distance to the object based on the ranging result is performed at the control circuit 4109. Afterwards, the lens unit is driven by the lens driving apparatus 4102, and then the state of focus is determined, and if the image is determined to still not be in focus, the lens unit is driven again, and to complete the focus operation. Instead of being obtained from data from the imaging apparatus, the ranging calculation may be performed by a dedicated ranging apparatus (not illustrated).

The photography operation then begins after the focus has been confirmed. When the photography operation ends, the image signals output from the imaging apparatus 4105 are image processes by the photography signal processing circuit 4106, and written to memory by the control circuit 4109. Sort processing, additive processing, and some selected processing is performed at the photography signal processing circuit. The data accumulated in the memory 4108 is stored in the removable recording medium 4111 such as semiconductor memory through the recording medium control interface unit 4110 by control from the control circuit 4109.

Also, the images may be input directly to a computer or similar through an external interface (not illustrated) and processed further there.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
   a plurality of pixels, each of the plurality of pixels including
   a plurality of photoelectric conversion units,
   a transistor configured to receive signals based on signal charges generated by the photoelectric conversion units, and
   a plurality of signal holding units, each provided in an electrical pathway between an output node of a corresponding photoelectric conversion unit and an input node of the transistor, in which signals for performing a phase contrast detection type of focal point detection are held,
   wherein
   each of the plurality of pixels is configured to output signals for performing the phase contrast detection type of focal point detection.

2. The photoelectric conversion apparatus according to claim 1, wherein a potential generated between the plurality of photoelectric conversion units that are adjacent to each other and in the same pixel is lower than a potential generated between the plurality of photoelectric conversion units that are adjacent and in different pixels.

3. The photoelectric conversion apparatus according to claim 1, wherein a height of a potential barrier generated between the plurality of the signal holding units disposed adjacent to each other and in the same pixel is higher than a height of a potential barrier generated between the plurality of photoelectric conversion unit that are adjacent to each other and in the same pixel.

4. The photoelectric conversion apparatus according to claim 1, wherein a light-shielding member that overlaps a portion of the plurality of photoelectric conversion units regarding an orthogonally projected image of the photoelectric conversion unit is disposed on the side of the plurality of photoelectric conversion units where light is illuminated.

5. The photoelectric conversion apparatus according to claim 1, wherein further comprising: an overflow drain control unit to drain charges from the plurality of photoelectric conversion units during a period where the focal point detection signals are held in at least of the plurality of signal holding units.

6. The photoelectric conversion apparatus according to claim 1, wherein control of an exposure period is performed, by a global electronic shutter operation, for the plurality of pixels configured to output the phase difference signals.

7. A system comprising:
   the photoelectric conversion apparatus according to claim 1;
   a lens unit configured to condense light on the photoelectric conversion apparatus; and
   an imaging signal processing unit configured to process a signal obtained by the photoelectric conversion apparatus.

8. The photoelectric conversion apparatus according to claim 1, further comprising a first control electrode configured to transfer a signal of each of the plurality of signal holding units to each of the plurality of signal holding units, and a second control electrode configured to transfer a signal held in each of the plurality of signal holding units.

9. The photoelectric conversion apparatus according to claim 1, further comprising
   a lens array that includes a plurality of microlenses,
   wherein each of the plurality of microlenses condenses light into the plurality of photoelectric conversion units in each of the plurality of pixels.

10. The photoelectric conversion apparatus according to claim 1, wherein the transistor is configured to amplify signals based on signal charges generated by at least one of the plurality of photoelectric conversion units.

11. The photoelectric conversion apparatus according to claim 10, wherein the input node of the transistor is electrically connected to a floating diffusion region.

12. The photoelectric conversion apparatus according to claim 2, wherein a height of a potential barrier generated between the plurality of the signal holding units disposed adjacent to each other and in the same pixel is higher than a height of a potential barrier generated between the plurality of photoelectric conversion unit that are adjacent to each other and in the same pixel.

13. The photoelectric conversion apparatus according to claim 1, wherein the plurality of pixels has a first pixel in a first pixel row and a second pixel in a second pixel row that is different from the first pixel row, and
   wherein an exposure period is the same for the signal held in the signal holding unit of the first pixel and the signal held in the signal holding unit of the second pixel.

14. The photoelectric conversion apparatus according to claim 2, wherein control of an exposure period is performed, by a global electronic shutter operation, for the plurality of pixels configured to output the phase difference signals.

15. The photoelectric conversion apparatus according to claim 3, wherein control of an exposure period is performed, by a global electronic shutter operation, for the plurality of pixels configured to output the phase difference signals.

16. The photoelectric conversion apparatus according to claim 2, further comprising: an overflow drain control unit to drain charges from the plurality of photoelectric conversion units during a period where the focal point detection signals are held in at least of the plurality of signal holding units.

17. The photoelectric conversion apparatus according to claim 3, further comprising: an overflow drain control unit to drain charges from the plurality of photoelectric conversion units during a period where the focal point detection signals are held in at least of the plurality of signal holding units.

* * * * *